(12) United States Patent
Takamiya et al.

(10) Patent No.: US 7,307,439 B2
(45) Date of Patent: Dec. 11, 2007

(54) SEMICONDUCTOR INTEGRATED CIRCUIT APPARATUS, MEASUREMENT RESULT MANAGEMENT SYSTEM, AND MANAGEMENT SERVER

(75) Inventors: Makoto Takamiya, Tokyo (JP);
Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 77 days.

(21) Appl. No.: 10/926,364

(22) Filed: Aug. 26, 2004

(65) Prior Publication Data

US 2005/0165573 A1 Jul. 28, 2005

(30) Foreign Application Priority Data

Aug. 27, 2003 (JP) ............................. 2003-302272
Jun. 10, 2004 (JP) ............................. 2004-172099

(51) Int. Cl.
*G01R 31/02* (2006.01)
(52) U.S. Cl. ..................................... 324/763
(58) Field of Classification Search ................ 324/760, 324/763, 765, 158.1; 714/724–733; 702/182; 365/200–201; 327/52, 81, 143
See application file for complete search history.

(56) References Cited

U.S. PATENT DOCUMENTS 5,498,972 A * 3/1996 Haulin ...................... 324/765
6,140,833 A * 10/2000 Flietner et al. ............. 324/765
6,545,460 B2 * 4/2003 Sugamori ................ 324/158.1
6,842,027 B2 * 1/2005 Liu et al. .................... 324/763
6,897,674 B2 * 5/2005 Braceras et al. ............ 324/765

FOREIGN PATENT DOCUMENTS

| JP | 5-326845 A | 12/1993 |
|---|---|---|
| JP | 8-195406 A | 7/1996 |
| JP | 11-31399 A | 2/1999 |
| JP | 2003-7838 A | 1/2003 |
| JP | 2003-529145 A | 9/2003 |

* cited by examiner

*Primary Examiner*—Ha Tran Nguyen
*Assistant Examiner*—Tung X. Nguyen
(74) *Attorney, Agent, or Firm*—Sughrue Mion Pllc.

(57) ABSTRACT

A semiconductor integrated circuit apparatus, and more particularly a technology for measuring and managing a physical amount of factors that exert an influence upon an operation of a semiconductor integrated circuit is provided; more particularly, a semiconductor integrated circuit that is an object of measurement, and a measurement circuit which measures a physical factor that exerts an influence upon the actual operation of the semiconductor integrated circuit, such as jitter or noise jitter, and noise of this semiconductor integrated circuit are provided on an identical chip; also, a measurement result of the measurement circuit of the present invention is analyzed, and is fed back to a circuit for adjusting the semiconductor integrated circuit that is the object of measurement.

10 Claims, 36 Drawing Sheets

131 SEMICONDUCTOR INTEGRATED CIRCUIT IN ACCORDANCE WITH PRESENT INVENTION

130 SEMICONDUCTOR INTEGRATED CIRCUIT APPARATUS

141 CIRCUIT FOR MEASURING NOISE OR JITTER
151 MONITOR SECTION
150 ANALYSIS SECTION
144 CIRCUIT FOR MEASURING NOISE OR JITTER IN TIME SERIES BASIS

TIP
TRANSFER SECTION
150 ANALYSIS SECTION
144 CIRCUIT FOR MEASURING NOISE OR JITTER IN TIME SERIES BASIS

PATTERN A

PATTERN B

TRANSISTOR FOR MONITORING LEAKAGE CURRENT

SEMICONDUCTOR INTEGRATED CIRCUIT APPARATUS, MEASUREMENT RESULT MANAGEMENT SYSTEM, AND MANAGEMENT SERVER

BACKGROUND OF THE INVENTION

The present invention relates to a semiconductor integrated circuit apparatus, and more particularly to a technology for measuring and managing a physical amount that exerts an influence upon an operation of a semiconductor integrated circuit.

Generally, when the semiconductor integrated circuit apparatus (high-speed LSI) packed on a system failed, the system having it mounted comes not to operate normally in some cases, and the system down occurs in some cases, which causes the operation of system to stop. For this, various inspections are made to improve performance and quality of the high-speed LSI so that the high-speed LSI under operation does not fail.

As one of general inspection methods, there is a method of using a BIST (Built-In Self Test) for inspection (for example, a patent document 1). In the patent document 1, a technology was disclosed of providing a BIST function in a send unit, a receive unit, a control unit, and a central logical unit to inspect a signal interconnection. Further, a technology of using the BIST for inspection to manage an inspection result was also proposed (for example, a patent document 2).

Also, there is a method of making an inspection by specifying factors that cause performance of the semiconductor integrated circuit to decline.

For example, in designing the high-speed LSI of late years, power source noise and clock jitter are listed as a main factor of hindering performance improvement. So as to measure such power source noise and clock jitter, an inspection is made by making a probing measurement from the outside of the LSI to evaluate a power source noise waveform and a peak value of the clock jitter.

Further, as a factor of hindering the performance improvement other than the foregoing, a malfunction in a step of assembling a semiconductor apparatus is listed. So as to prevent a decline in performance and quality that stems from the malfunction in a step of assembling the semiconductor apparatus, there is a method of inspecting the semiconductor integrated circuit to analyze the step in which the cause of the performance decline originates, and of stopping a manufacturing apparatus of its step, or adjusting the manufacturing apparatus responding to a necessity (for example, a patent document 3).

Also, as a malfunction of the high-speed LSI, degradation that comes out as an operating hour elapses is listed. A technology for integrating the operating hour in order to recognize a degradation situation etc. was also proposed (for example, a patent document 4).

Yet further, a technology of, by monitoring power consumption, making management so that no malfunction occurred was also proposed (for example, a patent document 5).

[PATENT DOCUMENT 1] Laid-Open of PCT translation No. 2003-529145
[PATENT DOCUMENT 2] JP-P1999-31399A
[PATENT DOCUMENT 3] JP-P1996-195406A
[PATENT DOCUMENT 4] JP-P1993-326845A
[PATENT DOCUMENT 5] JP-P2003-7838A The above-mentioned prior arts, however, accompanied the following problems.

In a case of using the BIST for inspection like the patent document 1 or the patent document 2, there was a case where the malfunction occurred beyond its prediction in the actual operation because test data was prepared responding to its use situation for inspection. Also, it was difficult to predict the noise or the jitter in designing.

Further, in a case of using the BIST for inspection, there was no chance that the semiconductor integrated circuit other than the semiconductor integrated circuit that was an object of measurement operated actually (a stop state etc.), so when it was caused to operate actually, it received an influence from the other semiconductor integrated circuit apparatus, and failed in some cases.

Also, the factor that causes the performance of the semiconductor integrated circuit to decline is not only one factor, and there was also a case where various factors were piled upon, and the performance declined. For this, in a case where the various factors were piled up, and the performance declined, its factors were impossible to analyze and remove because the inspection item (measurement content) was limited to a specified one in the foregoing prior art.

Further, in a case of measuring the noise or the jitter, the noise or the jitter on the LSI was impossible to measure in the high-speed LSI. Its reason is that a high-speed signal on the LSI is impossible to output to the outside of the LSI because a band degrades due to a pad or a pin of a package. Also, even though the probing measurement was employed, it was difficult to make a probing measurement of the just neighborhood of a point that is required to measure in the package of numerously employed flip-chips in the high-speed LSI.

Further, the problem lay in that it was difficult to predict the noise or the jitter that exerted an influence upon the operation of the semiconductor integrated circuit in designing, and in addition hereto, it was very difficult to reduce the noise or the jitter after manufacturing the LSI. With the noise, in a case where it was found that the power source noise was excessive after manufacturing the LSI, the problem existed that adding the LSI having an on-chip decoupling capacity that was a countermeasure to the power source noise gave rise to high cost and delay in development. With the jitter, as a parameter that exerts an influence upon the jitter of a phase-locked loop (hereinafter, referred to as a PLL) for generating a clock signal, there are a resistance value or a capacity value of a loop filter configuring the PLL, a gain of a voltage control oscillator, a current value of a power source of a charge pump circuit, and a frequency dividing number of a divider. However, the parameter was impossible to decide clearly because the actual jitter value was unknown, whereby it was very difficult to design the PLL having low jitter.

Further, it was difficult to find a countermeasure for lowering the noise and the jitter that were main factors exerting an influence upon the operation of the semiconductor integrated circuit. For example, as a rule, the cause of the jitter originates in the power source noise, and a strong correlation exists between the jitter and the power source noise. Accordingly, so as to reduce the jitter, the power source noise has to be reduced. So as to reduce the power source noise, a power source system of anyone of a board, the package, and the LSI has to be modified. As shown in FIG. 46, the low-frequency power source noise is decided by the power source system of the board, the intermediate-frequency power source noise is decided by the power source system of the package, and the high-frequency power source noise is decided by the power source system of the LSI. However, in the conventional evaluation of the peak value of the jitter and the waveform of the power source noise, it was impossible to clearly know which portion of the power source system had to be corrected, so there was no choice but take a countermeasure on a trial and error basis, which was poor in efficiency.

DISCLOSURE OF THE INVENTION

The present invention has been accomplished in consideration of the above-mentioned problems, and a first objective thereof is to make it possible to measure the factors, which exert an influence upon the operation of the semiconductor integrated circuit, such as the noise or the jitter on the LSI that is actually working.

Also, a second objective thereof is to make it possible to reduce the various factors, which exert an influence upon the operation of the semiconductor integrated circuit, such as the noise or the jitter even after manufacturing the LSI.

Further, a third objective thereof is to make it possible to efficiently find a countermeasure for reducing the various factors, which exert an influence upon the operation of the semiconductor integrated circuit, such as the noise or the jitter.

Further, a fourth objective thereof is to make it possible to prevent the operational stop of the system beforehand by measuring and monitoring the various factors, which exert an influence upon the operation of the semiconductor integrated circuit, such as the noise or the jitter on the LSI that is actually working.

Further, a fifth objective thereof is that measuring and managing the various factors, which exert an influence upon the operation of the semiconductor integrated circuit, such as the noise or the jitter on the LSI that is actually working makes it possible to reflect its measurement and management in the next-generation semiconductor integrated circuit.

A first invention for solving the above-mentioned problems, which is a semiconductor integrated circuit apparatus, is characterized in having:

a main frame circuit that is an object of measurement; and a measurement circuit arranged on an identical chip to that of said main frame circuit, said main frame circuit measuring a physical amount of said main frame circuit when said main frame circuit works actually.

A second invention for solving the above-mentioned problems is characterized in that said main frame circuit operates at any time when said measurement circuit is performing a measurement operation in the above-mentioned first invention.

A third invention for solving the above-mentioned problems is characterized in that said measurement circuit is a measurement circuit for measuring jitter information of said main frame circuit in the above-mentioned first invention.

A fourth invention for solving the above-mentioned problems is characterized in that said measurement circuit is a measurement circuit for measuring noise information of said main frame circuit in the above-mentioned first invention.

A fifth invention for solving the above-mentioned problems is characterized in that said measurement circuit is a measurement circuit for measuring temperature information of said main frame circuit in the above-mentioned first invention.

A sixth invention for solving the above-mentioned problems is characterized in that said measurement circuit is a measurement circuit for measuring power source information of said main frame circuit in the above-mentioned first invention.

A seventh invention for solving the above-mentioned problems is characterized in that said measurement circuit is a measurement circuit for measuring power information of said main frame circuit in the above-mentioned first invention.

An eighth invention for solving the above-mentioned problems is characterized in that said measurement circuit is a measurement circuit for measuring stress information of said main frame circuit in the above-mentioned first invention.

A ninth invention for solving the above-mentioned problems is characterized in that said measurement circuit is a measurement circuit for measuring device performance of said main frame circuit in the above-mentioned first invention.

A tenth invention for solving the above-mentioned problems is characterized in that the physical amount that said measurement circuit measures is at least one of jitter information, noise information, temperature information, power source information, power information, stress information, and information of device performance at the time of the actual operation of said main frame circuit in the above-mentioned first invention.

An eleventh invention for solving the above-mentioned problems is characterized in providing said measurement circuit in plural on an identical chip in the above-mentioned first invention.

A twelfth invention for solving the above-mentioned problems is characterized in having analysis means for analyzing the physical amount that exerts an influence upon the actual operation of said main frame circuit, based upon the physical amount that said measurement circuit measured in the above-mentioned first invention.

A thirteenth invention for solving the above-mentioned problems is characterized in providing said analysis means on an identical chip to that of said main frame circuit and said measurement circuit in the above-mentioned twelfth invention.

A fourteenth invention for solving the above-mentioned problems is characterized in providing said analysis means outside the chip having said main frame circuit and said measurement circuit provided in the above-mentioned twelfth invention.

A fifteenth invention for solving the above-mentioned problems is characterized in providing transfer means for transferring said measurement result of said measurement circuit to said analysis means on an identical chip to that of said main frame circuit and said measurement circuit in the above-mentioned thirteenth invention.

A sixteenth invention for solving the above-mentioned problems is characterized in providing transfer means for transferring a measurement result of said measurement circuit to said analysis means that was provided outside on an identical chip to that of said main frame circuit and said measurement circuit in the above-mentioned fourteenth invention.

A seventeenth invention for solving the above-mentioned problems is characterized in that in a case where at least one main frame circuit is provided on said chip, and yet a plurality of the measurement circuits are provided, said analysis means is configured to receive the measurement results from a plurality of the measurement circuits, and to analyze the physical amount that exerts an influence upon the actual operation of the main frame circuit in the above-mentioned twelfth invention.

An eighteenth invention for solving the above-mentioned problems is characterized in having accumulation means for accumulating said measurement results of said measurement circuit in the above-mentioned first invention.

A nineteenth invention for solving the above-mentioned problems is characterized in providing said accumulation means on an identical chip to that of said main frame circuit and said measurement circuit in the above-mentioned eighteenth invention.

A twentieth invention for solving the above-mentioned problems is characterized in providing said accumulation means outside the chip having said main frame circuit and said measurement circuit provided in the above-mentioned eighteenth invention.

A twenty-first invention for solving the above-mentioned problems is characterized in that, in said accumulation means, said measurement result of said measurement circuit, and measurement information for specifying a measurement time, a measurement position, or a measurement status of said measurement result of said measurement circuit are stored correspondingly in the above-mentioned eighteenth invention.

A twenty-second invention for solving the above-mentioned problems is characterized in that said measurement information is a measurement result that a measurement circuit other than said measurement circuit measured in the above-mentioned twelfth invention.

A twenty-third invention for solving the above-mentioned problems is characterized in having analysis means for analyzing the physical amount that exerts an influence upon the actual operation of said main frame circuit based upon said measurement information in the above-mentioned twelfth invention.

A twenty-fourth invention for solving the above-mentioned problems is characterized in having monitor means for giving a fault warning of said main frame circuit based upon said analysis of said analysis means in the above-mentioned twelfth invention.

A twenty-fifth invention for solving the above-mentioned problems is characterized in having improvement means for improving the physical amount that exerts an influence upon said main frame circuit based upon said analysis result of said analysis means in the above-mentioned twelfth invention.

A twenty-sixth invention for solving the above-mentioned problems is characterized in having amount reduction means for reducing information content of said measurement result of said measurement circuit in the above-mentioned first invention.

A twenty-seventh invention for solving the above-mentioned problems, which is a measurement result management system, is characterized in having:
  a semiconductor integrated circuit apparatus having:
  a main frame circuit that is an object of measurement;
  a measurement circuit arranged on an identical chip to that of said main frame circuit, said main frame circuit measuring a physical amount of said main frame circuit at the time of an actual operation of said main frame circuit; and
  transmission means for transmitting said measurement result of said measurement circuit, and identification information for uniquely identifying said main frame circuit; and
  a management server having:
  reception means for receiving said transmitted measurement result and identification information; and
  management means for managing said received measurement result identification information by identification information.

A twenty-eighth invention for solving the above-mentioned problems is characterized in that said transmission means have encryption means for encrypting the measurement result and the identification information for uniquely identifying said main frame circuit in the above-mentioned twenty-seventh invention.

A twenty-ninth invention for solving the above-mentioned problems is characterized in that said reception means have decoding means for decoding the transmitted measurement result and identification information in the above-mentioned twenty-eighth invention.

A thirtieth invention for solving the above-mentioned problems is characterized in that said management server has monitor means for giving a fault warning of said main frame circuit based upon the measurement result that said management means manage in the above-mentioned twenty-seventh invention.

A thirty-first invention for solving the above-mentioned problems, which is a management server arranged on an identical chip to that of a main frame circuit that is an object of measurement, said management server managing a measurement result of said measurement circuit that is transmitted from a semiconductor integrated circuit apparatus having a measurement circuit for measuring a physical amount of said main frame circuit at the time of an actual operation of said main frame circuit, is characterized in having:
  reception means for receiving the transmitted measurement result, and identification information for uniquely identifying said main frame circuit; and
  management means for managing said received measurement result identification information by identification information.

A thirty-second invention for solving the above-mentioned problems is characterized in that in a case where the transmitted measurement result and identification information were encrypted, said reception means have decoding means for decoding the encrypted measurement result and identification information in the above-mentioned thirty-first invention.

A thirty-third invention for solving the above-mentioned problems is characterized in that said management server has monitor means for giving a fault warning of said main frame circuit based upon the measurement result that said management means manage in the above-mentioned thirty-second invention.

DETAILED DESCRIPTION OF THE EMBODIMENTS

As to the semiconductor integrated circuit of the present invention, configuring the semiconductor integrated circuit that is actually operating, which is an object of measurement, and the measurement circuit for measuring the physical amount, which exerts an influence upon the actual operation of the semiconductor integrated circuit, such as the jitter or noise jitter and the noise of this semiconductor integrated circuit on the identical chip allows an objective of the present invention to be accomplished.

Also, feeding the measurement result of the measurement circuit of the present invention back to the circuit for adjusting the semiconductor integrated circuit that is an object of measurement allows an objective of the present invention to be accomplished.

Embodiment 1

A first embodiment in the present invention will be explained.

Figure 1:
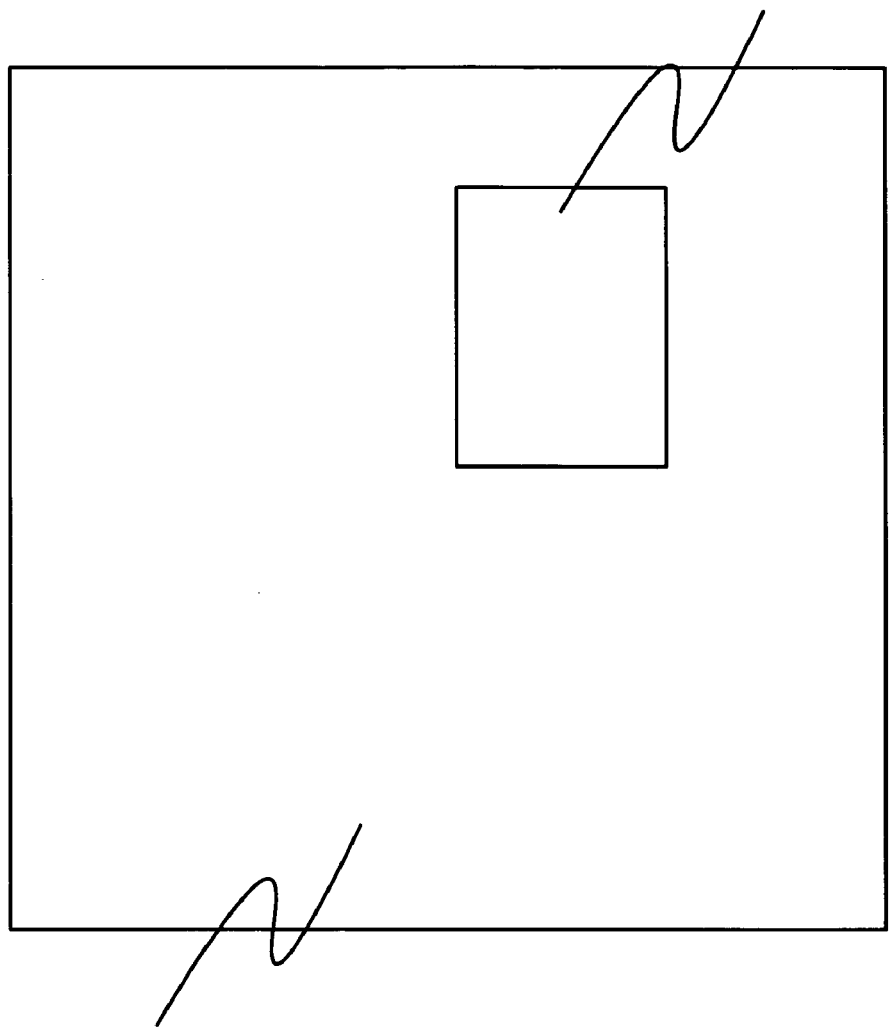
FIG. 1 is a conceptual view of the semiconductor integrated circuit apparatus of the present invention.

FIG. 1 is a conceptual view of the semiconductor integrated circuit apparatus in the present invention.

A semiconductor integrated circuit 131 in accordance with the present invention, i.e. the measurement circuit is mounted inside a semiconductor integrated circuit apparatus 130.

The measurement circuit is arranged on an identical chip to that of the semiconductor integrated circuit that is an object of measurement. Further, the measurement circuit measures the physical amount that exerts an influence of the operation of the semiconductor integrated circuit that is actually operating. Additionally, as to the so-called chip in the present invention, in addition to one chip having a minimum unit, for example, let a SiP (System in Package) and a three-dimensional LSI which become a one-unit chip by connecting a plurality of the chips with a high-speed signal wiring be defined as one chip. Also, the so-called actual operation of the semiconductor integrated circuit signifies a status where the power source was input into a terminal of the chip having this semiconductor integrated circuit mounted. And, this terminal is not a terminal such as a test terminal that is employed temporarily in testing.

The measurement circuit in the present invention will be explained.

Additionally, in this embodiment, a case will be explained where the measurement circuit for measuring fluctuation of the period (periodic jitter) of the clock signal within the semiconductor integrated circuit was realized by employing a technology of a power source voltage of 1.0 V and a 90-nm CMOS process. Also, in this embodiment, the clock signal of the semiconductor integrated circuit is employed for explanation as a signal that is an object of measurement; however it is not limited hereto. For example, it should be a data signal that the semiconductor integrated circuit outputs.

Figure 2:
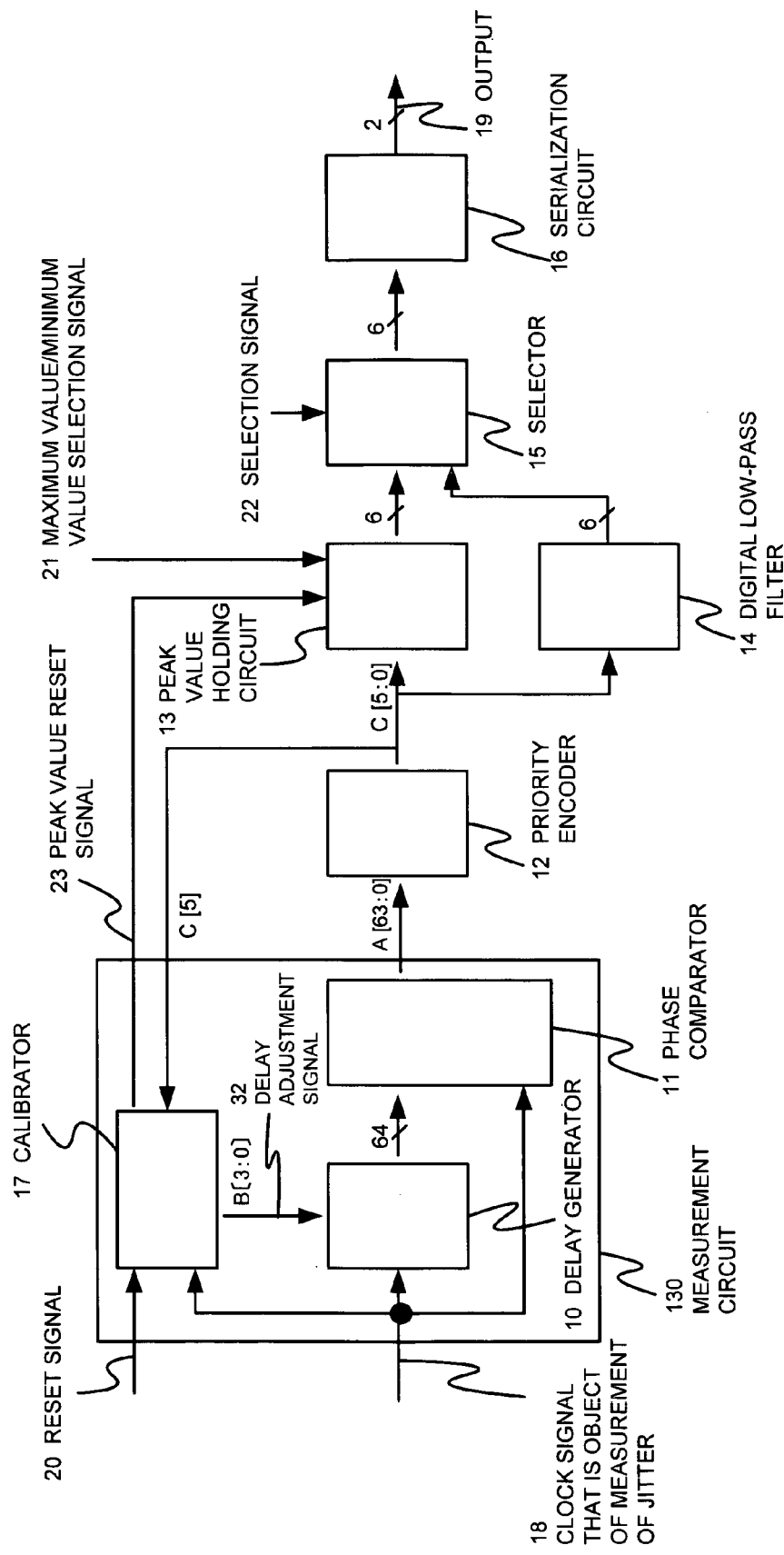
FIG. 2 is a block diagram of the measurement circuit in a first embodiment.

FIG. 2 is a block diagram of the measurement circuit in the first embodiment.

As shown in FIG. 2, the measurement circuit 130 is configured of a delay generator 10, a phase comparator 11, and a calibrator 17.

A two-GHz clock signal 18 of the semiconductor integrated circuit that is an object of measurement, and a four-bit delay adjustment signal 32 from the calibrator 17 are input into the delay generator 10. The clock signal 18 is a clock signal that passes through the semiconductor integrated circuit that is actually operating. Also, in this embodiment, assume that this clock signal was set to 2 GHz in designing the semiconductor integrated circuit.

Figure 3:
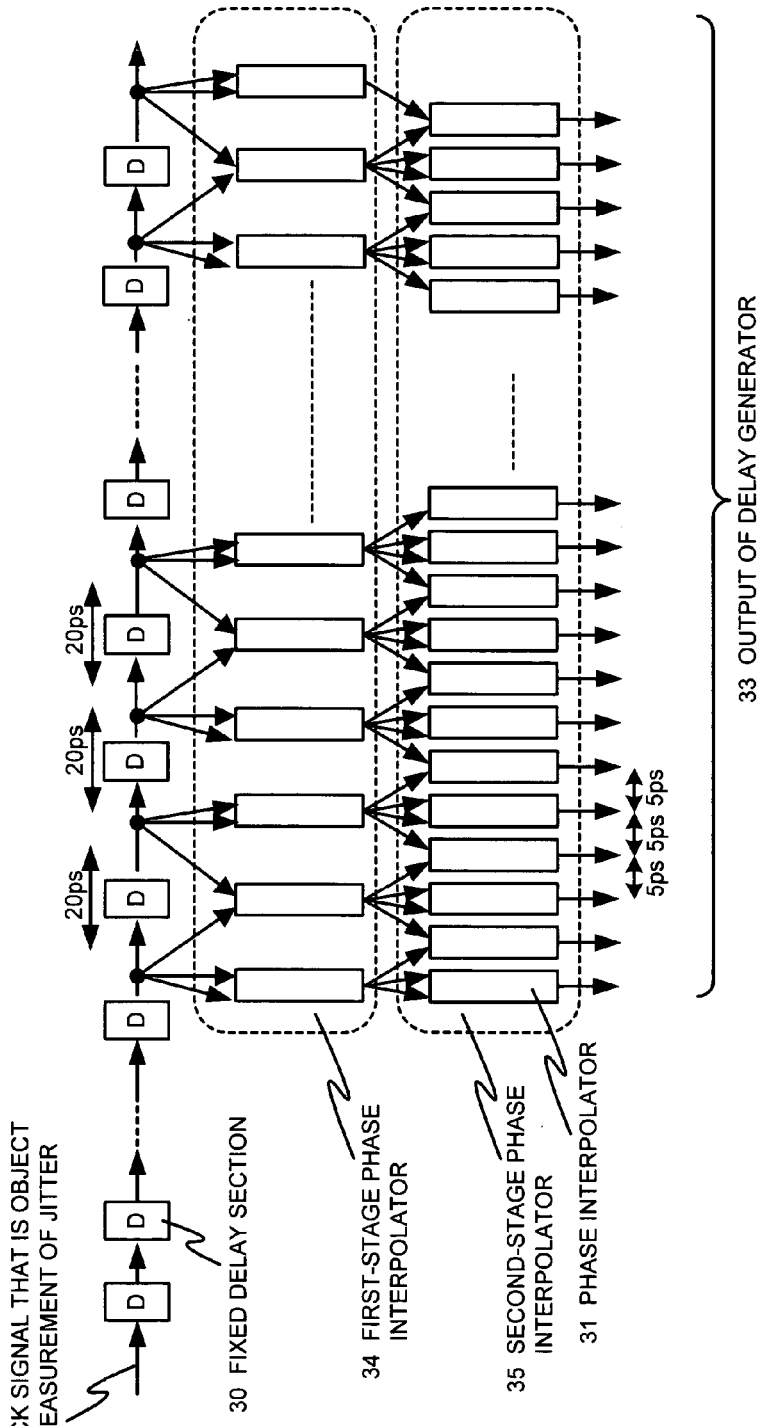
FIG. 3 is a block diagram of a delay generator 10.

A block diagram of the delay generator 10 is shown in FIG. 3. As shown in FIG. 3, the delay generator 10 is configured of a fixed delay section 30 of 20 ps, and a phase interpolator 31. And, the four-bit delay adjustment signal 32 from the calibrator 17 is input into the fixed delay section 30.

The delay generator 10 is for outputting 64 delay signals of the clock signal 18 partitioned 5 ps by 5 ps in a range from 340 ps to 660 ps. As to the delay signals that are delayed 5 ps by 5 ps, its delay signal is generated by employing the phase interpolator 31 because its delay is smaller than a delay (10 ps) per one stage of the inverter. Specifically, by inputting the fixed delay of 20 ps into a first-stage phase interpolator 34, a delay signal having a partition of 10 ps that is half 20 ps is generated, and by inputting this into a second-stage phase interpolator 35, a delay signal having a partition of 5 ps that is a half of 10 ps is generated.

Continuously, the phase comparator 11 will be explained.

An output 33 of the delay generator, and the clock signal 18 are input into the phase comparator 11.

Figure 4:
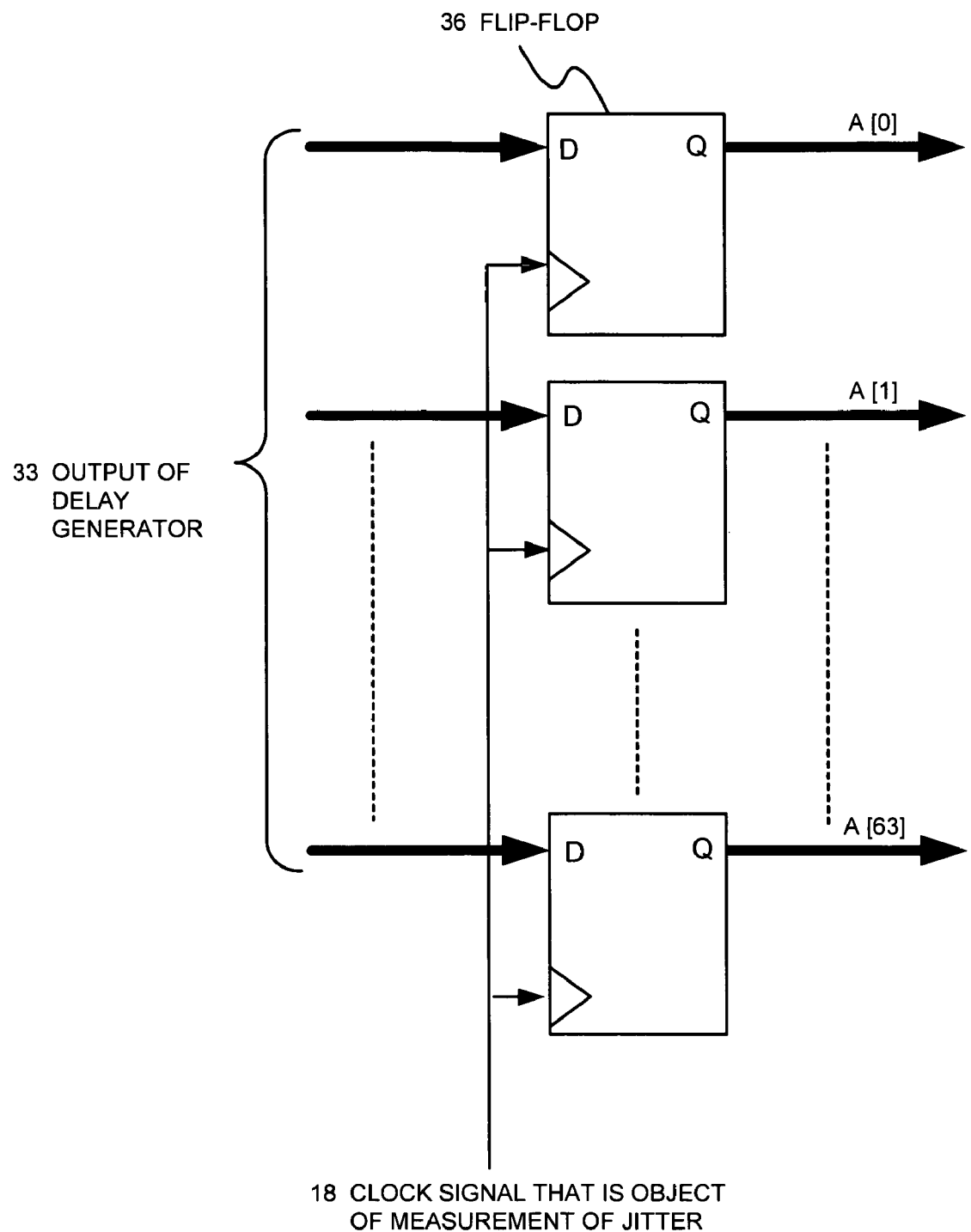
FIG. 4 is a block diagram of a phase comparator 11.

A configuration of the phase comparator 11 is shown in FIG. 4.

The phase comparator 11 is configured of 64 flip-flops 36. 64 outputs 33 of the delay signal output from the delay generator 10 are connected to data inputs of respective flip-flops, and the clock signal 18 that is an object of measurement is connected to a clock input of each flip-flop.

The phase comparator 11 is for determining which edge rose ahead, out of a leading edge of the clock signal 18 that is an object of measurement, and each leading edge of the output 33 of the delay generator 10. In a case where the leading edge of the output 33 of the delay generator rises ahead of the leading edge of the clock signal 18 that is an object of measurement, the flip-flop 36 outputs a high-level signal. In a case where the leading edge of the output 33 of the delay generator rises behind the leading edge of the clock signal 18 that is an object of measurement, the flip-flop 36 outputs a low-level signal. Accordingly, employing the flip-flop 36 makes it possible to determining which edge rose ahead, out of the leading edge of the clock signal 18 that is an object of measurement, and each leading edge of the output 33 of the delay generator.

Herein, by employing FIG. 5, a method of, by using the foregoing delay generator 10 and phase comparator 11, measuring the period of the clock signal will be explained.

Figure 5:
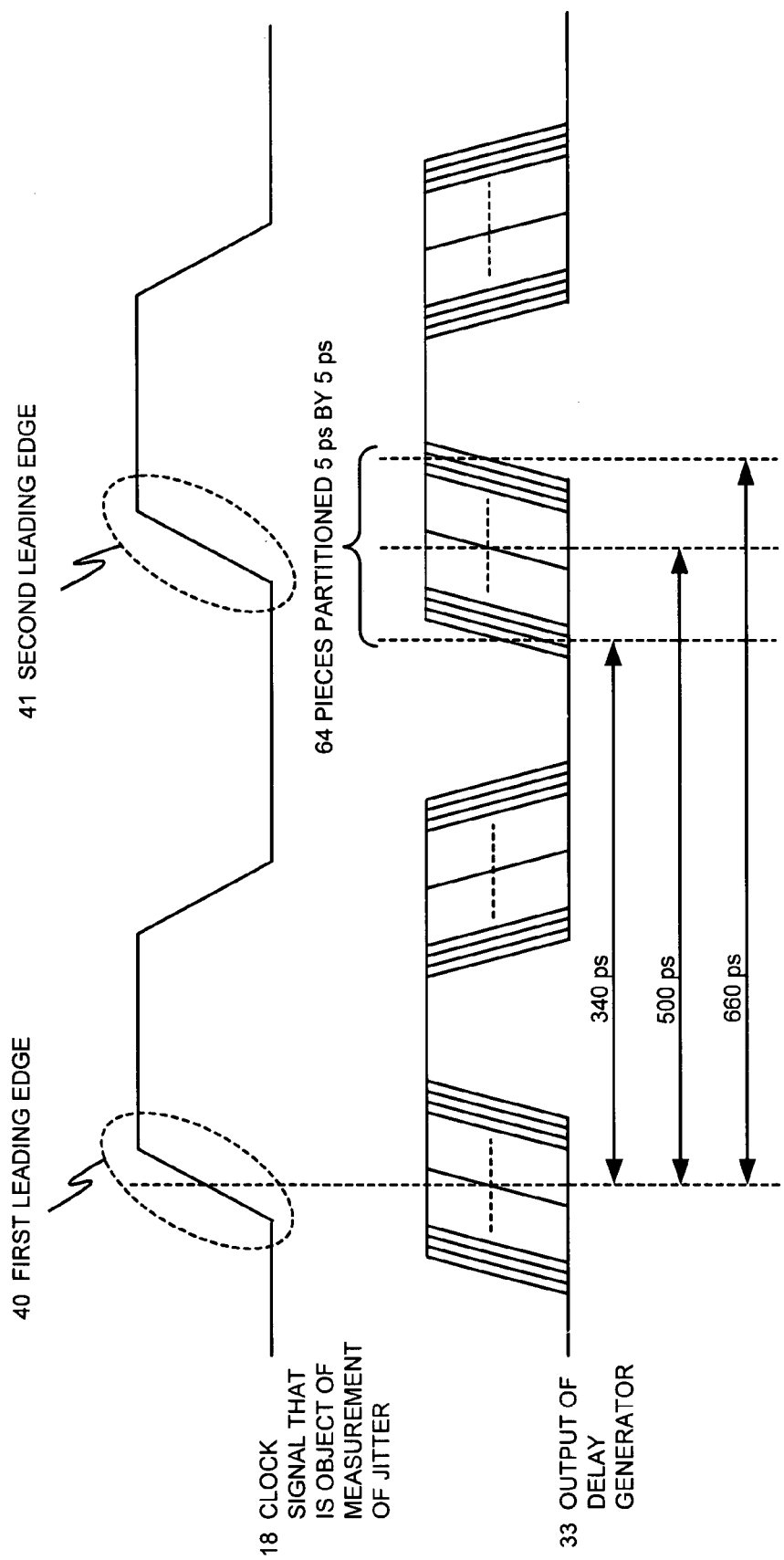
FIG. 5 is a view for explaining a method of measuring the period of the clock signal.

As shown in FIG. 5, 64 leading edges of the output 33 of the delay generator output from the delay generator 10 exist at an equal interval of a 5-ps partition in a range of 340 ps up to 660 ps, with a first leading edge 40 of the clock signal 18 that is an object of measurement assumed to be a starting point. Determining which side rose ahead, out of a second leading edge 41 of the clock signal 18 that is an object of measurement, and each of 64 leading edges having a 5-ps partition of the output 33 of the delay generator output from the delay generator 10 by each of 64 flip-flops 36 allows the period of the clock signal to be measured 5-ps partition by 5-ps partition in a range of 500 ps±660 ps. This allows the period of the clock signal including the jitter to be measured.

As an example, an ideal case where no jitter exists in the clock signal 18 that is an object of measurement will be explained.

With the first leading edge 40 of the clock signal 18 that is an object of measurement assumed to be a starting point, the second leading edge 41 of the two-GHz clock signal 18 of that is an object of measurement exists after 500 ps. The time ranging from the first leading edge 40 to the second leading edge 41 is a period of the cock signal.

With the first leading edge 40 of the clock signal 18 that is an object of measurement assumed to be a starting point, the outputs 33 of the delay generator that rose in a range of 340 ps to 500 ps are ahead of the second leading edge 41 of the clock signal 18 that is an object of measurement. For this, the output level of each flip-flop becomes high, and only the high-level signal is output to outputs A [31:0] of the phase comparator 11.

On the other hand, with the first leading edge 40 of the clock signal 18 that is an object of measurement assumed to be a starting point, the outputs 33 of the delay generator that rose in a range of 500 ps up to 600 ps are behind the second leading edge 41 of the clock signal 18 that is an object of measurement. For this, the output level of each flip-flop becomes low, and only the low-level signal is output to outputs A [63:32] of the phase comparator 11.

Accordingly, in the outputs A [63:0] of the phase comparator 11, a most significant bit A [31] having the high-level signal output corresponds to a period 500 ps of the clock signal that is an object of measurement.

In a case of a practical signal, i.e. in a case where the jitter exists in the clock signal, if the period of the clock signal is shorter than 500 ps, the most significant bit having the high-level signal output becomes one of A [30] to A [0], and if the period of the clock signal is longer than 500 ps, the most significant bit having the high-level signal output becomes one of A [33] to A [63]. This measurement result is output as a 64-bit digital signal.

Continuously, a priority encoder 12 will be explained for reducing a data amount of the measurement result measured by the foregoing measurement circuit.

So as to output all of 64 outputs A [63:0] from the phase comparator 11 of the foregoing measurement circuit as a measurement result, 64 output pins have to be prepared, which causes the cost to become high. Thereupon, so as to reduce the output number, the priority encoder 12 is used.

In the 64 outputs A [63:0] of the phase comparator 11, the most significant bit having the high level signal output is most important because of signifying the period of the clock signal 18 that is an object of measurement. On the other hand, the bits that are ranked low than the most significant bit having the high-level signal output are all a high-level signal, and the bits that are ranked high than the most significant bit having the high-level signal output are all a low-level signal. For this, the output signal other than the most significant bit having the high-level signal output can be predicted. Thereupon, only a bit position of the most significant bit having the high-level signal output is binary-coded and is output by the priority encoder 12.

This output of the priority encoder 12 is input into a peak value holding circuit 13 and a digital low-pass filter 14 respectively.

The priority encoder 12 is a circuit for making a binary coding of and outputting the bit position of the most significant bit having the high-level signal output. Employing the priority encoder 12 makes it possible to curtail the 64 outputs of the phase comparator 11 into a six-bit output.

17 is a calibrator.

As described above, the delay generator 10 outputs 64 delays partitioned 5 ps by 5 ps in a range of 340 ps to 660 ps. However, delay fluctuation occurs due to process dispersion, power source voltage fluctuation, and a temperature change in the practical LSI. For this, it is very difficult to realize the delay as designed. When the delay fluctuation exists, an accuracy of the value of the jitter of the measurement result is lost, which becomes a subject of discussion. Thereupon, a necessity occurs for correcting the delay fluctuation due to the process dispersion, the power source voltage fluctuation, and the temperature change.

Also in a case where the jitter exists in the two-GHz clock signal 18 that is an object of measurement, an average value of the clock period amounts to 500 ps. Accordingly, in a case where the delay as designed was realized in the delay generator 10, the probability that the level of the most significant bit of the output of the priority encoder 12 becomes high is less than 50%. However, in a case where the delay of the delay generator 10 is shorter than the designed one, the probability that the level of the most significant bit of the output of the priority encoder 12 becomes high is 50% or more. Conversely, in a case where the delay of the delay generator 10 is longer than the designed one, the probability that the level of the most significant bit of the output of the priority encoder 12 becomes high is less than 50%.

Accordingly, checking whether the level of the most significant bit of the output of the priority encoder 12 is high or low plural times makes it possible to determine whether the delay of the delay generator 10 is longer or shorter than the designed one. It is the calibrator 17 that realizes the delay as designed in the delay generator 10 by feeding this determination result back to the delay generator 10.

As shown in FIG. 2, a reset signal 20, the clock signal 18 that is an object of measurement, and the most significant bit that is an output of the priority encoder 12 are input into the calibrator 17. The calibrator 17 outputs a delay adjustment signal 32 to the delay generator 10.

Also, the calibrator 17 carries out a calibration only once in initiating the measurement. By inputting the reset signal 20 into the calibrator 17, an calibration operation is initiated to initialize a delay adjustment signal 32 B [3:0] into (1000). During the calibration operation, it checks whether the provability that the level of the most significant bit of the output of the priority encoder 12 becomes high is 50% or more, or less than 50%. And, if the provability that the level becomes high is 50% or more, adding 1 to the delay adjustment signal 32 B [3:0] causes the delay of the delay generator 10 to augment, and if it is less than 50%, subtracting the delay adjustment signal 32 B [3:0] by 1 causes the delay of the delay generator 10 to decrease. Repeating the delay determination and the delay adjustment 32 times in such a manner allows the delay fluctuation due to the process dispersion, the power source voltage fluctuation, and the temperature change to be corrected, which makes it possible to realize the delay as designed in the delay generator 10.

After the calibrator 17 repeated the delay determination and the delay adjustment 32 times, it holds the value of the delay adjustment signal 32, and completes the calibration.

Figure 6:
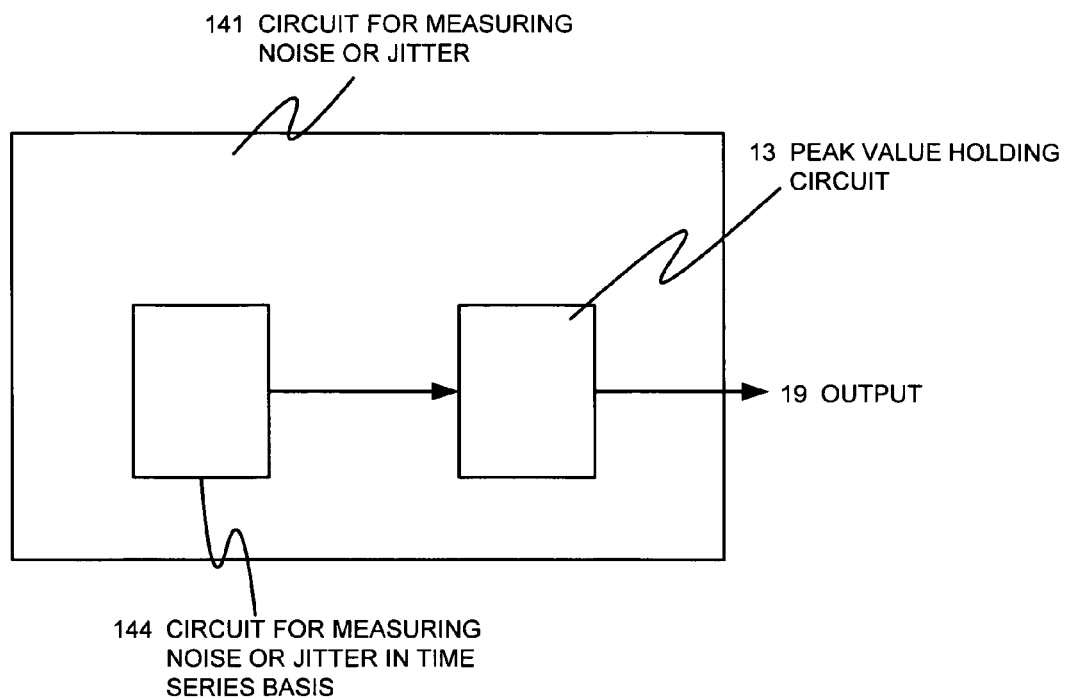
FIG. 6 is a conceptual view of the semiconductor integrated circuit apparatus in a case where a peak value holding circuit was provided.

Continuously, the peak value holding circuit for outputting only the peak value of the measurement result measured in the foregoing measurement circuit will be explained, by employing FIG. 6.

A circuit 144 for measuring the jitter in a time series basis, i.e. the phase comparator 11, and the peak value holding circuit 13 are configured in a measurement circuit 141 for measuring the jitter. Additionally, a case will be explained where the peak value holding circuit 13 is configured within the measurement circuit; however it may be configured outside the measurement circuit. Also, the peak value holding circuit 13 may be configured so that it is connected to the foregoing phase comparator 11 of the measurement circuit; however the priority encoder 12 is preferably connected between the phase comparator 11 and the peak value holding circuit 13. In this embodiment, a configuration having the priority encoder 12 connected is employed for explanation.

The peak value holding circuit 13 holds the maximum value or the minimum value out of six-bit clock period measurement results that are output from the priority encoder 12 to output it with a six-bit pattern. This allows the maximum value and the minimum value of the period of the clock including the periodic jitter to be measured. The peak value holding circuit 13 holds the maximum value in a case where a maximum-value/minimum-value selection signal 21 is a high-level signal, and it holds the minimum value in a case where the maximum-value/minimum-value selection signal 21 is a low-level signal. The initialization of the maximum value or the minimum value that it holds is carried out with a peak-value reset signal 23 from the calibrator 17.

In such a manner, employing the peak-value holding circuit makes it possible to measure only the peak value of the jitter.

Figure 7:
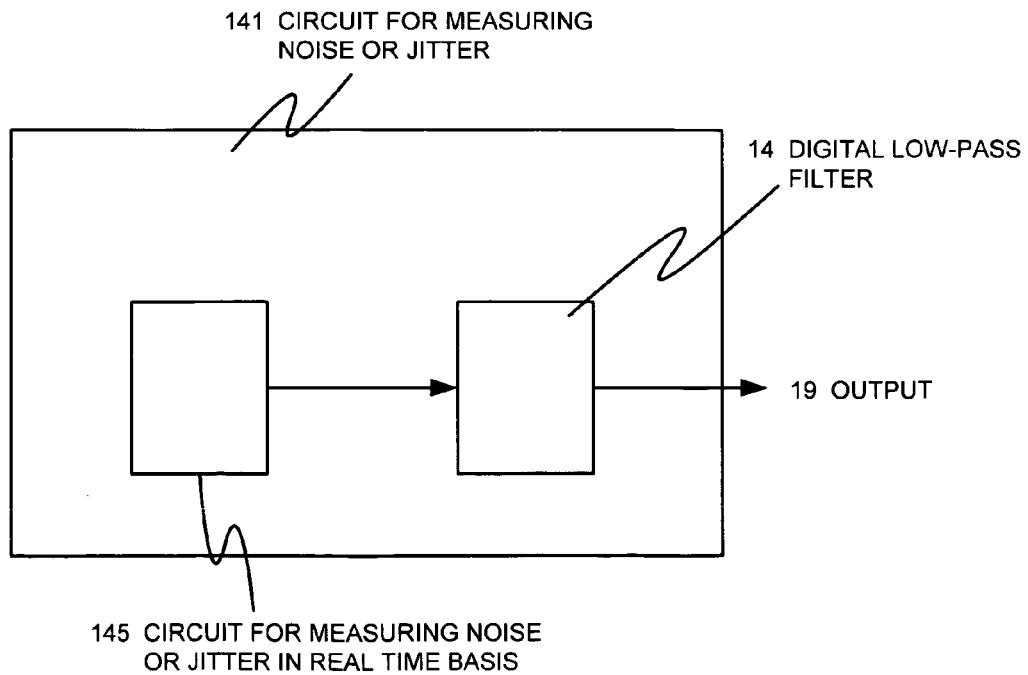
FIG. 7 is a conceptual view of the semiconductor integrated circuit apparatus in a case where a low-pass filter was provided.

Continuously, a digital low-pass filter for deleting a high-frequency component of the measurement result measured by the foregoing measurement circuit will be explained, by employing FIG. 7. Additionally, the low-pass filter is employed for explanation in this embodiment; however a band pass filter may be employed.

A circuit 145 for measuring the jitter in a real time basis, i.e. the phase comparator 11, and a digital low-pass filter 14 are configured in the foregoing measurement circuit 141 for measuring the jitter. Additionally, a case where the low-pass filter is configured within the measurement circuit will be explained; however it may be configured outside the measurement circuit. Also, the digital low-pass filter 14 may be configured so that it is connected to the phase comparator 11 of the foregoing measurement circuit; however the priority encoder 12 is preferably connected between the phase comparator 11 and the digital low-pass filter. Herein, a configuration having the priority encoder 12 connected is employed for explanation.

As to the six-bit clock period measurement result that is output from the priority encoder 12, its data amount amounts to 12 G bps. In a case of having the purpose of measuring the maximum value and the minimum value of the periodic jitter, the measurement result should be output intermittently. However, in a case of analyzing a frequency component of the periodic jitter, the measurement result has to be output continuously so that no data is left out.

So as to analyze the frequency component of the periodic jitter, in a case of outputting data of 12 G bps that is a clock period measurement result to the outside of the measurement circuit, for example, 12 pins each of which can send 1 G bps out have to be prepared, which causes the cost to become high. Thereupon, so as to curtail the pin number of the output, the high-frequency component of the measurement result is deleted by employing the digital low-pass filter 14, which is output as six-bit data.

Specifically, by deleting the high-frequency component of the measurement result of 12 G bps with a six-bit pattern by the digital low-pass filter 14, the measurement result is curtailed into data of 1.5 G bps that is eight times smaller than it. The band of the measurement result is reduced from an original 1-GHz one to a 125-MHz one that is eight times smaller than it, and the component of 125 MHz to 1 GHz is deleted; however the component of less than 125 MHz is preserved. This allows data to be reduced.

As described above, the band of the measurement result and the pin number of the output have a trade-off relation. For example, the higher a cut-off frequency of the digital low-pass filter 14 is, the more the high-frequency component of the measurement result is output, whereby the data amount augments, and the pin number of the output augments. Conversely, the cut-off frequency of the digital low-pass filter 14 is lower, all the more only the low-frequency component of the measurement result is output, whereby the data amount reduces, and the pin number of the output reduces.

Employing the low-pass filter in such a manner makes it possible to output the measurement result of the low-frequency component even though the band of the measurement result is low.

Additionally, with a configuration having the foregoing peak-value holding circuit 13 and digital low-pass filter 14 connected to the measurement circuit, as shown in FIG. 2, its configuration is made so that a selector 15 is provided to select and output the six-bit output of the peak value holding circuit 13, or the six-bit output of the digital low-pass filter 14.

Figure 8:
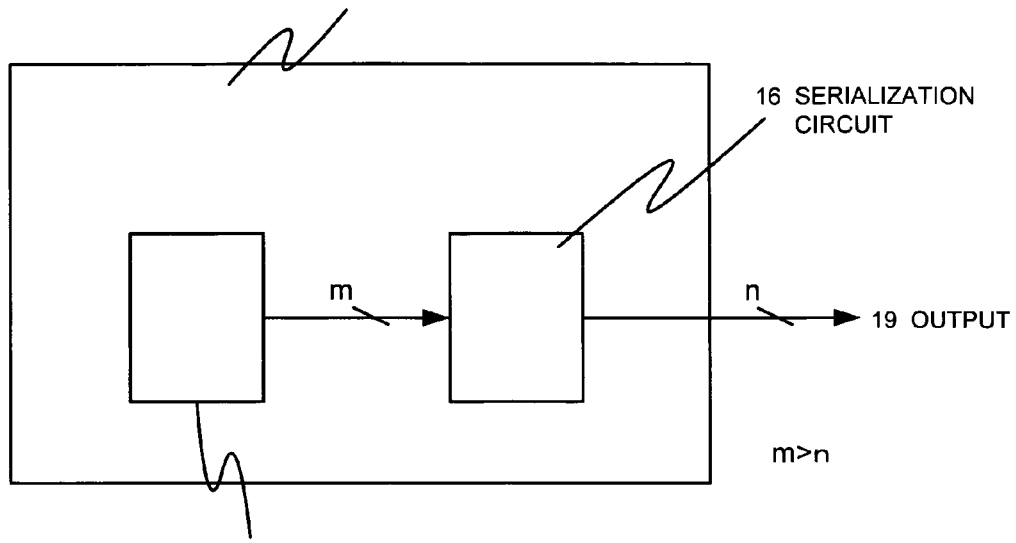
FIG. 8 is a conceptual view of the semiconductor integrated circuit apparatus in a case where a serialization circuit was provided.

Next, a configuration having a serialization circuit provided for reducing the data amount of the measurement result will be explained, by employing FIG. 8.

A circuit 144 for measuring the jitter in a time series basis, i.e. the phase comparator 11, and a serialization circuit 16 are configured in the forgoing measurement circuit 141 for measuring the jitter. Additionally, a case where the serialization circuit is configured within the measurement circuit will be explained; however it may be configured outside the measurement circuit. Also, the serialization circuit 16 may be configured so that it is connected to the phase comparator 11 of the measurement circuit; however it is preferably configured so that it is connected to the priority encoder 12, the peak value holding circuit 13, the digital low-pass filter 14, or the selector 15. In this embodiment, a configuration having the serialization 16 connected to the selector 15 is employed for explanation.

The serialization circuit 16 is for converting an m-bit output into an n-bit one (m>n). In this embodiment, the six-bit output to be output from the selector 15 is converted into a two-bit one, and is output.

In such a manner, providing the serialization circuit allows the number of the output signal to be curtailed.

Figure 9:
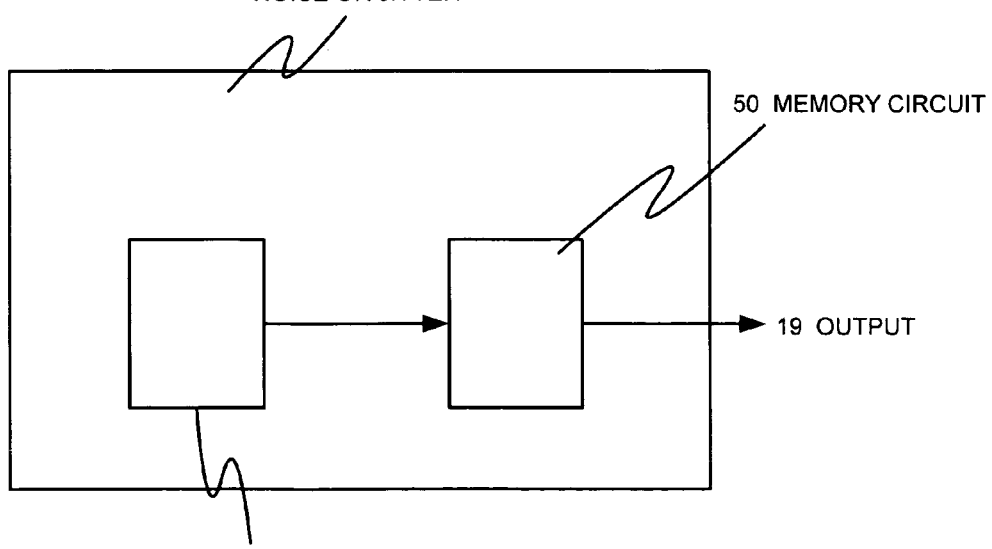
FIG. 9 is a conceptual view of the semiconductor integrated circuit apparatus in a case where a memory circuit was provided.

Next, a memory circuit for accumulating the measurement result that the foregoing measurement circuit measured will be explained, by employing FIG. 9.

A circuit 144 for measuring the jitter in a time series basis, i.e. the phase comparator 11, and a memory circuit 50 are configured in the foregoing measurement circuit 141 for measuring the jitter. Additionally, a case where the memory circuit is configured within the measurement circuit will be explained; however it may be configured outside the measurement circuit, and further, not only it may be configured on the identical chip to that of the measurement circuit, but also it may be configured outside the chip. Also, the memory circuit may be configured to accumulate the output of the phase comparator 11 or the serialization circuit 16 of the foregoing measurement circuit; however a configuration is made more preferably so that the data amount is reduced by employing the foregoing priority encoder 12, peak value holding circuit 13 or digital low-pass filter 14 to causes the memory circuit to store it because a capacity is limited. Also, the memory circuit may be configured to accumulate an analysis result by an analysis section to be later described.

The memory circuit 50 accumulates the measurement result of the jitter measurement circuit and a measurement time of the measurement result correspondingly. Further, the memory circuit 50 accumulates the measurement result that the measurement circuit other than the measurement circuit for measuring the jitter measured.

Configuring such a memory circuit eliminates a necessity for outputting the measurement result whenever the measurement is made. Also, it is enough that the measurement result is output at a low speed after measurement, which enables that making the band of the measurement result broad is compatible with reducing the pin number of the output 19.

Next, the analysis section for analyzing the measurement result obtained in the foregoing measurement circuit will be explained, by employing FIG. 10. Additionally, a case where the analysis section is configured within the measurement circuit will be explained; however it may be configured outside the measurement circuit. Also, the analysis section 150 may make an analysis based upon the output of the phase comparator 11 or the serialization circuit 16 of the foregoing measurement circuit, and the measurement result of which the data amount was reduced by employing the foregoing priority encoder 12, peak value holding circuit 13, or digital low-pass filter 14; however an analysis is made more preferably, based upon the data accumulated in the memory circuit 50.

The analysis section 150 is for analyzing the physical amount that exerts an influence upon the operation of the semiconductor integrated circuit, based upon the measurement result.

As one example of an analytical operation in the analysis section, a method will be explained of analyzing the periodic jitter amount by the analysis section.

The analysis section compares the period of the clock signal that is output from the serialization circuit 16 with the clock period set at the time of designing the semiconductor integrated circuit, thereby analyzing the periodic jitter amount.

Continuously, a case will be explained of measuring the maximum value and the minimum value of the periodic jitter. Additionally, a case will be explained herein of employing the output result from the peak value holding circuit 13 for analysis.

In a case of measuring the maximum value and the minimum value of the periodic jitter, it is enough that the analysis section samples the measurement result of only one point at an arbitrary timing. This is because no change almost exists in the output result from the peak value holding circuit 13 provided that many clock period measurement results of which the measurement number was, for example, approx. 10000 were already input into the peak value holding circuit 13.

Accordingly, after the measurement circuit measured many clock periods, the analysis section samples the data output from the serialization circuit 16 at an arbitrary timing. The analysis section compares the maximum value of the sampled measurement result, i.e. the maximum value of the clock period of the clock signal 18 with the clock period set at the time of designing the semiconductor integrated circuit, thereby analyzing the maximum value of the periodic jitter. Similarly, the analysis section compares the minimum value of the sampled measurement result, i.e. the minimum value of the clock period of the clock signal 18 with the clock period set at the time of designing the semiconductor integrated circuit, thereby analyzing the minimum value of the periodic jitter.

Figure 11:
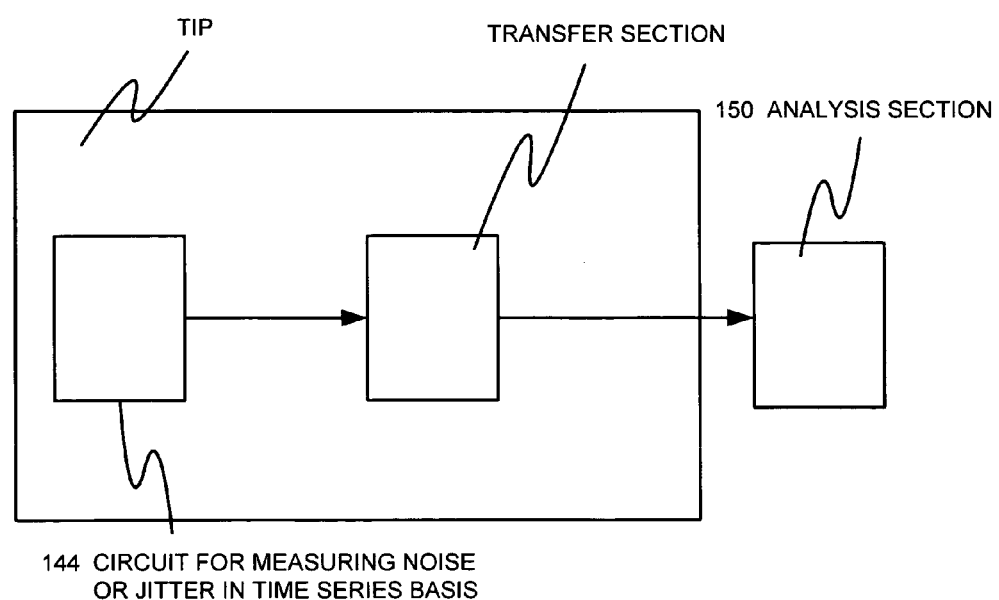
FIG. 11 is a conceptual view of the semiconductor integrated circuit apparatus in a case where a transfer section was provided.

Additionally, a case was explained herein of making an analysis based upon the output from one measurement circuit; however a configuration may be made so that a plurality of the measurement circuits are provided within the chip to respectively make an analysis based upon the outputs from a plurality of the measurement circuits. Also, not only the analysis section is configured on the identical chip to that of the measurement circuit, but also it may be configured outside the chip; however in a case where it is provided outside the chip, as shown in FIG. 11, a transfer section is provided, and the transfer section makes transmission to the analysis section.

Continuously, a case will be explained where the analysis section analyzes the frequency component of the periodic jitter. Additionally, a case will be explained of employing the output result from the digital low-pass filter 14 for analysis.

The analysis section for analyzing the frequency component of the periodic jitter has a real-time oscilloscope and a personal computer.

Figure 12:
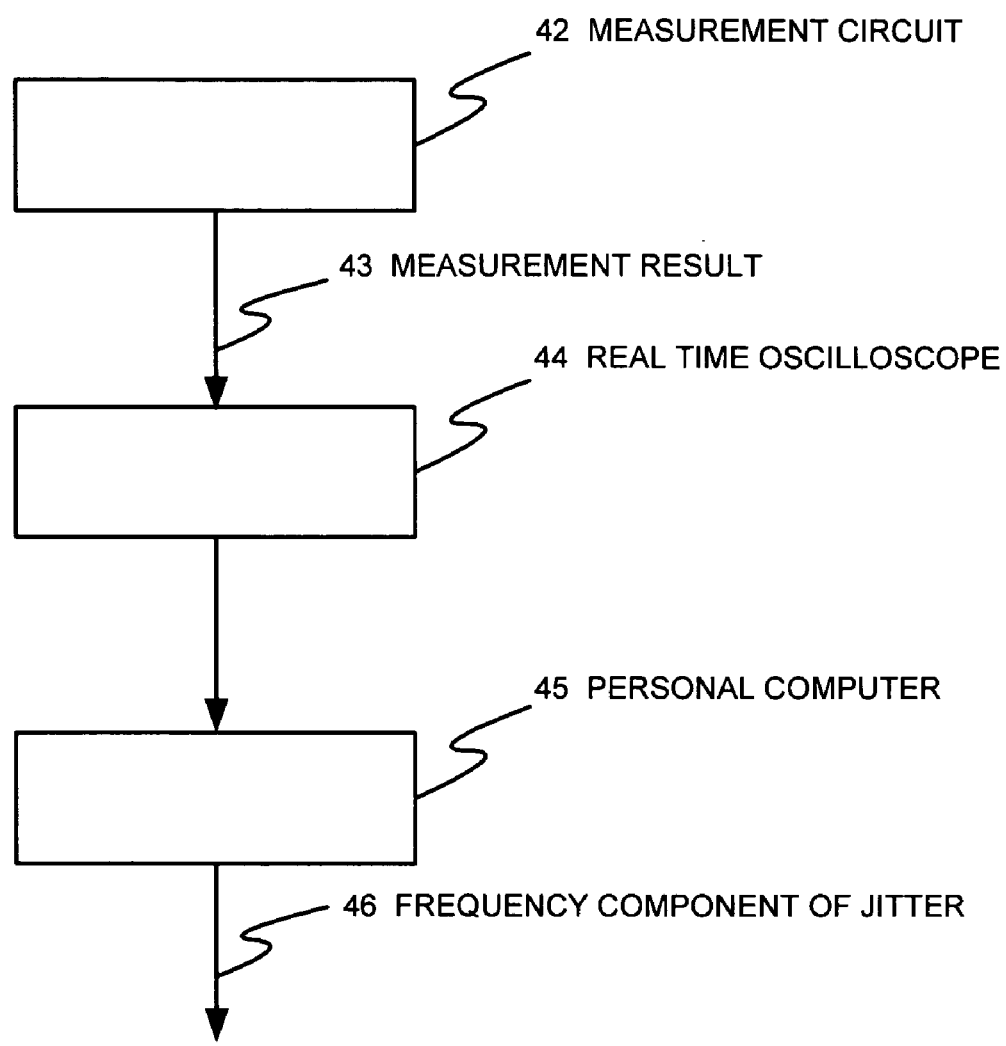
FIG. 12 shows a process flow of the measurement result in the present invention.

Herein, a method of analyzing the frequency component of the periodic jitter of 1 MHz or more for the measurement result of the period of the two-GHz clock signal will be explained, by employing FIG. 12.

In a case of analyzing the frequency component of the periodic jitter, the measurement result has to be output continuously so that no data is left out. For this, a real-time oscilloscope 44 measures all of measurement results 43 of the period of the continuous clock signals of which number is 2000 or more as digital data, and outputs its measured data to a personal computer 45. Making a Fourier transform of the digital data on the personal computer 45 allows a frequency component 46 of the jitter to be obtained.

Figure 13:
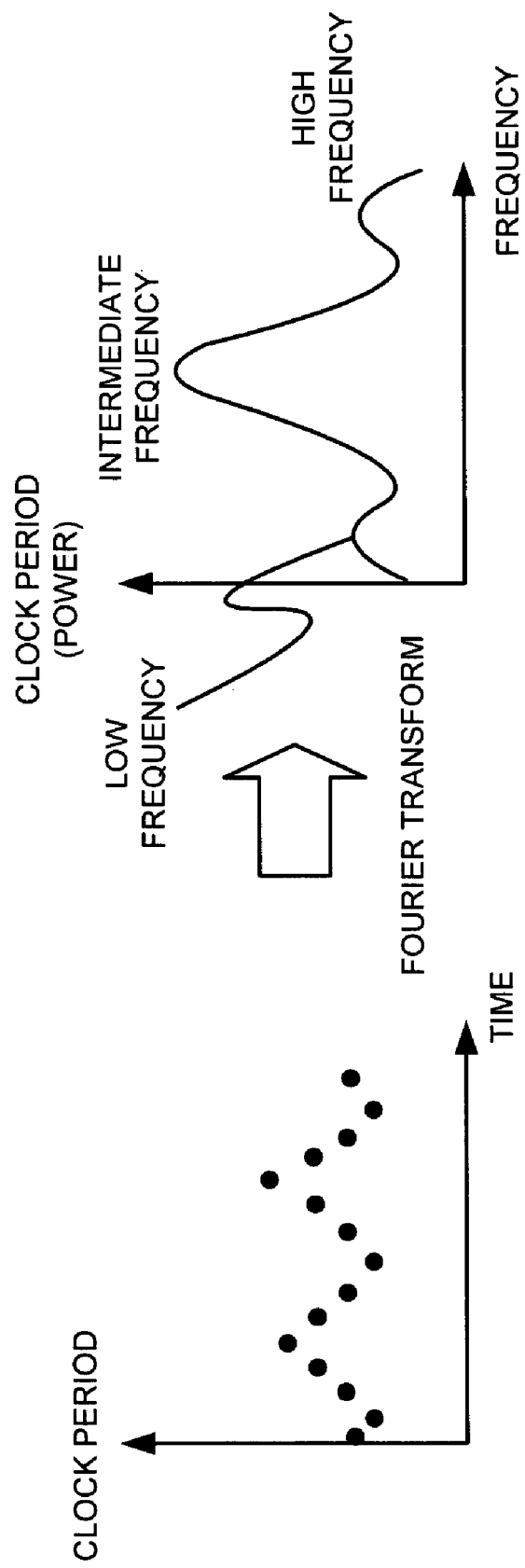
FIG. 13 is a graph showing time dependent of the clock period and frequency dependent of the clock period.
Figure 46:
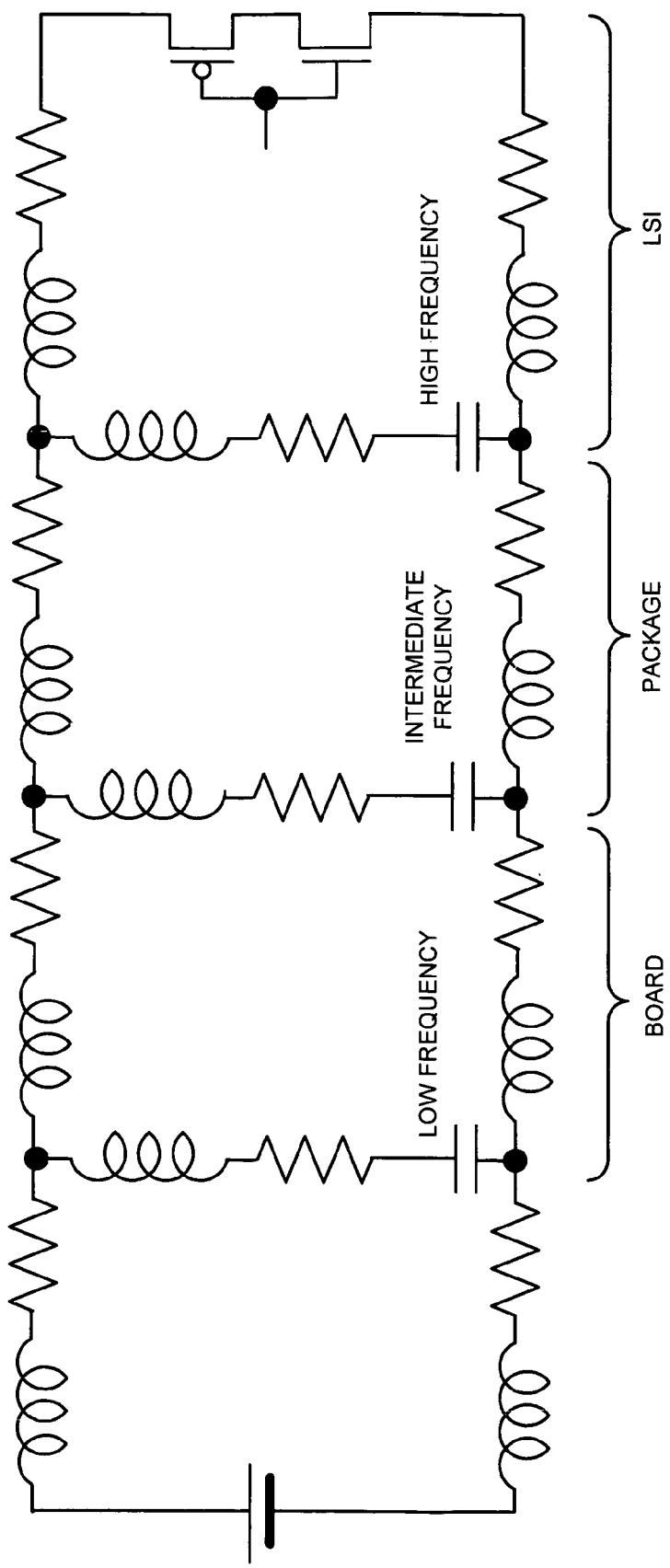
FIG. 46 is an equivalent circuit diagram of the power source system.

In FIG. 13, an example of time dependent of the clock period and frequency dependent of the clock period is shown. An axis of ordinate represents the measurement result of the period of the clock signal, whereas an axis of abscissa represents the time (number of times). Three peaks of a low frequency, an intermediate frequency, and a high frequency exist in a graph of the frequency dependent of the period of the clock signal, and above all, the peak of the intermediate frequency is largest. Accordingly, the instruction that the power source noise of the intermediate frequency should be reduced by modifying the power source system of the package shown in FIG. 46 can be clearly obtained because it is most important to reduce the jitter of the intermediate frequency.

Additionally, the analysis section for analyzing the frequency component of this periodic jitter is provided outside the chip, and the transfer section transmits the measurement result to the analysis section.

Next, a configuration having a monitor section for giving a fault warning based upon the analyzed result will be explained.

Figure 10:
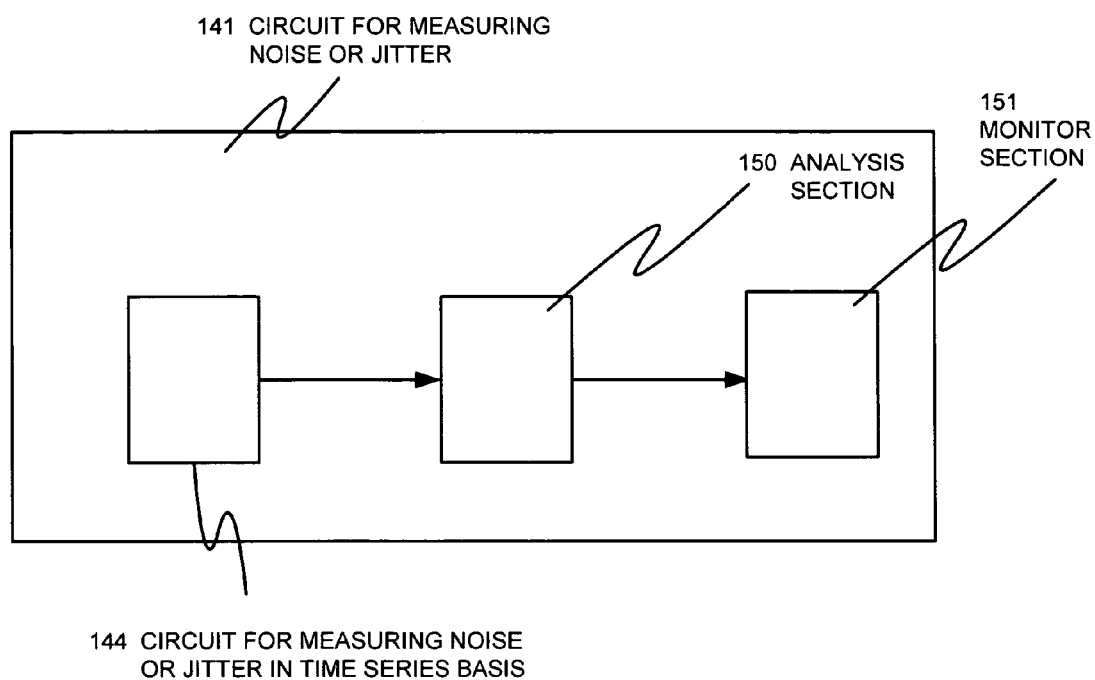
FIG. 10 is a conceptual view of the semiconductor integrated circuit apparatus in a case where an analysis section and a monitor section were provided.

As shown in FIG. 10, the monitor section, which is connected to the analysis section, is for sending warning information out when it detects abnormality. Additionally, a case will be explained where the monitor section is configured within the measurement circuit; however it may be configured outside the measurement circuit.

One example of an operation of the monitor section will be explained.

When the jitter amount that the analysis section analyzed exceeds a certain value, the monitor section judges that abnormal dispersion was detected, and sends a malfunctional signal out to an MPU on the identical chip. The MPU that received the malfunctional signal, for example, causes a display section of the apparatus having this semiconductor integrated circuit mounted to display the warning information in some cases, and notifies the warning information to a manager via a communication line (an internet, a mobile telephone, etc.). This warning information is identification information for identifying the apparatus having this semiconductor integrated circuit mounted, the time when the abnormality was detected, fault prediction information, etc.

Next, a method will be explained of reducing the jitter based upon the analyzed jitter.

Figure 14:
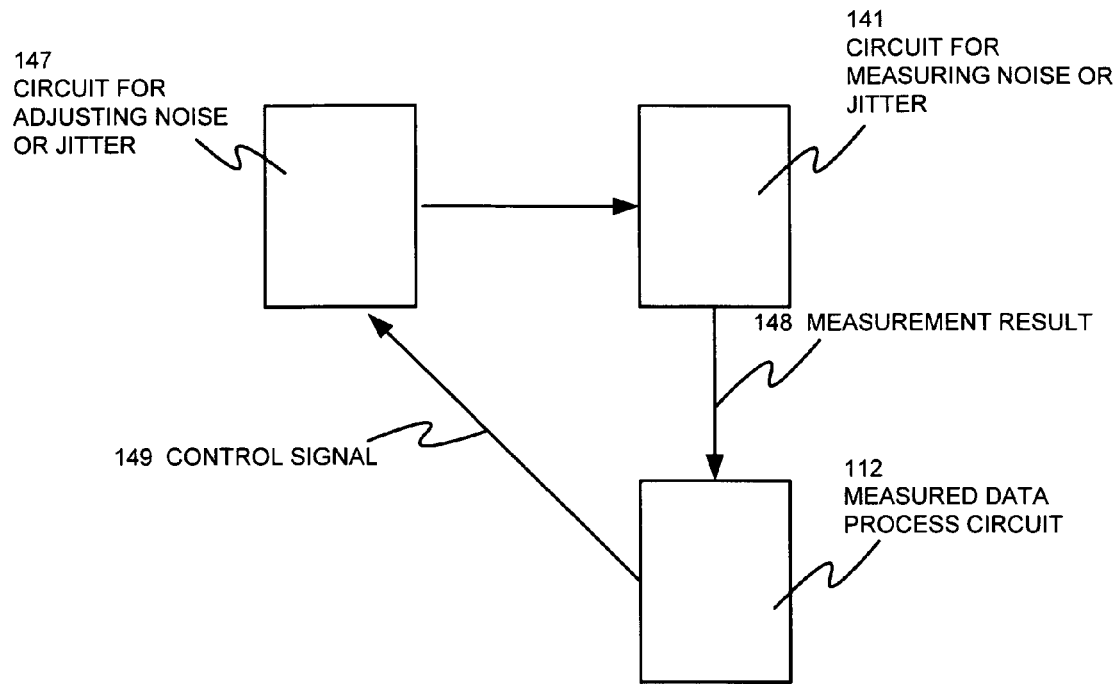
FIG. 14 is a conceptual view of the semiconductor integrated circuit apparatus in a case where an adjustment circuit was provided.

As shown in FIG. 14, the semiconductor integrated circuit apparatus in this embodiment is configured of a jitter measurement circuit 141, an adjustment circuit 147 for adjusting the noise or the jitter, and a measured data process circuit 112. Additionally, this jitter measurement circuit 141 includes the foregoing measurement circuit and analysis section.

A measurement result 148 obtained in the measurement circuit 141 is input into the measured data process circuit 112. The measured data process circuit 112 outputs a control signal 149 necessary for reducing the jitter to the circuit 147 for adjusting the jitter.

Changing a parameter for exerting an influence upon the jitter dynamically with control signal 149 under a feedback control in a loop of the circuit 141 for measuring the jitter, the circuit 147 for adjusting the jitter, and the measured data process circuit 112 allows the jitter to be minimized.

Herein, one example of a method of reducing the jitter will be explained.

Figure 15:
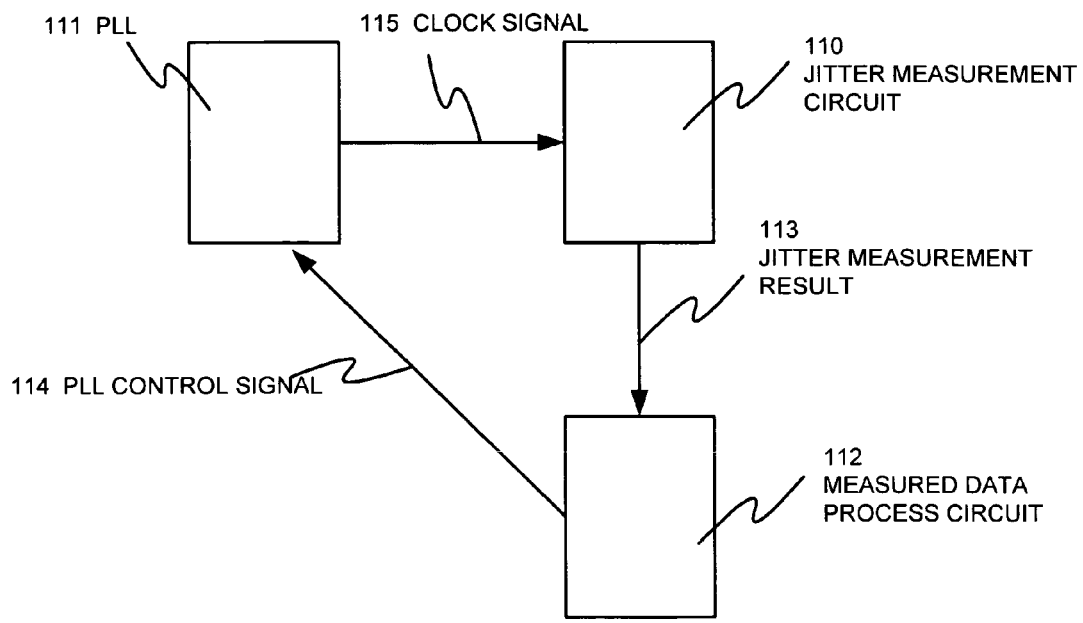
FIG. 15 is a conceptual view of the semiconductor integrated circuit apparatus in a case of reducing the jitter.

As shown in FIG. 15, the semiconductor integrated circuit apparatus in this embodiment is configured of a jitter measurement circuit 110, a PLL 111 of the semiconductor integrated circuit that is an object of measurement, and the measured data process circuit 112. A clock signal 115 that the PLL 111 outputs is input into the jitter measurement circuit 110. Additionally, this jitter measurement circuit 110 includes the foregoing measurement circuit and analysis section.

A jitter measurement result 113 obtained in the jitter measurement circuit 110 is input into the measured data process circuit 112. The measured data process circuit 112 judges and generates a control signal 114 of the PLL necessary for reducing the jitter of the PLL 111 from the jitter measurement result 113, and outputs it to the PLL 111. Changing a parameter for exerting an influence upon the jitter dynamically with a control signal 114 of the PLL in a loop of the jitter measurement circuit 110, the PLL 111, and the measured data process circuit 112 makes it possible to take a feedback control so that the jitter is minimized.

Figure 16:
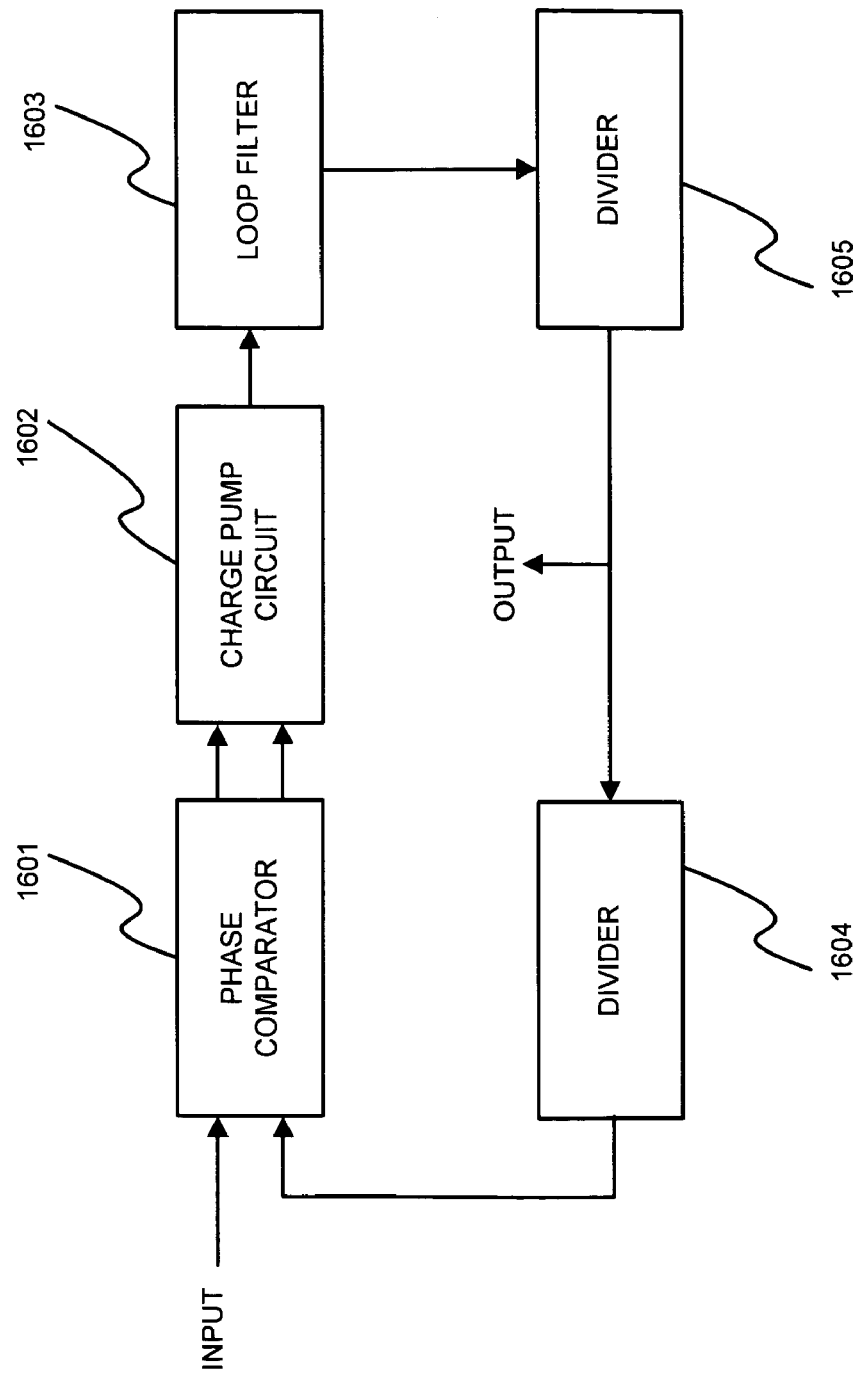
FIG. 16 is a configuration view of a PLL circuit in the present invention.

Herein, one example of a method of changing a parameter for exerting an influence upon the jitter dynamically will be explained, by employing FIG. 16.

The PLL 111, which is configured of a phase comparator 1601 for detecting a phase difference between two input signals, a charge pump circuit 1602 for converting a phase difference signal from the phase comparator 1601 into an analogue signal from a digital signal, a loop filter 1603, a divider 1604, and a voltage control oscillator 1605 of which a oscillation frequency changes depending upon a voltage level of a frequency control signal, configures a feedback loop.

At first, the phase comparator 1601 detects a phase difference between the input signal, and the output signal of the voltage control oscillator 1605. The charge pump circuit 1602 and the loop filter 1603 cause the input voltage level of the voltage control oscillator to go up and down based upon this phase difference. In a stationary state, the frequency of the signal obtained by dividing the oscillation frequency of the voltage control oscillator 1605 by the divider 1604 coincides with the frequency of the input signal. That is, in a stationary state, a signal having the oscillation frequency obtained by increasing that of the input signal by a factor of N is obtained from the output.

Herein, the PLL 111 has a loop bandwidth that is decided by Icp Kvco*R/N. Additionally, Icp is a design parameter of the charge pump circuit, Kvco is a design parameter of the voltage control oscillator 1605, R is a design parameter of the loop filter, and N is a frequency dividing rate of the divider 1604. When this loop bandwidth is high, the high frequency component of the jitter that occurs in the voltage control oscillator 1605 can be suppressed at the moment that the power source of the PLL 111 fluctuated.

Accordingly, in a case where it was analyzed that the jitter of the intermediate frequency or the high frequency was larger, based upon information of the high frequency component that analysis means analyzed, enlarging the design parameter Icp of the charge pump circuit so that the loop bandwidth of the PLL 111 becomes high makes it possible to improve jitter proof stress against the power source voltage fluctuation of the PLL 111. And, as a result, reduction of the jitter of the clock signal is made possible.

Employing the foregoing configuration allows the jitter of the cock signal 115 to be reduced in this embodiment as compared with the conventional method of deciding and settling all parameters at the time of designing the PLL.

Figure 17:
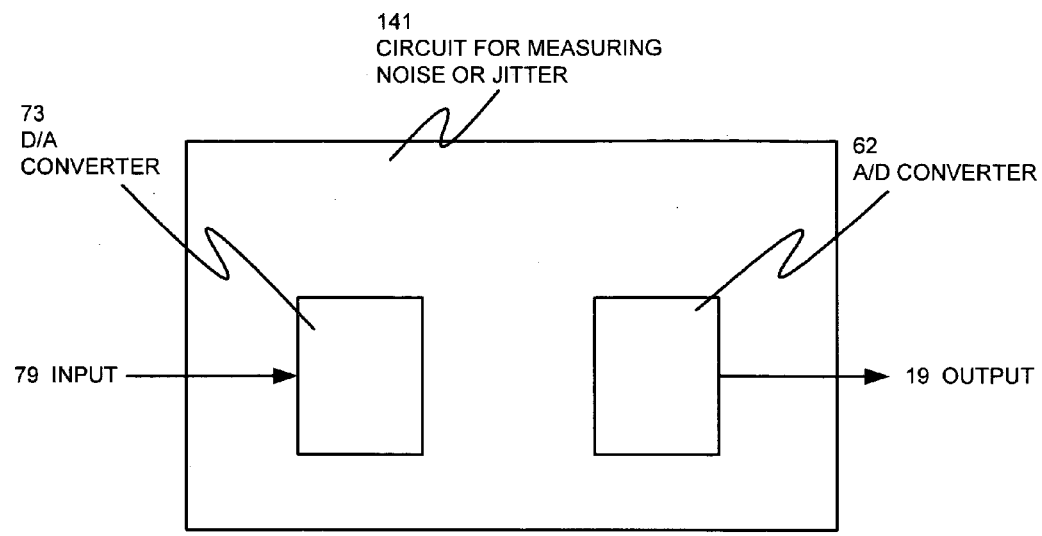
FIG. 17 is a conceptual view of the semiconductor integrated circuit apparatus in a case where a D/A converter and an A/D converter were provided.

Additionally, the jitter that the foregoing measurement circuit of this embodiment measures is of analogue amount. For this, there is a case of inputting or outputting the analogue voltage in order to measure the jitter. However, it is difficult to cause the analogue voltage to propagate on the LSI because the analogue voltage degrades due to the noise. Thereupon, as shown in FIG. 17, by making a configuration so that an input 79 is connected to a D/A converter 73 and an output 19 is connected to an A/D converter 62, both signals of the input 79 and the output 19 may be converted indo a digital signal respectively in the circuit 141 for measuring the jitter.

Figure 18:
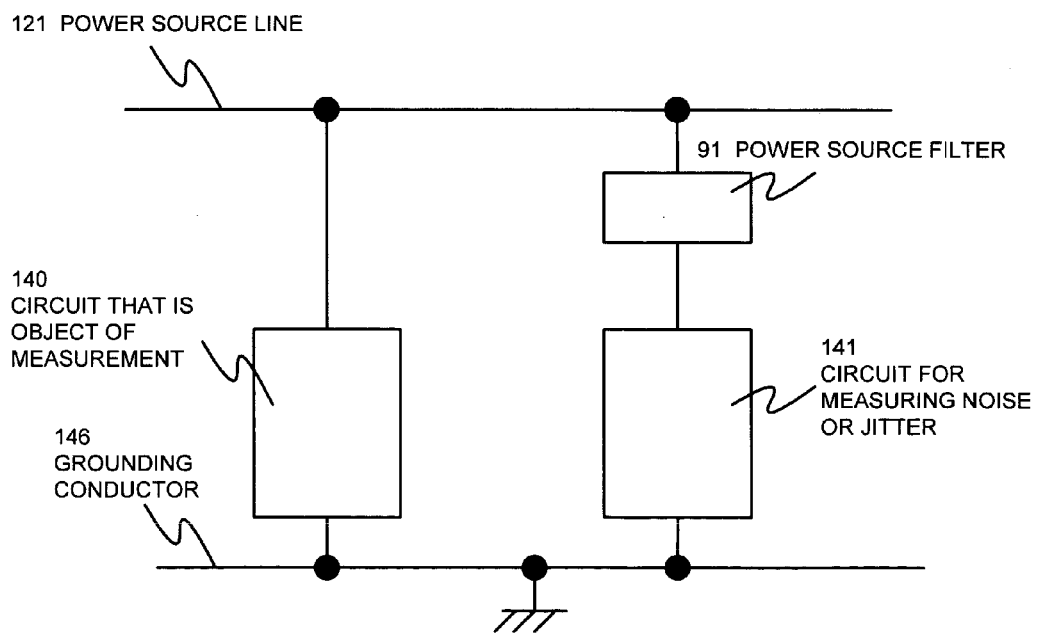
FIG. 18 is a conceptual view of the semiconductor integrated circuit apparatus in a case where a power source filter was provided.

Also, as shown in FIG. 18, the foregoing measurement circuit of this embodiment may be configured to use a power source line 121 and a grounding conductor 146 that are identical to that of the semiconductor integrated circuit 140 that is an object of measurement. Inserting a power source filter 91 between the power source line 121 and the measurement circuit 141 in such a manner allows the power source noise to be prevented from breaking into the measurement circuit 141. This eliminates a necessity for a dedicated power source supply to the circuit 141 for measuring the noise or the jitter, which enables the cost to become low.

As described above, mounting the measurement circuit in accordance with the present invention inside the semiconductor integrated circuit apparatus enables measurement of the jitter on the LSI. Further, it becomes possible to reduce the jitter on the LSI even after manufacturing the LSI, and to efficiently find a countermeasure for reducing the jitter in the semiconductor integrated circuit apparatus based upon its obtained measurement result.

Embodiment 2

Next, a second embodiment in the present invention will be explained, by employing FIG. 19.

In the foregoing measurement circuit of the first embodiment, the configuration was explained of, in outputting the data of 12 G bps to the outside of the measurement circuit, deleting the high frequency component of the measurement result of the period of the clock signal 18 that was an object of measurement with the digital low-pass filter 14 to convert and output the six-bit data into the two-bit one in the serialization circuit 16. In the second embodiment, a configuration having the digital low-pass filter 14 replaced with a memory circuit 50 will be explained. Additionally, identical codes are affixed to components similar to that of the first embodiment, and detailed explanation thereof is omitted.

Figure 19:
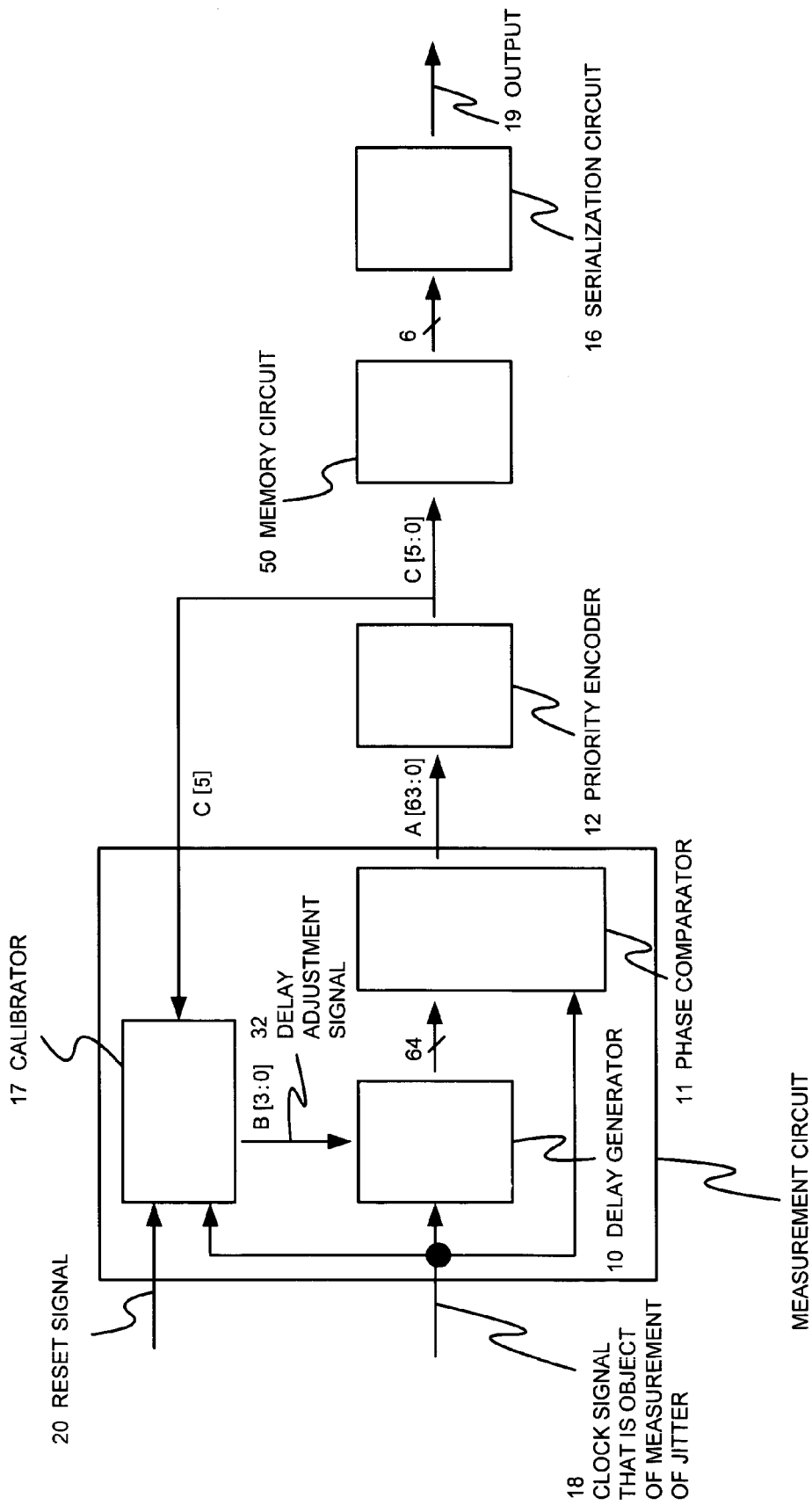
FIG. 19 is a block diagram illustrating a second embodiment of the present invention.

FIG. 19 is a block diagram of the measurement circuit of the second embodiment in the present invention.

The memory circuit 50 stores the measurement result of 12 G bps that is an output of the priority encoder 12 for a constant time. After finishing the measurement, responding to a request for transmitting the measurement result, data that the memory circuit 50 stored is transmitted to the serialization circuit 16. The serialization circuit 16 converts the transmitted six-bit data into a one-bit one, and outputs it at a low-speed data rate.

In such a manner, in a case where the digital low-pass filter 14 was used, the band of the measurement result and the pin number of the output had a trade-off relation; however employing the memory circuit 50 eliminates a necessity for sending the measurement result out to the outside of the measurement circuit during the measurement, which enables that making the band of the measurement result broad is compatible with reducing the pin number of the output.

Embodiment 3

Next, a third embodiment in the present invention will be explained.

As a problem of the foregoing measurement circuit is listed the fact that the periodic jitter that occurred in the delay generator 10 shown in FIG. 2, which is superposed upon the periodic jitter of the clock signal 18 that is an object of measurement, results in being added to the analyzed periodic jitter. Accordingly, a difference has to be clarified between the periodic jitter that occurred in the delay generator 10 and the periodic jitter of the clock signal 18 that is an object of measurement. Thereupon, in the third embodiment, so as to find only the jitter amount of the clock signal 18 that is an object of measurement, a configuration will be explained in which the period of a one-period portion and the period of a two-period portion of the clock signal can be measured.

Assume that a periodic jitter (Jclk) of the clock signal 18 that is an object of measurement, and a periodic jitter (Jdelay) that occurred in the delay generator 10 are an independent phenomenon respectively, it follows that a result (Jmeas) of the analyzed periodic jitter is expressed in EQ. 1.

$$J_{meas}=\sqrt{J_{clk}^2+J_{delay}^2} \quad \text{[EQ. 1]}$$

As a rule, upon increasing the delay of the delay generator 10 by a factor of n, the periodic jitter that occurred in the delay generator is also increased by a factor of n. Let the analysis result of the periodic jitter in this case be defined as Jmeas_n, it is expressed in EQ. 2.

$$J_{meas\_n}=\sqrt{J_{clk}^2+(n \cdot J_{delay})^2} \quad \text{[EQ. 2]}$$

Jmeas and Jmeas_n can be measured; however Jclk and Jdelay, which are impossible to measure, are an unknown quantity respectively. Thereupon, at first, out of outputs 33 of the delay generator 10 in the foregoing measurement circuit, two kinds of the period are measured by employing the delay signals having different delays to analyze the periodic jitter based upon its measurement result. And, solving simultaneous equations of EQ. 1 and EQ. 2 enables the periodic jitter (Jclk) of the clock signal 18 that is an object of measurement, and the periodic jitter (Jdelay) that occurred in the delay generator 10 to be calculated. This method makes it possible to exclude an influence of the periodic jitter that occurred in the delay generator 10 from the measurement result of the jitter, and to find only the periodic jitter of the clock signal 18 that is an object of measurement.

Herein, the delay generator 10 in this embodiment will be explained, by employing FIG. 20.

Figure 20:
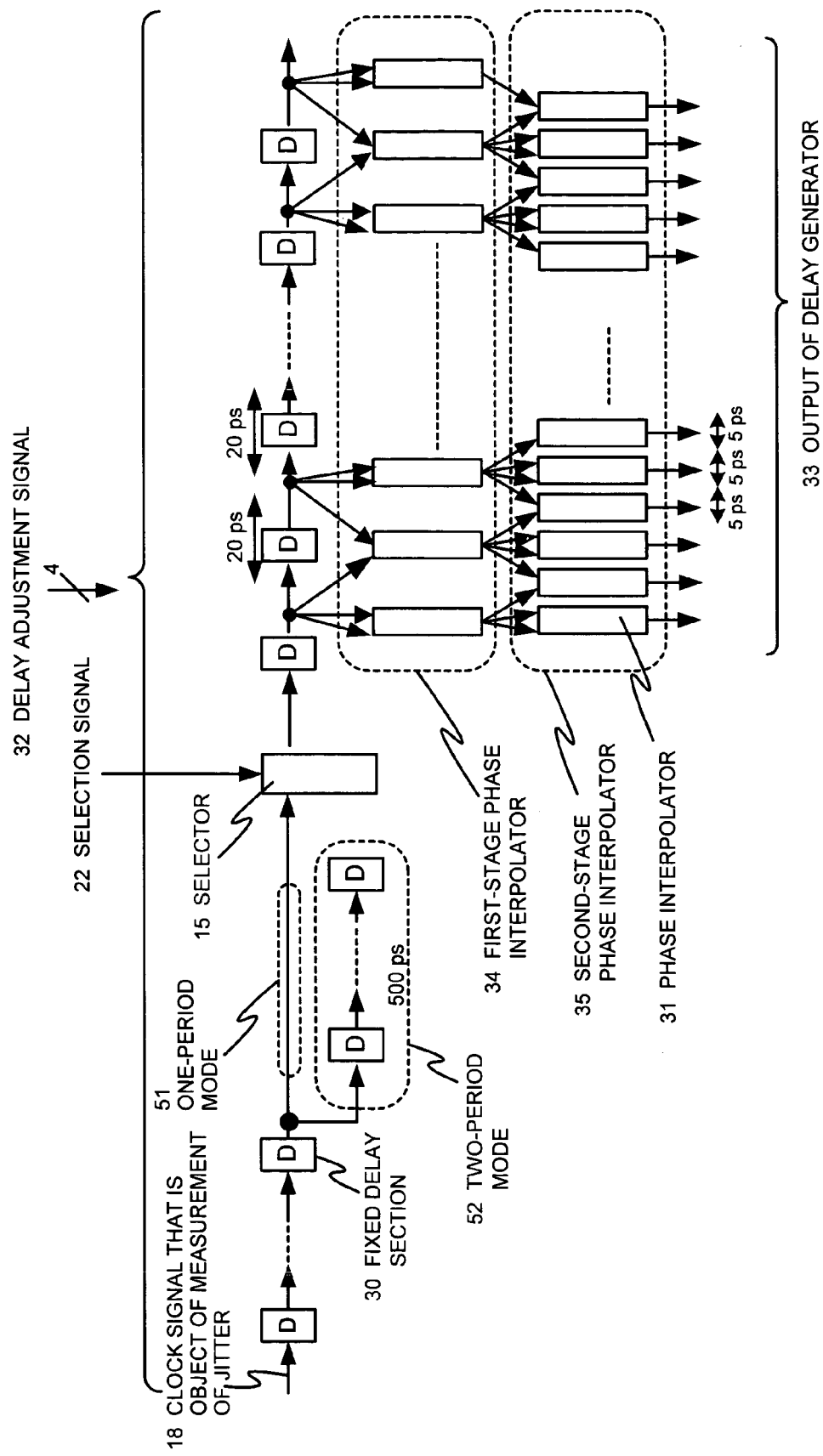
FIG. 20 is a block diagram of a delay generator in a third embodiment of the present invention.

As shown in FIG. 20, the delay generator 10 is configured of a fixed delay section 30 of 20 ps, a phase interpolator 31, and a selector 15. A big difference with the delay generator 10 of FIG. 3 lies in that the delay generator 10 has means added not only for measuring the clock period of a one-period portion of the 2-GHz clock that is an object of measurement of the periodic jitter, but also for measuring the clock period of a two-period portion. The selector 15 is for making a selection as to whether the clock period of a one-period portion is measured, or the clock period of a two-period portion is measured.

The delay generator 10 in this embodiment comprises a one-period mode 51 for outputting 64 delays partitioned 5 ps by 5 ps in a range of 340 ps up to 660 ps, and a two-period mode 52 for outputting 64 delays partitioned 5 ps by 5 ps in a range of 840 ps up to 1160 ps, in addition to the foregoing embodiment.

At first, the selector 15 selects the one-period mode 51, and the delay generator 10 outputs 64 delay signals of the clock signal 18 partitioned 5 ps by 5 ps in a range of 340 ps up to 660 ps like the foregoing embodiment.

Figure 21:
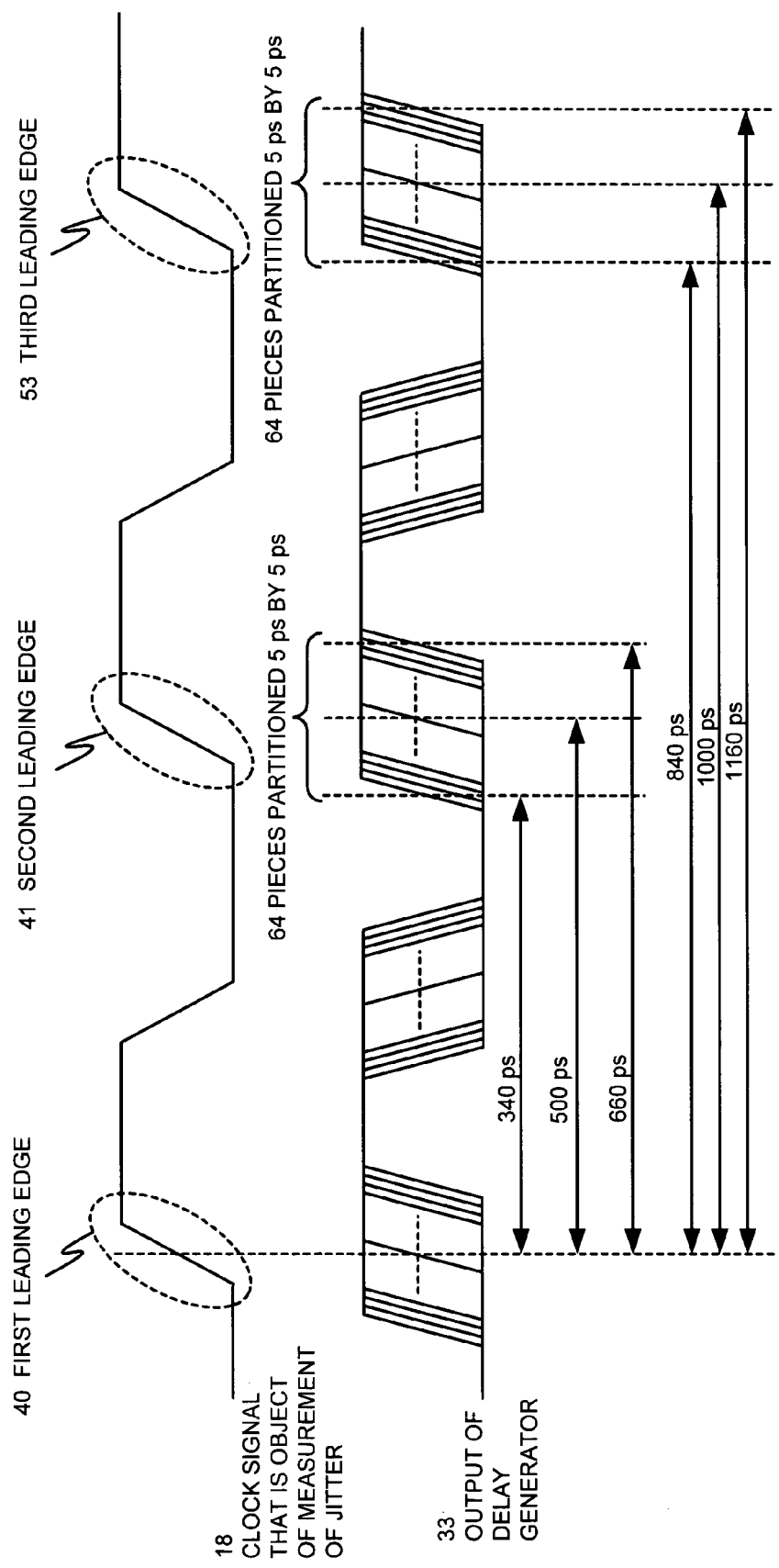
FIG. 21 is a view for explaining a method of measuring the period of the clock signal in the third embodiment of the present invention.

And, as shown in FIG. 21, the phase comparator 11 compares a second leading edge 41 of the clock signal 18 that is an object of measurement with each of 64 leading edges of the output of the delay generator 10 partitioned 5 ps by 5 ps as to which edge rose ahead, with the first leading edge 40 of the two-GHz clock signal 18 that is an object of measurement of the periodic jitter assumed to be a starting point, thereby measuring the clock period of a one-period portion.

Continuously, the selector 15 selects the two-period mode 52, and the delay generator 10 outputs 64 delay signals of the clock signal 18 partitioned 5 ps by 5 ps in a range of 840 ps up to 1160 ps like the foregoing embodiment.

And, as shown in FIG. 21, the phase comparator 11 compares a third leading edge 53 of the clock signal 18 that is an object of measurement with each of 64 leading edges of the output of the delay generator 10 partitioned 5 ps by 5 ps as to which edge rose ahead, with the first leading edge 40 of the two-GHz clock signal 18 that is an object of measurement of the periodic jitter assumed to be a starting point, thereby measuring the clock period of a two-period portion.

The analysis section firstly finds the periodic jitter of a one-period portion and the periodic jitter of a two-period portion of the clock, based upon the period of a one-period portion and the period of a two-period portion of the clock that are a measurement result respectively. And, it analyzes Jmeas and Jmeas_n from these periodic jitter of a one-period portion and periodic jitter of a two-period portion of the clock. The measurement result in the one-period mode corresponds to EQ. 1, and the measurement result in the two-period mode corresponds to EQ. 2 (n=2). The analysis section solves the simultaneous equations of EQ. 1 and EQ. 2, thereby finding only the periodic jitter of the clock signal 18 that is an object of measurement.

Embodiment 4

Next, a fourth embodiment in the present invention will be explained.

In the measurement circuit described in the above-mentioned embodiment, a signal that became a reference of measurement was generated from its own clock signal to measure the periodic jitter of the clock signal by measuring timing discrepancy of the leading edge with this generated signal. However, in a case where the leading edge of the clock signal is swinging very slowly, such a swing is impossible to detect with a method of measuring the periodic jitter, i.e. of measuring a time interval between a certain leading edge and a leading edge next hereto as described above. This is because the leading edge of the clock signal swings very slowly in a case where this periodic jitter is very small. So as to measure the swing of the leading edge that is very slow like this, there is also case where timing jitter needs to be measured in addition to the foregoing periodic jitter.

Thereupon, a case of measuring the timing jitter will be explained in a fourth embodiment, by employing FIG. 22.

Figure 22:
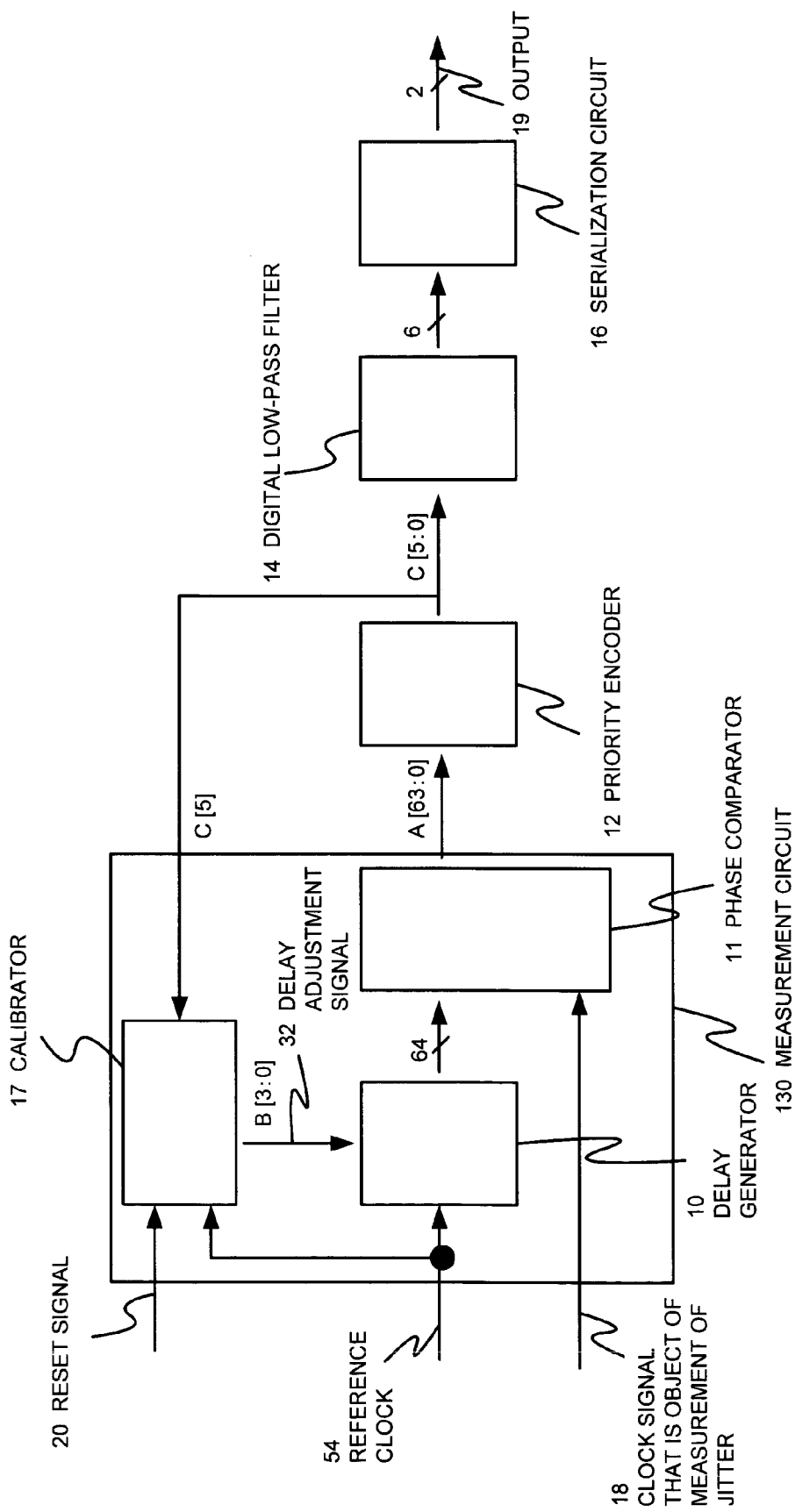
FIG. 22 is a block diagram illustrating a fourth embodiment of the present invention.

FIG. 22 is a block diagram of the fourth embodiment.

The measurement circuit in this embodiment is configured of a delay generator 10, a phase comparator 11, a priority encoder 12, a digital low-pass filter 14, and a serialization circuit 16, and a calibrator 17. Additionally, identical codes are affixed to the components similar to that of the first embodiment, and detailed explanation thereof is omitted.

A big difference with the foregoing embodiment lies in that not the clock signal 18 that is an object of measurement, but a reference clock 54 is input into the delay generator 10.

The delay generator 10 outputs 64 delay signals of the clock signal 18 partitioned 5 ps by 5 ps in a range of 340 ps up to 660 ps based upon the reference clock 54 similarly to the foregoing measurement circuit.

The phase comparator 11 performs a process identical to that of the foregoing embodiment, and outputs the measurement result.

Embodiment 5

A method will be explained of measuring the timing jitter in a configuration different from that of the fourth embodiment as a fifth embodiment in the present invention, by employing FIG. 23.

Figure 23:
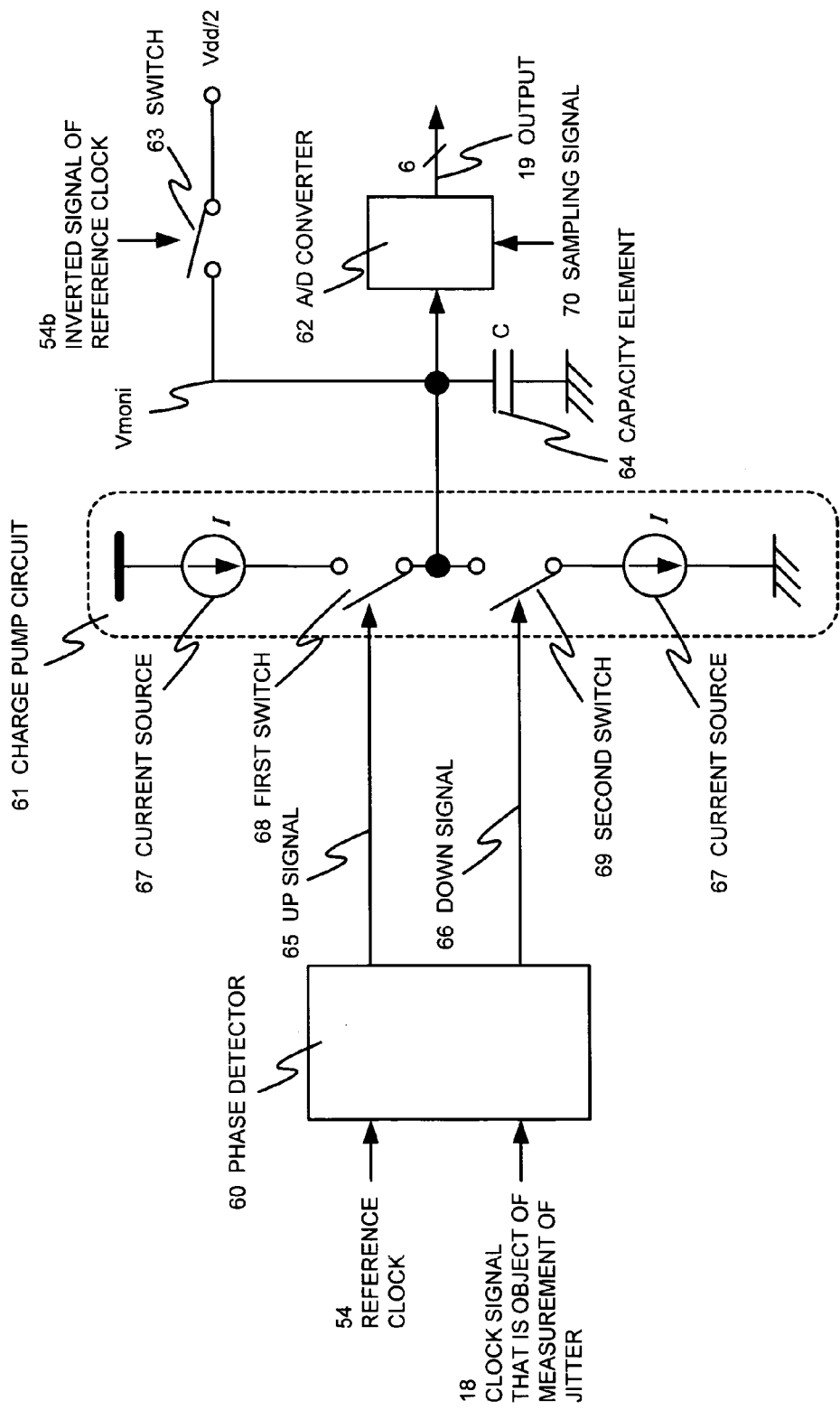
FIG. 23 is a block diagram illustrating a fifth embodiment of the present invention.

As shown in FIG. 23, the measurement circuit in this embodiment is configured of a phase detector 60, a charge pump circuit 61, an A/D converter 62, a switch 63, and a capacity element 64.

The reference clock 54 and the clock signal 18 that is an object of measurement are input into the phase detector 60. The phase detector 60 outputs a phase difference (timing jitter) between the reference clock 54 and the clock signal 18 that is an object of measurement, which were input, as a difference of the high-level interval by means of an up signal 65 and a down signal 66.

Herein, an operation of the signal of the phase detector 60 will be explained, by employing FIG. 24.

When the reference clock 54 rises, the down signal 66 also rises.

On the other hand, when the clock signal 18 that is an object of measurement rises, the up signal 65 also rises.

And, when both of the up signal 65 and the down signal 66 rise, both of the up signal 65 and the down signal 66 trail after a constant time.

The charge pump circuit 61 is configured of two current sources 67, a first switch 68, and a second switch 69 as shown in FIG. 23. The two current sources 67 cause an identical current to flow respectively.

The up signal 65 from the phase detector 60 is input into a control signal of the first switch 68 of the charge pump circuit 61. On the other hand, the down signal 66 from the phase detector 60 is input into a control signal of the second switch 69 of the charge pump circuit 61. The first switch 68 is switched on in a case where the up signal 65 is at a high level, and is switched off in a case where it is at a low level, and the second switch 69 is switched on in a case where the down signal 66 is at a high level, and is switched off in a case where it is at a low level.

As shown in FIG. 23, let a node between the first switch 68 and the second switch 69 be defined as a monitor node, and let an electric potential of the monitor node as Vmoni. The input of an A/D converter 62, the switch 63, and the capacity element 64 are connected to the monitor node. Another terminal of the switch 63 is connected to an electric potential (Vdd/2) that is half the power source voltage. This switch 63 is switched off in a case where the reference clock 54 is at a high level, and switched on in a case where it is at a low level.

Herein, an operation of Vmoni will be explained, by employing FIG. 24.

In a case where the clock signal 18 that was an object of measurement rose ahead of the reference clock 54 by $\Delta T$, the up signal 65 rises ahead of the down signal 66 by $\Delta T$, and both of the up signal 65 and the down signal 66 trail after a constant time. For this, the interval in which the up signal 65 is at a high level becomes longer by $\Delta T$ than that of the down signal 66. As a result, the interval in which the first switch 68 of the charge pump circuit 61 is switched on becomes longer by $\Delta T$ than that of the second switch 69, which causes Vmoni to change from Vdd/2 to Vdd/2+I$\Delta$T/C. Where, I represents a current value that is caused to flow by the current source 67 of FIG. 23, and C represents a capacity value of the capacity element 64 of FIG. 23.

In a case where the reference clock 54 trailed, the switch 63 is switched on, and Vmoni is initialized from Vdd/2+I$\Delta$T/C to Vdd/2.

Conversely, in a case where the clock signal 18 that was an object of measurement rose behind the reference clock 54 by $\Delta T$, the down signal 66 rises ahead the up signal 65 by $\Delta T$, and both of the up signal 65 and the down signal 66 trail after a constant time. For this, the interval in which the down signal 66 is at high level becomes longer by $\Delta T$ than that of the up signal 65. As a result, the interval in which the second switch 69 of the charge pump circuit 61 is switched on becomes longer by $\Delta T$ than that of the first switch 68, which causes Vmoni to change from Vdd/2 to Vdd/2−I$\Delta$T/C. When the reference clock 54 trails, the switch 63 is switched on, and Vmoni is initialized from Vdd/2−I$\Delta$T/C to Vdd/2.

Also, in a case where the clock signal 18 that was an object of measurement and the reference clock 54 rose simultaneously, not only the down signal 66 but also the up signal 65 rises simultaneously. For this, the interval in which the charge pump circuit 61 or the second switch 69 is switched on runs short, and Vmoni remains Vdd/2.

As mentioned above, a phase difference $\Delta T$ of the leading edge between the clock signal 18 that is an object of measurement and the reference clock 54 can be converted into a voltage change amount proportional to $\Delta T$, which is I$\Delta$T/C, for measurement.

The foregoing measurement result of the measurement circuit is converted into six-bit digital data by the A/D converter 62.

Figure 24:
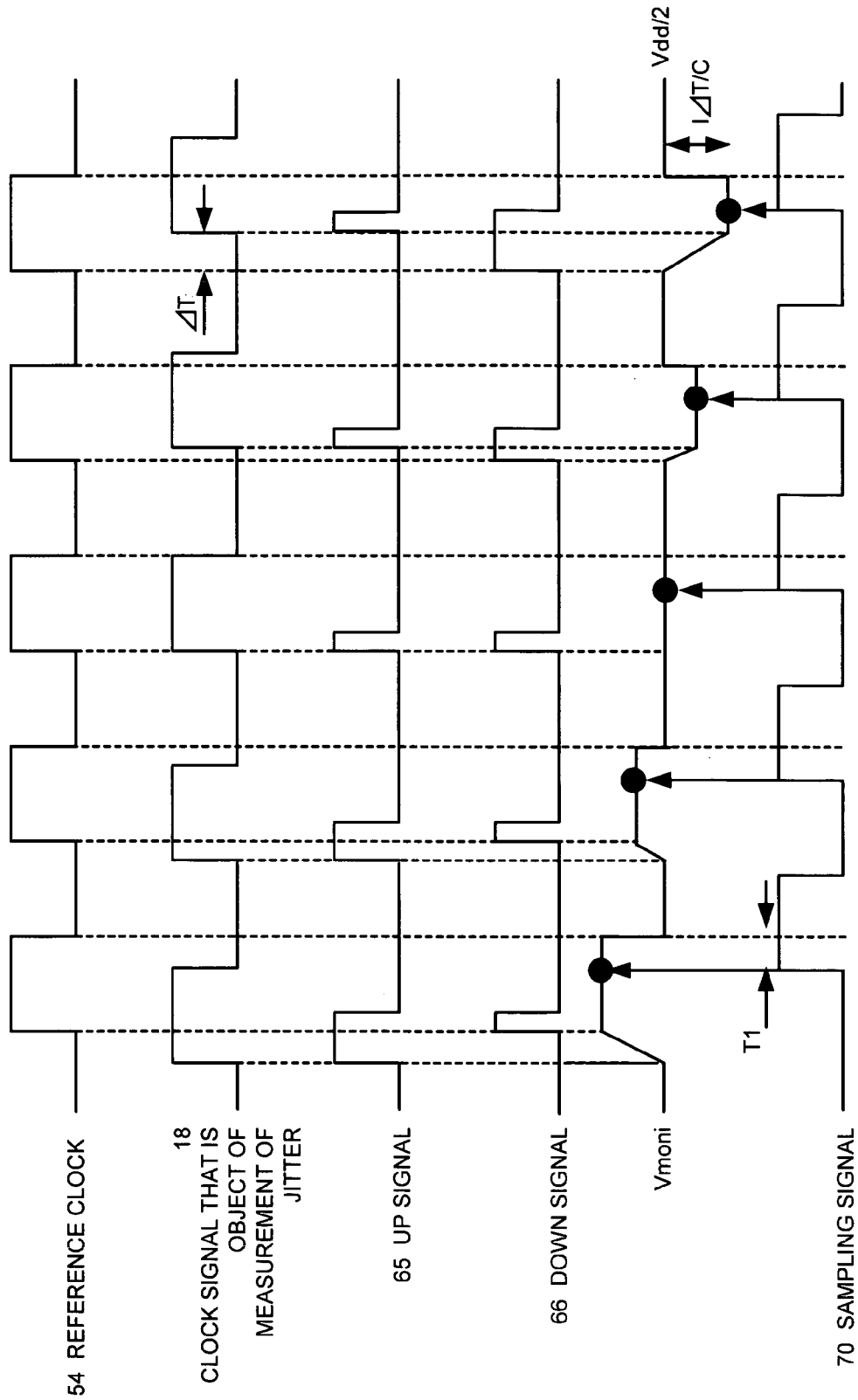
FIG. 24 is an explanatory view illustrating an operation of the fifth embodiment of the present invention.

Sampling of Vmoni to the A/D converter 62 is carried out ahead of the trailing of the reference clock 54 by T1 with a sampling signal 70, as shown in FIG. 24. Also, upon letting a lower limit of an input range of the A/D converter 62 be defined as Vmin, an upper limit as Vmax, and a maximum value of the jitter that is required to measure as $\Delta$Tmax, designing I and C so that Vmin<Vdd/2−I$\Delta$ Tmax/C, and Vdd/2+I$\Delta$Tmax/C<Vmax makes it possible to prevent the measurement result of the jitter from exceeding the input range of the A/D converter 62.

The analysis section calculates a phase difference between the clock signal and the reference signal based upon the output from the A/D converter 62, and analyzes the timing jitter.

The advantage of this embodiment lies in that an area is easy to miniaturize because the delay generator 10 and the phase comparator 11 are unnecessary, and that a filter process is easy like that of the low-pass filter because the measurement result is output as an analogue voltage value as compared with the fourth embodiment.

Embodiment 6

The measurement circuit for measuring the jitter was explained in the foregoing embodiments.

The measurement circuit for measuring the noise will be explained in this embodiment. Additionally, identical codes are affixed to a configuration similar to that of the foregoing embodiment, and detailed explanation thereof is omitted. Also, the measurement circuit of this embodiment is realized by a technology of a power source voltage of 1.0 V, and a 90-nm CMOS process. Also, the power source line is employed as an object of measurement for explanation in this embodiment; however it is not limited hereto. That is, in order to check the noise that propagates through a board, a signal line such as the grounding conductor also may be employed.

Figure 25:
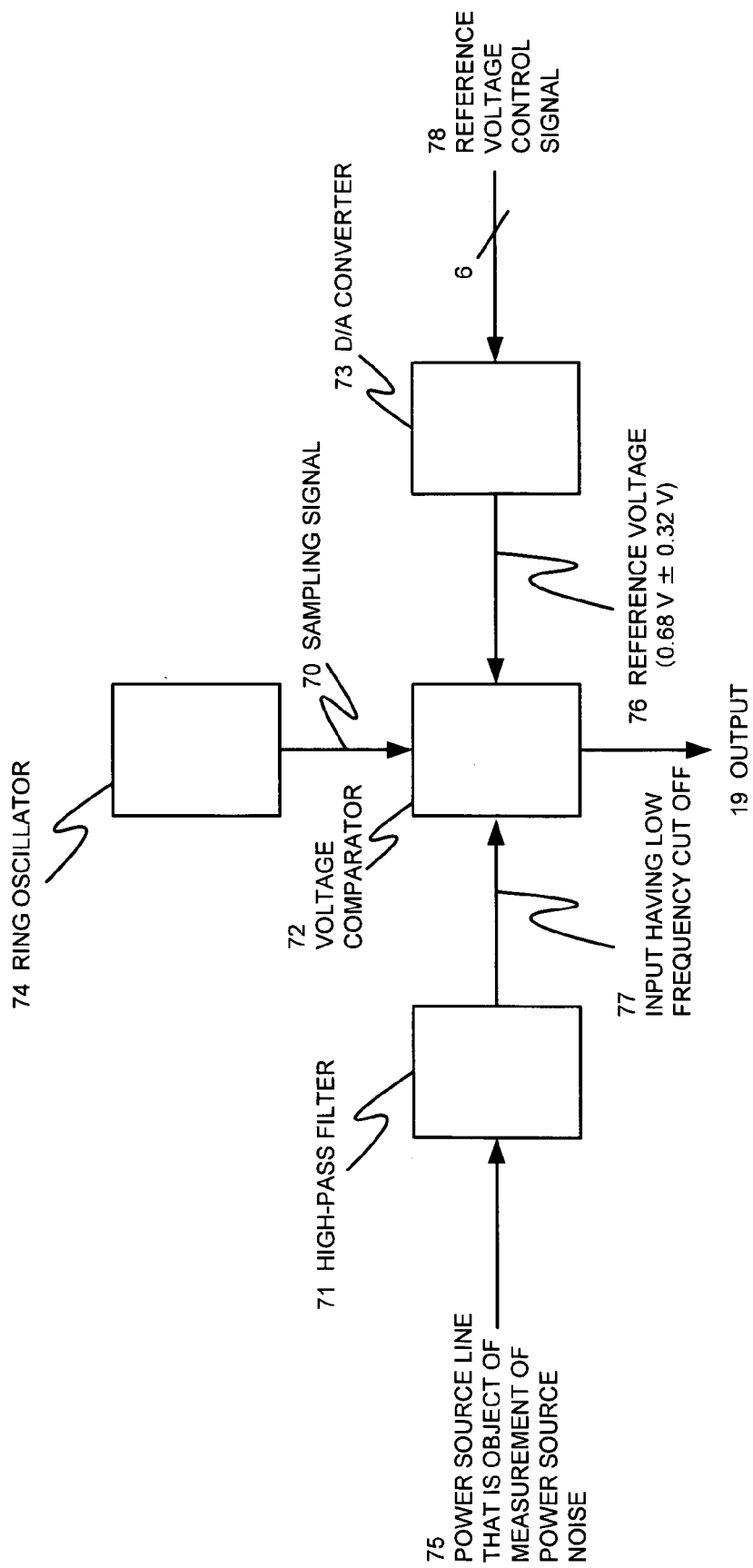
FIG. 25 is a block diagram illustrating a sixth embodiment of the present invention.

FIG. 25 is a measurement circuit for measuring the noise in this embodiment.

As shown in FIG. 25, the measurement circuit in this embodiment is configured of a high-pass filter 71, a voltage comparator 72, a D/A converter 73, and a ring oscillator 74.

The periodical power source noise is an object of measurement, and the noise that occurs only once is impossible to measure because an m-out-of-n sampling measurement is employed in the power source noise measurement circuit.

Also, information as to whether the power source noise exceeded a certain voltage value can be output; however a power source noise waveform is impossible to measure. A clock frequency of the circuit that is an object of measurement of the power source noise is 2.5 GHz, so the periodical power source noise of 2.5 GHz need to be measured.

The high-pass filter 71 is connected to a power source line 75 that is an object of measurement of the power source noise, a direct current component of the power source noise is deleted, and only the high frequency component is input into the voltage comparator 72.

A sampling signal 70 for deciding a timing at which the voltage comparator 72 makes a comparison is generated in the ring oscillator 74, and is input into the voltage comparator 72. A plurality of kinds of reference voltages 76 to be employed at the moment that voltage comparator 72 makes a comparison are generated in the D/A converter 73, and are input into the voltage comparator 72. The voltage comparator 72 makes a voltage comparison between an input 77 having the low frequency component cut away and the voltages of a reference voltage 76 at the instant of the trailing of the sampling signal 70.

Accordingly, the maximum value and the minimum value of the power source noise can be known from a comparison result between each of a plurality of kinds of the reference voltages 76, and the voltage of a power source line 75 that is an object of measurement of the power source noise, which come from this measurement circuit, so amplitude of the power source noise can be known; however the direct current component is impossible to measure.

Herein, in this embodiment, the reason why the high-pass filter 71 is necessary will be explained.

Assume that the voltage range of the power source noise of the power source line 75 that is an object of measurement is 1.0 V±0.3 V. Inputting this power source noise directly into the voltage comparator 72 without going through the high-pass filter 71 necessitates preparation of the reference voltage 76 of 1.0 V±0.3 V. But, in the LSI of the power source voltage 1.0 V, the reference voltage 76 less than 1.0 V is easy to generate; however the reference voltage 76 equal to or more than 1.0 V is difficult to generate. Accordingly, so as to measure the power source noise with the reference voltage 76 less than 1.0 V, the direct current component of the power source noise that is an object of measurement has to be lowered. Accordingly, lowering the direct current component necessitates the high-pass filter 71.

Figure 26:
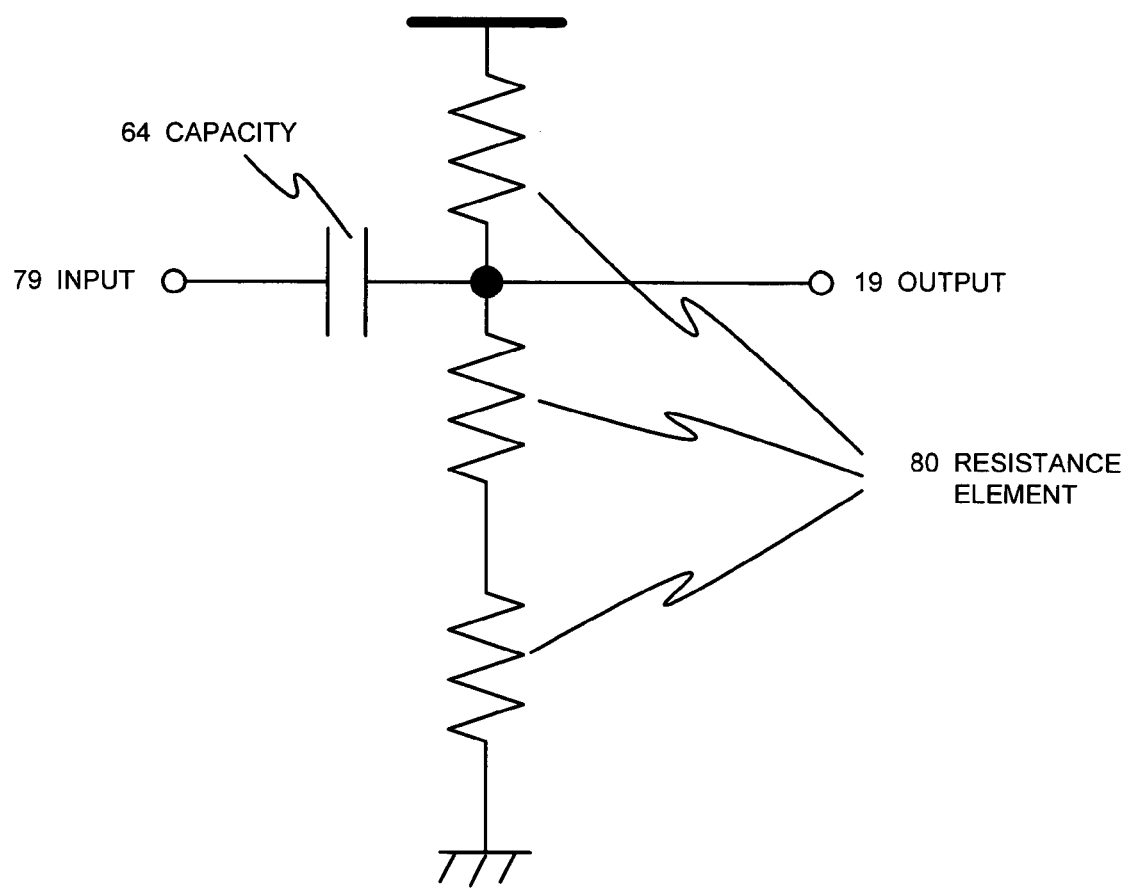
FIG. 26 is a circuit diagram of a high-pass filter of the present invention.

A configuration of the high-pass filter 71 is shown in FIG. 26.

Three resistance elements 80 are connected in series between the power source line and the grounding conductor. Assume that the values of these three resistance elements 80 are identical. Also, a capacity element 64 is connected between an input 79 and the output 19. The direct current component of the power source noise that is an input is a power source voltage 1 V. However, the direct current component of the output 19 of the high-pass filter 71 can be lowered to 0.66 V that is two-thirds the power source voltage. The values of the resistance element 80 and capacity element 64 that configure the high-pass filter 71 are set so that the cut-off frequency of the high-pass filter 71 becomes lower than that of the measured frequency component of the power source noise.

73 is a D/A converter, and a six-bit reference voltage control signal 78 is input into the D/A converter 73. The D/A converter 73 outputs the reference voltages 76 partitioned 10 mV by 10 mV in a range of 0.68 V±0.32 V to the voltage comparator 72 as described above.

Figure 27:
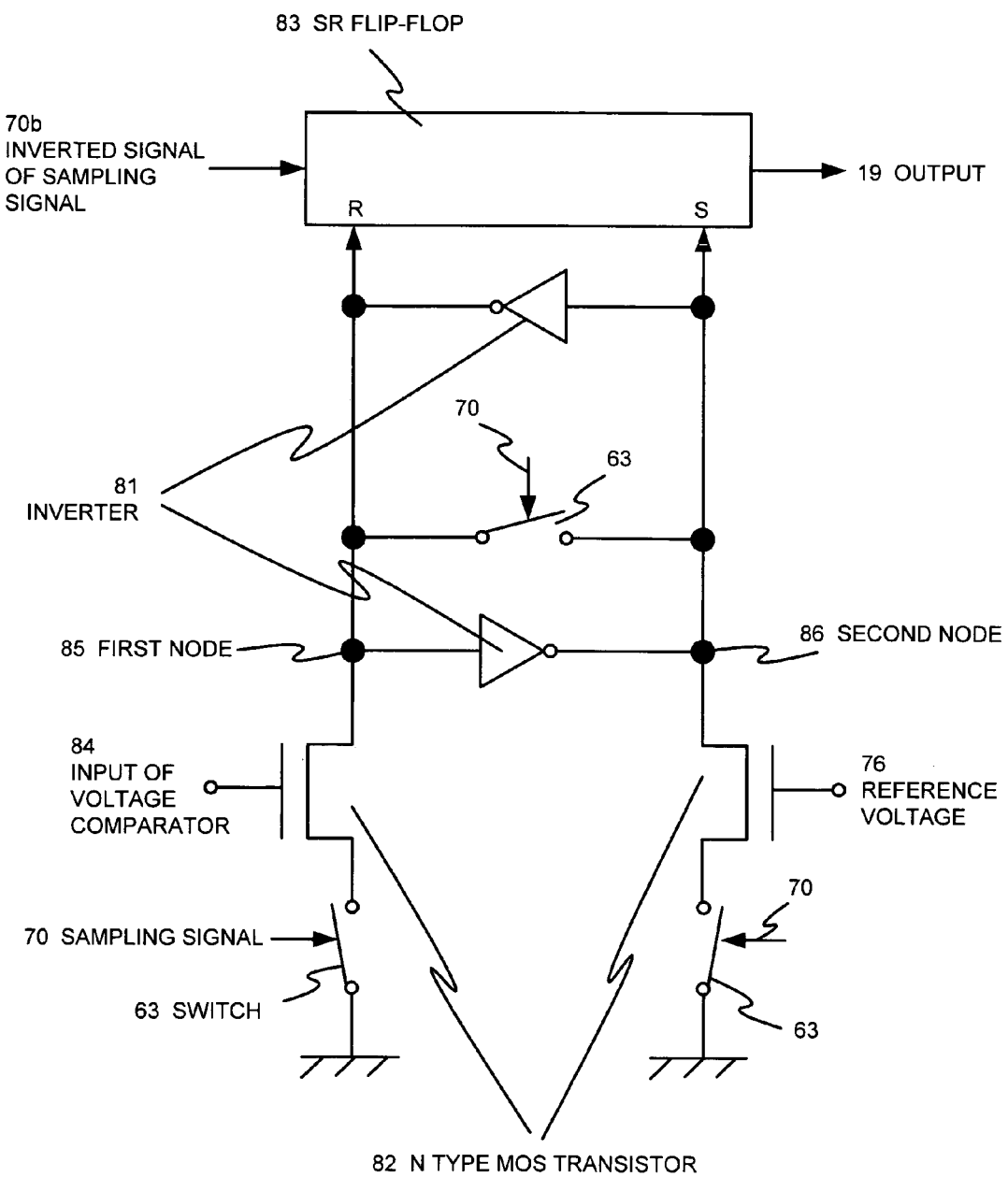
FIG. 27 is a circuit diagram of a voltage comparator of the present invention.

72 is a voltage comparator. A configuration of the voltage comparator 72 is shown in FIG. 27.

The voltage comparator 72 is configured of an inverter 81, a switch 63, an n-type MOS transistor 82, and a synchronous set/reset flip-flop (hereinafter, referred to as an SR flip-flop 83).

The switch 63 is switched on in a case where the sampling signal 70 is at a high level, and is switched off in a case where it is at a low level.

An inverted signal 70b of the sampling signal is input into the SR flip-flop 83. Output data of the SR flip-flop 83 is not changed in a case where the sampling signal 70 is at a high level, but the output data of the SR flip-flop 83 is changed in a case where it is at a low level.

An input 84 of the voltage comparator and the reference voltage 76 are connected to gate electrodes of two n-type MOS transistors 82 respectively.

Figure 28:
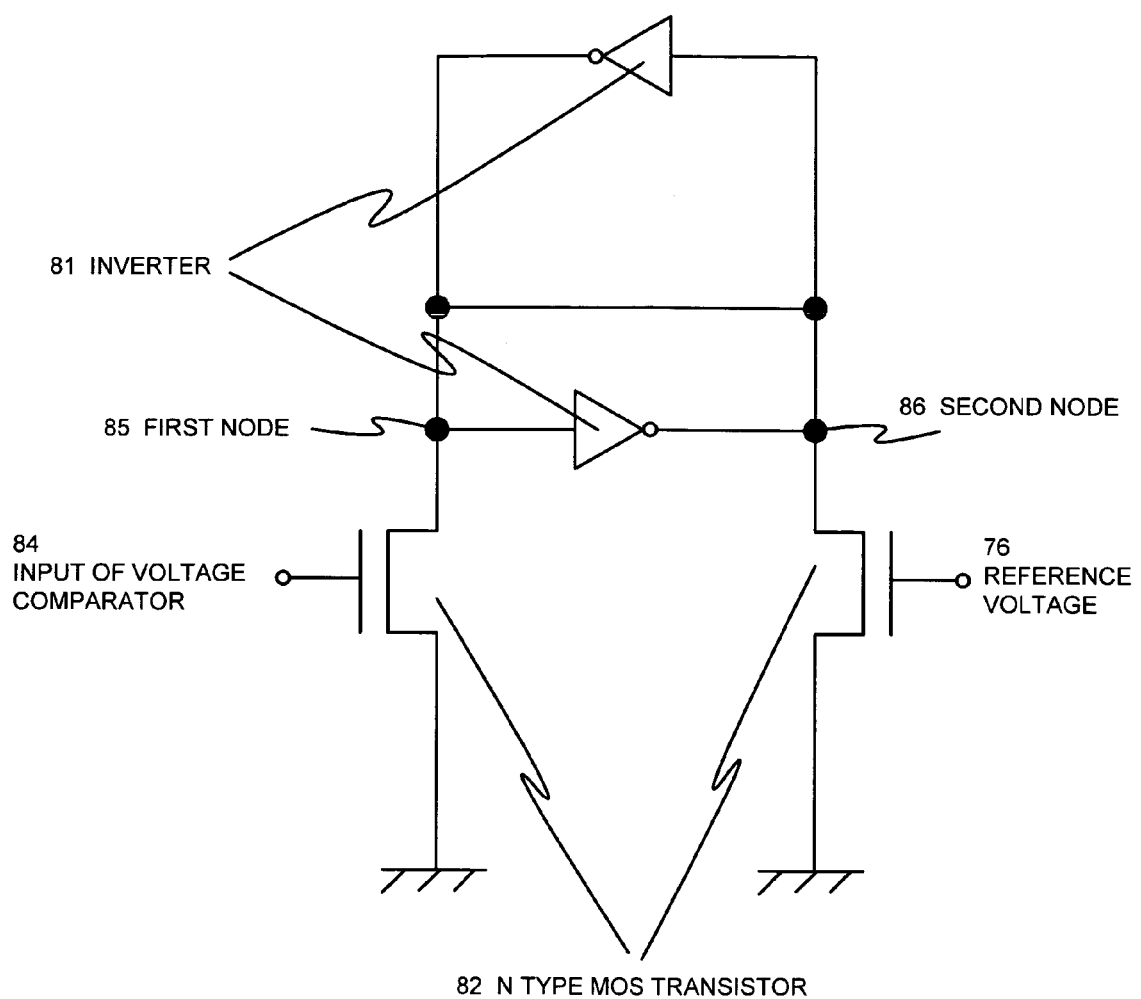
FIG. 28 is an explanatory view illustrating an operation of the voltage comparator in a case where a sampling signal is at a high level.

An operation of the voltage comparator 72 will be explained, by employing FIG. 28 and FIG. 29. FIG. 28 represents a case where the sampling signal 70 is at a high level, and FIG. 29 represents a case where the sampling signal 70 is at a low level.

In FIG. 28 that is a case where the sampling signal 70 is at a high level, the input and the output of the inverter 81 are in a short-circuited status. Accordingly, an electric potential between a first node 85 and a second node 86 is close to a threshold voltage of the inverter 81, and the inverter 81 is in an extremely sensitive state to a change of the first node 85 and the second node 86.

Herein, a case where the input 84 of the voltage comparator 72 is higher than the reference voltage 76 will be explained. In this case, the electric potential of the first node 85 becomes lower slightly than that of the second node 86 because the electric potentials of the first node 85 and the second node 86 are not completely identical, and the input 84 of the voltage comparator is higher than the reference voltage 76.

Figure 29:
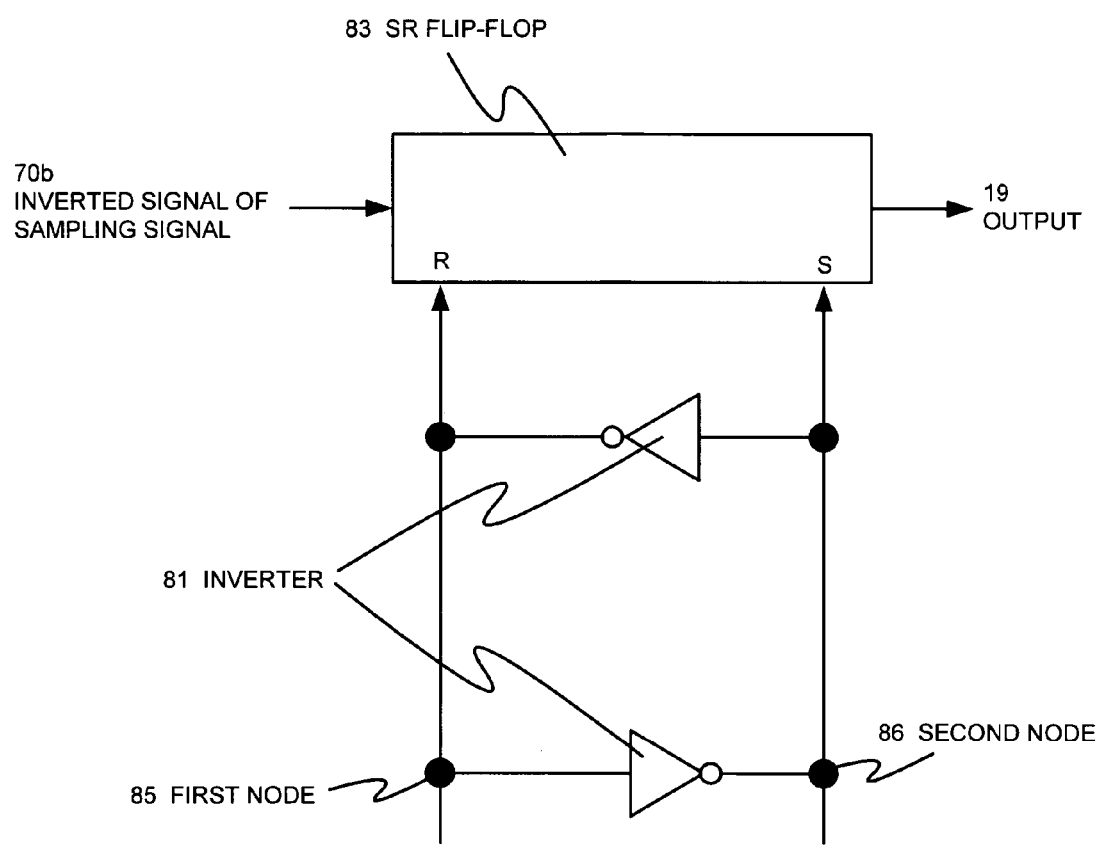
FIG. 29 is an explanatory view illustrating an operation of the voltage comparator in a case where a sampling signal is at a low level.

In FIG. 29 that is a case where the sampling signal 70 is at a low level, the input and the output of each inverter 81 are separated, and two inverters 81 are latched. Specifically, the electric potential of the first node 85 connected to the reset input of the SR flip-flop 83 is changed to a low-level one, and the electric potential of the second node 86 connected to the set input of the SR flip-flop 83 is changed to a high-level one. This causes the level of the output 19 of the SR flip-flop 83 to become high, which indicates that the input 84 of the voltage comparator is higher than the reference voltage 76. Conversely, in a case where the input 84 of the voltage comparator is lower than the reference voltage 76, the situation becomes opposite to the foregoing, that is, the level of the output 19 of the SR flip-flop 83 becomes low.

The voltage comparator 72 outputs the voltage value of the reference voltage having the high level that was output from the output 19.

The noise measurement circuit explained in this embodiment can be also provided with a peak value holding circuit 13, a digital low-pass filter 14, a selector 15, a serialization circuit 16, an analysis section, a memory circuit, a monitor section, or an adjustment circuit similarly to the foregoing jitter measurement circuit. Additionally, detailed explanation of configurations similar to the foregoing configuration is omitted, and a configuration that differs is explained.

At first, the analysis section will be explained.

In a case where the analysis section analyzes amplitude of the noise, it compares the maximum value and the minimum value to be output from the peak value holding circuit, thereby analyzing the amplitude of the noise.

In a case where the analysis section measures the maximum value and the minimum value of the noise amount, at first, it samples the output data from the serialization circuit 16. And, it compares the maximum value of the sampled measurement result with a basic value 0.68 V of the reference voltage, thereby analyzing the maximum value of the noise amount. Similarly, the analysis section compares the minimum value of the sampled measurement result with the basic value 0.68 V of the reference voltage, thereby analyzing the minimum value of the noise amount.

In a case where the analysis section analyzes the frequency component of the noise, the real-time oscilloscope 44 of the analysis section measures its all measurement results as digital data, and outputs its measurement data to the personal computer 45. Making a Fourier transform of the digital data on the personal computer 45 allows a frequency component 46 of the noise to be obtained.

Next, a method will be explained of reducing the noise based upon the analyzed noise.

Figure 30:
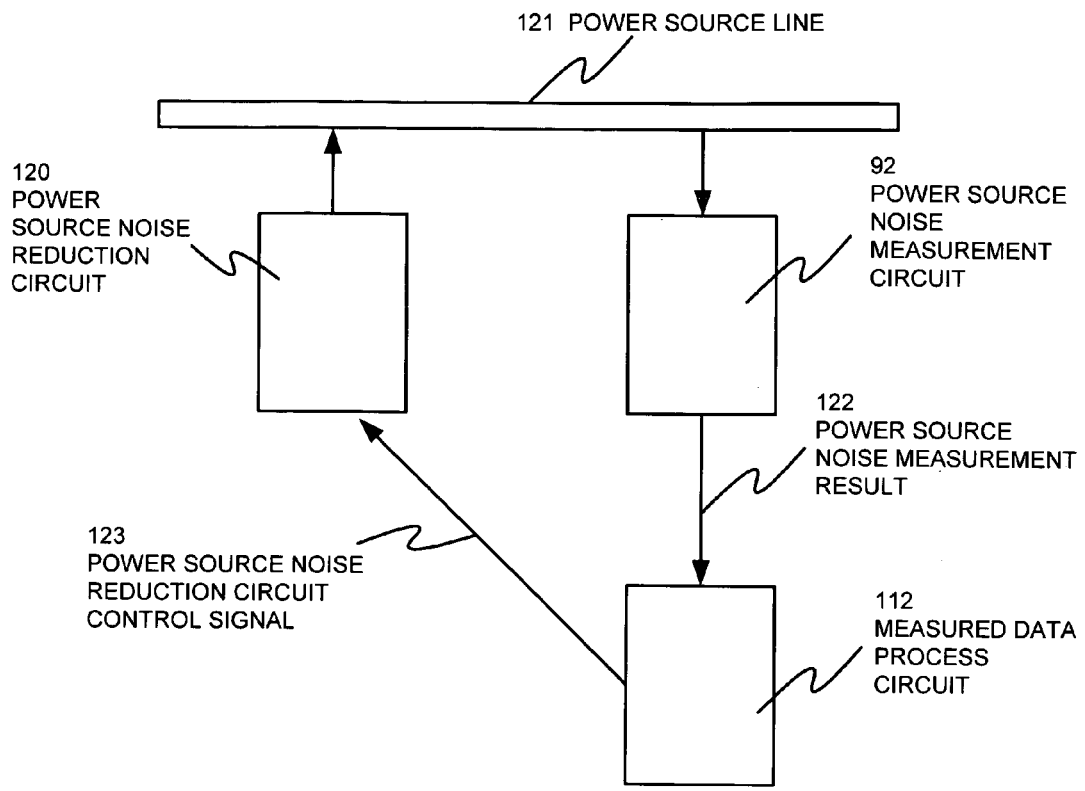
FIG. 30 is a conceptual view of the semiconductor integrated circuit apparatus in a case of reducing the noise in the present invention.

As shown in FIG. 30, the semiconductor integrated circuit apparatus is configured of a power source line 121, a power source noise measurement circuit 92, a power source noise reduction circuit 120, and a measured data process circuit 112. Additionally, this noise measurement circuit 120 includes the foregoing measurement circuit and analysis section.

Figure 31:
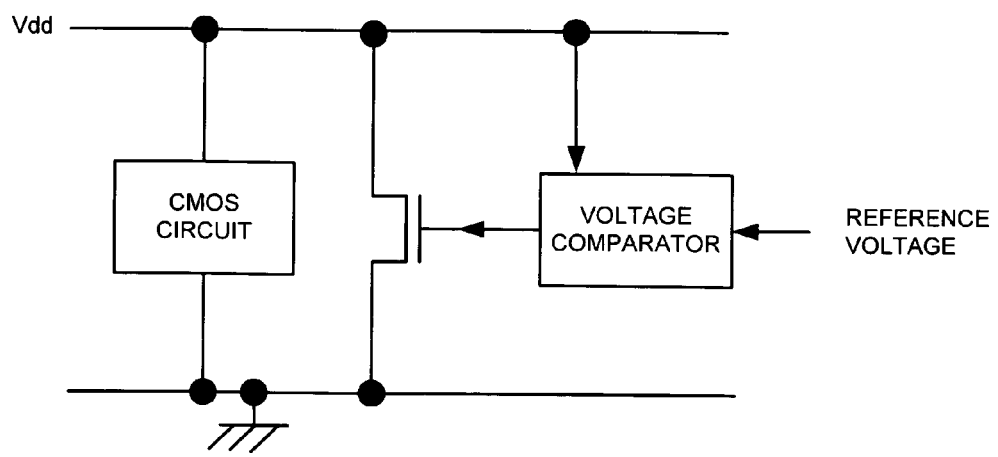
FIG. 31 is a block diagram of the adjustment circuit for reducing the noise in the present invention.

The power source noise measurement circuit 92 and the power source noise reduction circuit 120 are connected to the power source line 121. A power source noise measurement result 122 obtained in the power source noise measurement circuit 92 is input into the power source noise reduction circuit 120. The foregoing noise measurement circuit is employed as the power source noise measurement circuit 92 for explanation; however the noise measurement circuit having another configuration may be employed. As the power source noise reduction circuit 120 is used, for example, an NMOS transistor shown in FIG. 31.

The problem exists that when the power source noise reduction circuit 120 is caused to operate, the power source noise decreases; however the power consumption augments. Thereupon, the measured data process circuit 112 outputs a control signal 123 for causing the power source noise reduction circuit 120 to operate if the measured power source noise is larger than a desired value, and outputs a control signal 123 for causing the power source noise reduction circuit 120 to stop if the measured power source noise is smaller than a desired value. Changing on/off of the power source noise reduction circuit 120 dynamically in a loop of the power source noise measurement circuit 92, the power source noise reduction circuit 120, and the measured data process circuit 112 makes it possible to take a feedback control so that the power consumption by the power source noise reduction circuit 120 is minimized while the power source noise is suppressed to a desired value. As a result, minimizing a penalty of the power consumption by the power source noise reduction circuit 120 is made possible while the power source noise is suppressed to a desired value.

The foregoing voltage comparator 72 is excellent in being able to perform a comparative operation even in a high-speed operation condition, i.e., at 2.5 GHz. Thus, there are two reasons why the latch is fast. The first reason is that the latch is carried out at a high speed because the input nodes of the two inverters 81, to which the input 84 of the voltage comparator and the reference voltage 76 were already interrupted, do not receive an influence by a change in the input 84 of the voltage comparator and the reference voltage 76 during the interval from a comparison start up to the time that the two inverters 81 are latched to settle the comparison result. The second reason is that the latch is carried out at a high speed because a power supply to the two inverters 81 is made at any time without interruption.

Figure 32:
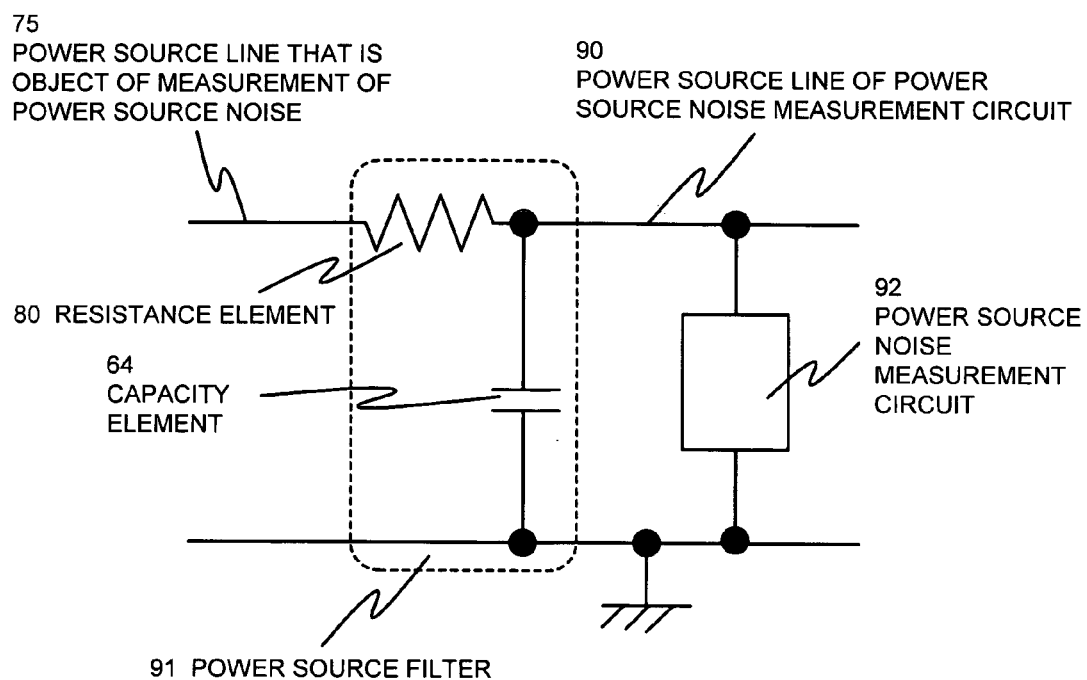
FIG. 32 is a block diagram of the adjustment circuit for reducing the noise in the present invention.

By the way, when the reference voltage 76 of the foregoing power source noise measurement circuit fluctuates due to the power source noise that is an object of measurement, validity of the measurement result of the power source noise is lost. For this, the power source noise of the measurement circuit itself has to be prevented. Thereupon, as shown in FIG. 32, a power source filter 91 is inserted between a power source line 90 of the measurement circuit and the power source line 75 that is an object of measurement of the power source noise. This makes it possible to prevent the power source noise that is an object of measurement from breaking into the power source line 90 of the measurement circuit, and to stabilize the power source electric-potential of the measurement circuit 92.

Specifically, the power source filter 91, which is configured of a resistance element 80 between the power source line 90 of the power source noise measurement circuit and the power source line of the circuit that is an object of measurement of the power source noise, and a capacity element 64 between the power source line 90 of the power source noise measurement circuit and the grounding conductor, has a function of the low-pass filter. The values of the resistance element 80 and the capacity element 64 configuring the low-pass filter are set so that the cut-off frequency of the low-pass filter becomes ten times less than the clock frequency or less of the circuit that is an object of measurement of the power source noise.

Employing the foregoing power source filter 91 eliminates a necessity for the dedicated power source supply to the measurement circuit 92, which enables the cost to become low.

Embodiment 7

Next, a seventh embodiment in the present invention will be explained, by employing FIG. 33. A noise measurement circuit having a different configuration from that of the foregoing sixth embodiment will be explained in the seventh embodiment. Additionally, identical codes are affixed to components similar to that of the sixth embodiment, and detailed explanation thereof is omitted.

Figure 33:
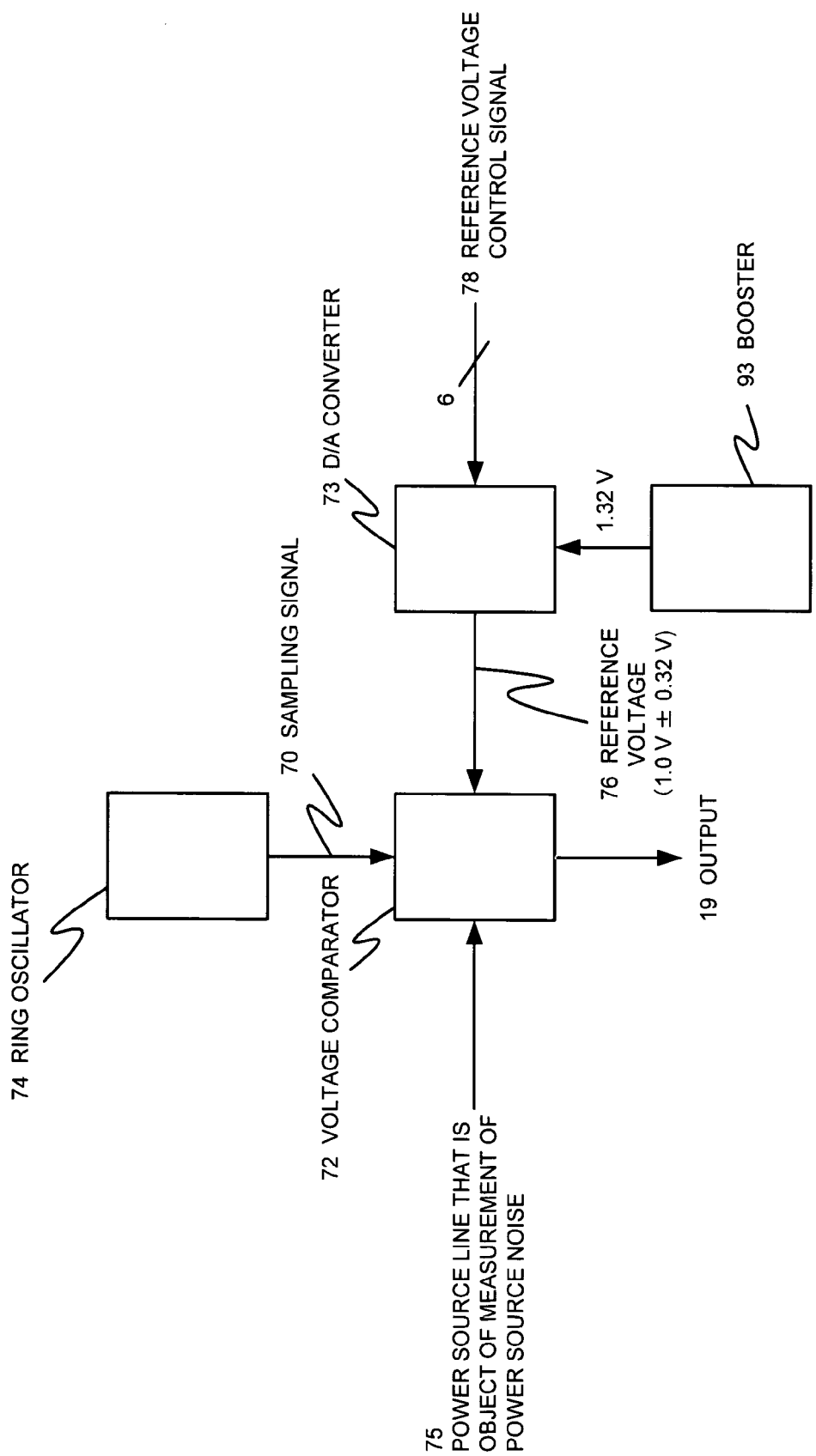
FIG. 33 is a block diagram illustrating a seventh embodiment of the present invention.

As shown in FIG. 33, the power source noise measurement circuit in this embodiment is configured of a voltage comparator 72, a D/A converter 73, a ring oscillator 74, and a booster 93. A difference with the foregoing sixth embodiment lies in that the high-pass filter 71 was deleted to add the booster 93. The advantage of the seventh embodiment lies in that this allows not only the amplitude of the power source noise but also the direct current component to be measured.

The booster 93 generates a voltage of 1.32 V higher than the power source voltage 1.0 V, and outputs it to the D/A converter 73. The D/A converter 73 outputs the reference voltages 76 partitioned 10 mV by 10 mV in a range of 1.0 V±0.32 V. The voltage comparator 72 makes a size comparison between the voltage of the power source line 75 that is an object of measurement of the power source noise and the reference voltage 76, thereby allowing information as to whether the power source noise exceeded the reference voltage 76 to be output. The voltage comparator 72 outputs the comparison result.

Embodiment 8

An eighth embodiment of the present invention will be explained, by employing FIG. 34.

A noise measurement circuit having a different configuration from that of the foregoing sixth and seventh embodiments will be explained in the eighth embodiment. Additionally, identical codes are affixed to components similar to that of the sixth and seventh embodiments, and detailed explanation thereof is omitted.

Figure 34:
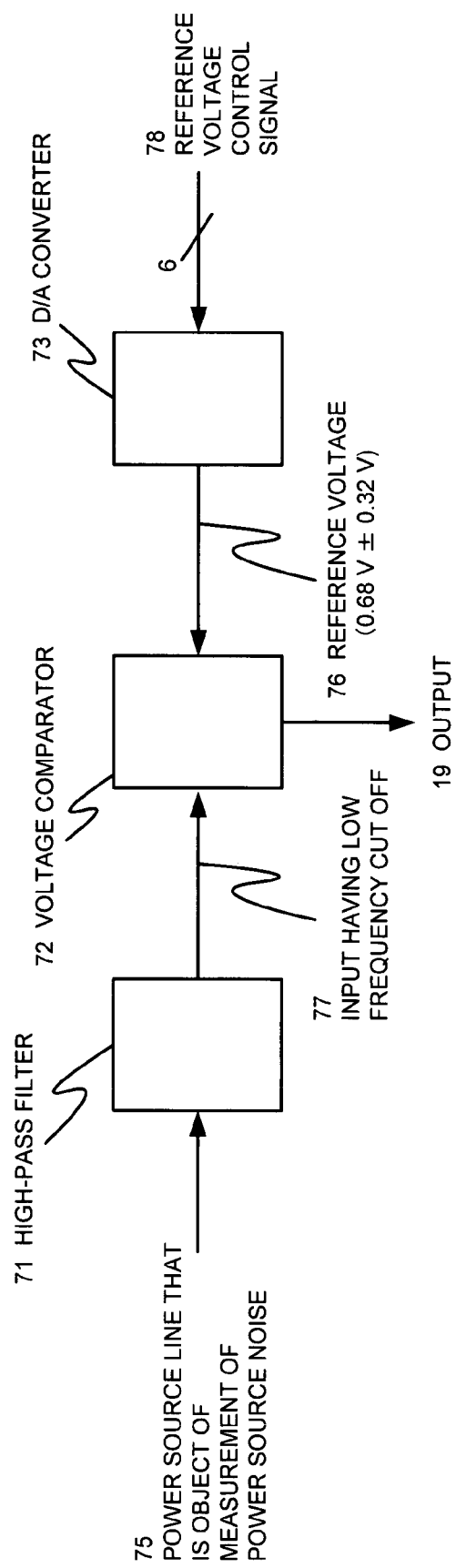
FIG. 34 is a block diagram illustrating an eighth embodiment of the present invention.

As shown in FIG. 34, the noise measurement circuit is configured of a high-pass filter 71, a voltage comparator 72, and a D/A converter 73. A difference with the foregoing sixth embodiment lies in that the ring oscillator 74 was deleted to employ the voltage comparator 72 requiring no sampling signal.

The advantage of this embodiment lies in that this allows not only the periodical power source noise but also the noise that occurs only once to be measured. But, in this embodiment, information as to whether the power source noise exceeded the reference voltage 76 can be output; however the power source noise waveform is impossible to measure.

Embodiment 9

A ninth embodiment of the present invention will be explained, by employing FIG. 35.

A noise measurement circuit having a different configuration from that of the foregoing eighth embodiment will be explained in the ninth embodiment. Additionally, identical codes are affixed to components similar to that of the eighth embodiment, and detailed explanation thereof is omitted.

Figure 35:
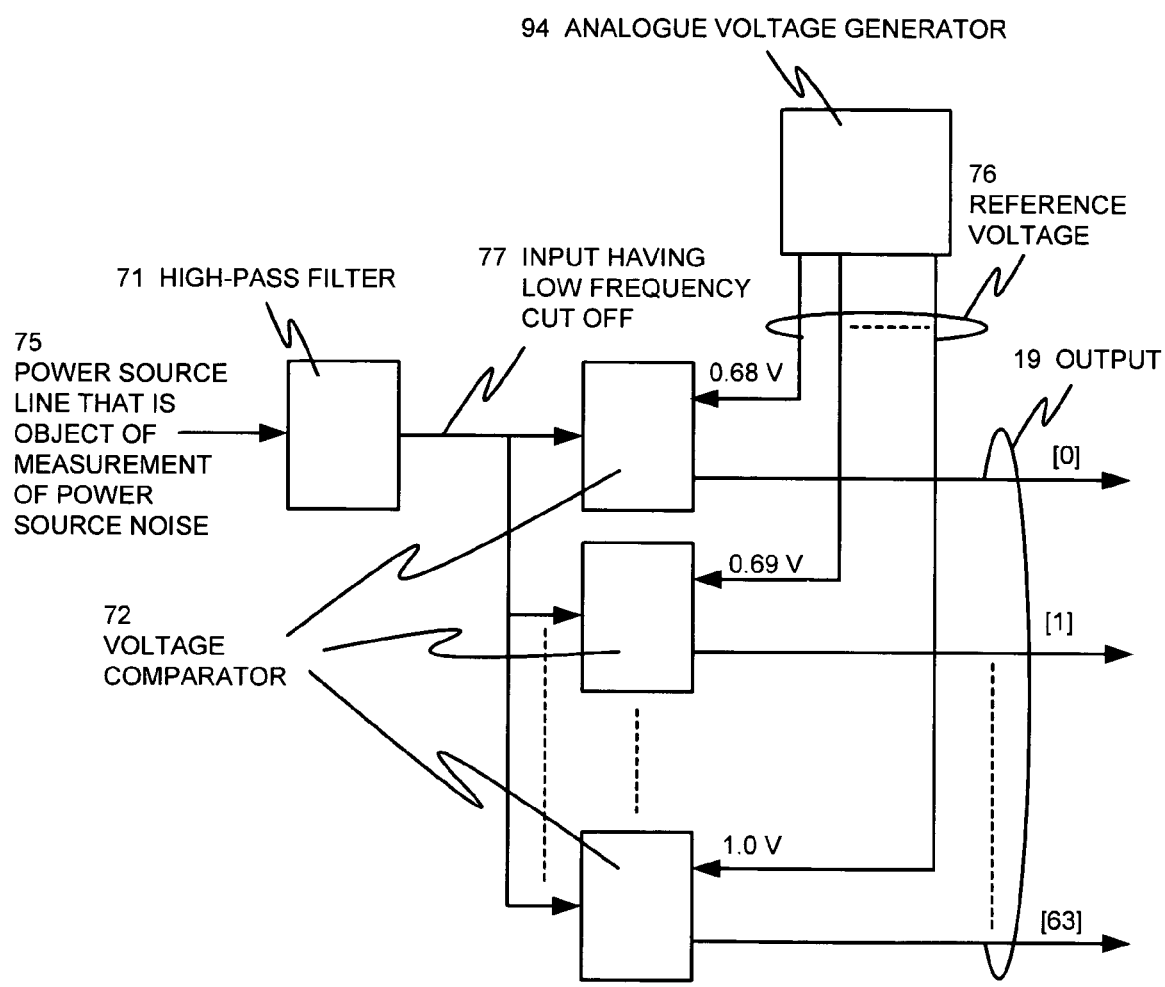
FIG. 35 is a block diagram illustrating a ninth embodiment of the present invention.

As shown in FIG. 35, the power source noise measurement circuit in the ninth embodiment is configured of a high-pass filter 71, 64 voltage comparators 72, and an analogue voltage generator 94. A difference with the foregoing eighth embodiment lies in making the number of the voltage comparator 72 and the output plural, and in replacing the D/A converter with the analogue voltage generator 94. The advantage of this embodiment lies in that the power source noise waveform can be measured in a real time basis.

The analogue voltage generator 94 outputs 64 reference voltages 76 each of which differs by 10 mV from the other in a range of 0.68 V±0.32 V. The reference voltages 76 each of which differs by 10 mV from the other are input into 64 voltage comparators 72 respectively. A size comparison result between the voltage of the power source line 75 that is an object of measurement of the power source noise and the reference voltage 76 in the voltage comparator 72 is output as 64-bit digital data.

Figure 36:
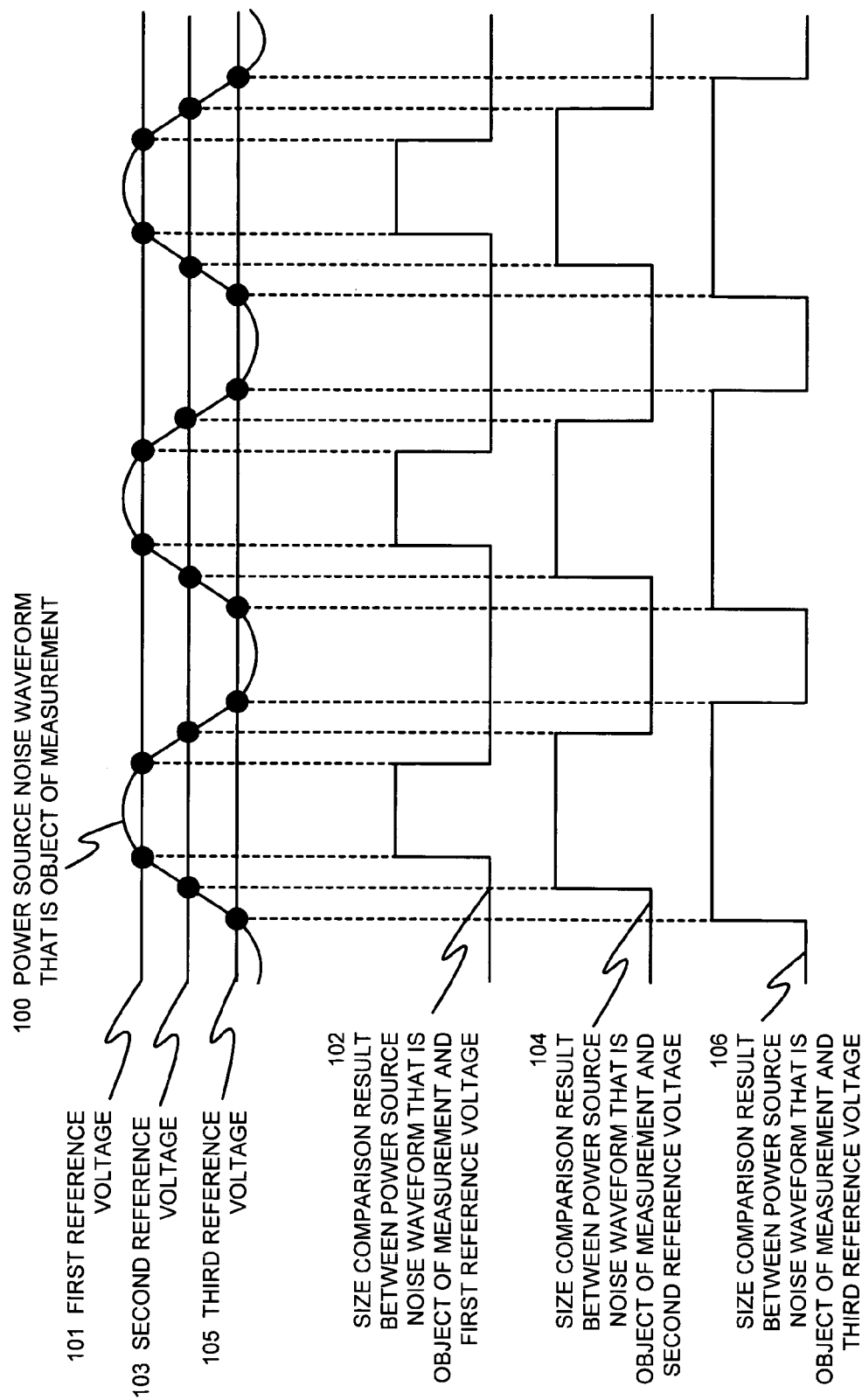
FIG. 36 is an explanatory view illustrating an operation of the ninth embodiment of the present invention.

Herein, a method will be explained of measuring the power source noise waveform in a real time basis, by employing FIG. 36.

A size comparison result 102 between a power source noise waveform 100 that is an object of measurement and a first reference voltage 101 makes it possible to know the time when the power source noise became identical to the first reference voltage 101. Similarly, a size comparison result 104 between the power source noise waveform 100 that is an object of measurement and a second reference voltage 103 makes it possible to know the time when the power source noise became identical to the second reference voltage 103. Also, a size comparison result 106 between the power source noise waveform 100 that is an object of measurement and a third reference voltage 105 makes it possible to know the time when the power source noise became identical to the third reference voltage 105.

In such a manner, in this embodiment, piling up all comparison results of 64 reference voltages 76, each of which differs by 10 mV from the other in a range of 0.68 V±0.32 V, makes it possible to measure the power source noise waveform at a resolution of 10 mV in a real time basis.

Additionally, a case of measuring the noise waveform in a real time basis was described in this embodiment; however the priority encoder may be provided to output only the position of the most significant bit having the high-level noise waveform output like the foregoing first embodiment.

Embodiment 10

A case will be explained of measuring stress of the chip in this embodiment.

Figure 37:
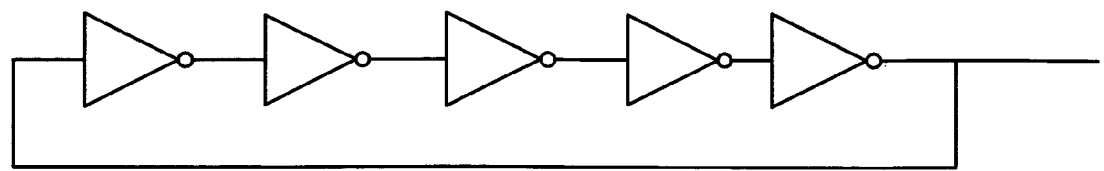
FIG. 37 is a block diagram illustrating a tenth embodiment of the present invention.

FIG. 37 is a block diagram of the measurement circuit in this embodiment.

As shown in FIG. 37, the measurement circuit is a ring oscillator circuit that is comprised of the inverters of which the stage number is odd.

Figure 38:
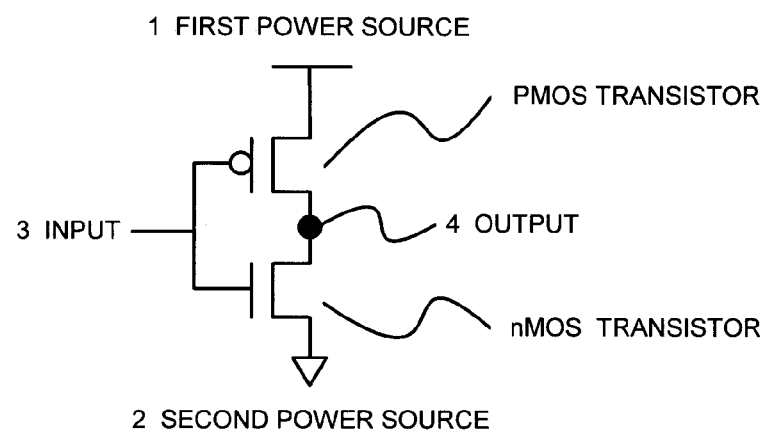
FIG. 38 is a view of an inverter circuit.

FIG. 38 is a block diagram of an inverter circuit.

Figure 39:
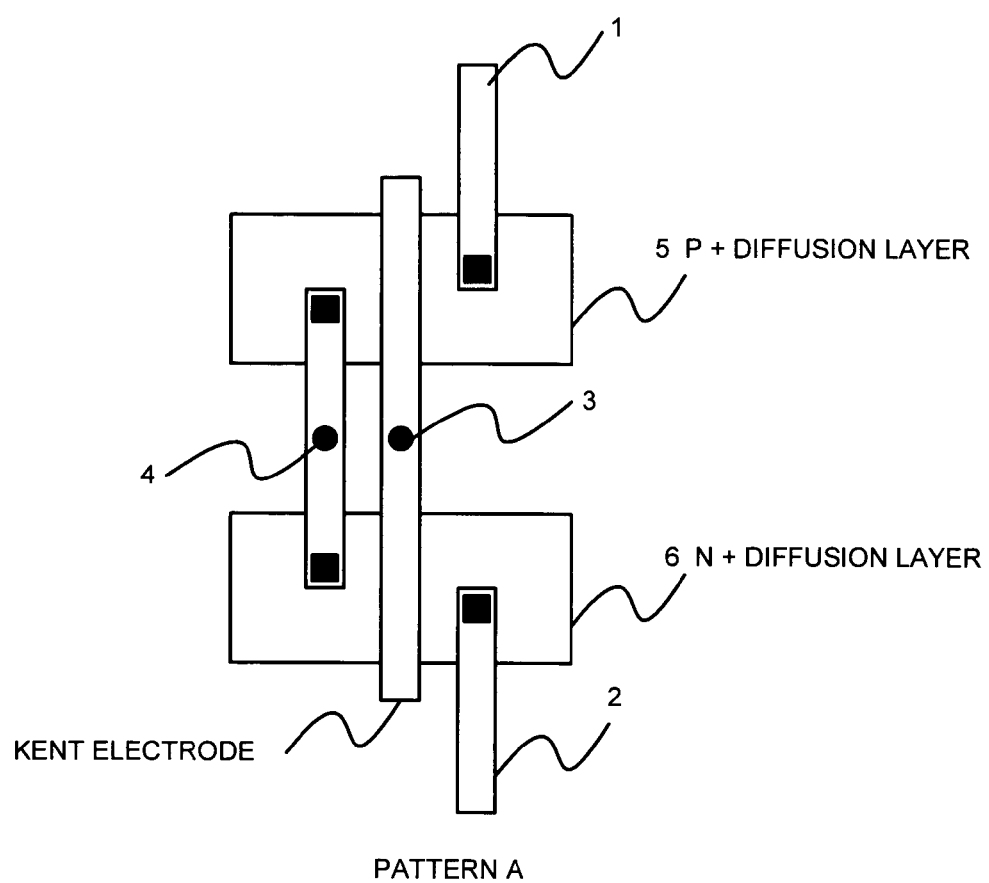
FIG. 39 shows a layout pattern A of the inverter circuit.
Figure 40:
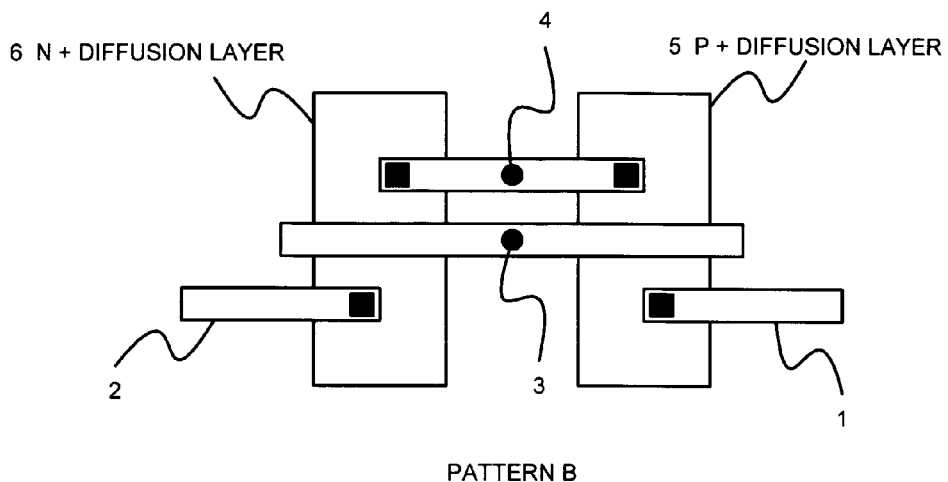
FIG. 40 shows a layout pattern B of the inverter circuit.

As shown in FIG. 38, the inverter circuit is a CMOS inverter circuit. Examples of a layout pattern A and a layout pattern B of this CMOS inverter circuit are shown in FIG. 39 and FIG. 40 respectively. The layout pattern B is a layout pattern obtained by rotating the layout pattern A by 90° clockwise.

Figure 41:
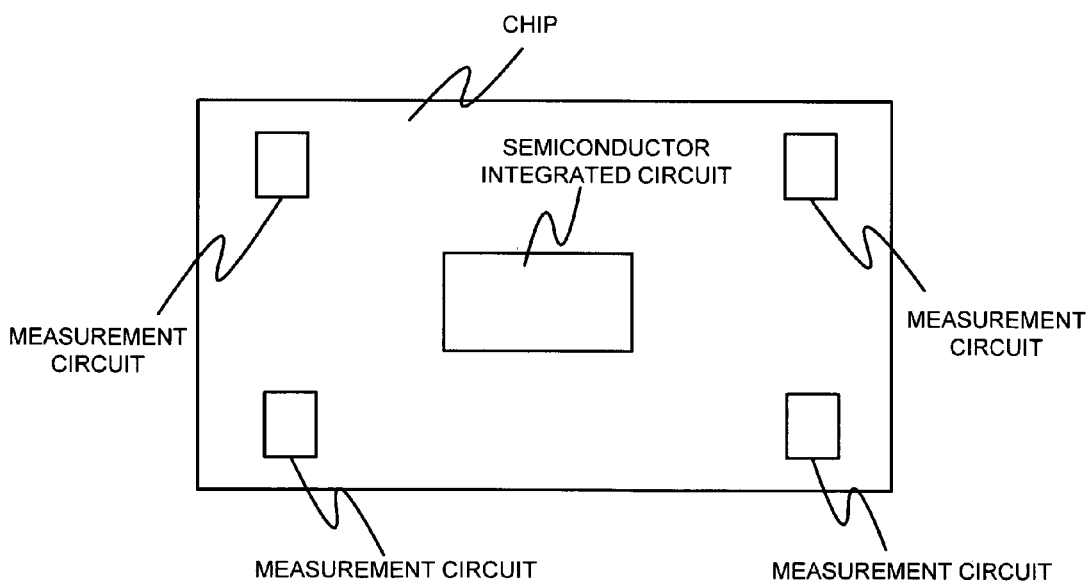
FIG. 41 shows an installation example of the measurement circuit.

The measurement circuit having the layout pattern of FIG. 39 and the measurement circuit having the layout pattern of FIG. 40 are mounted in plural on an identical chip to that of the semiconductor integrated circuit that is an object of measurement as shown in FIG. 41. Additionally, a configuration is more favorable in which a plurality of sets, each of which has one measurement circuit having the layout pattern of FIG. 39 and one measurement circuit having the layout pattern of FIG. 40, are mounted on the chip.

Figure 42:
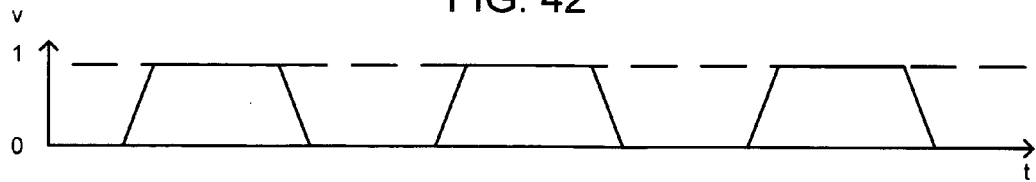
FIG. 42 shows an example of an output signal.

A signal in which the high level and the low level are repeated as shown in FIG. 42 is output from the measurement circuit configured in such a manner. Normally, in a case where no stress exists on the chip, the output signal of each measurement circuit ought to coincide with that of the other. Accordingly, measuring the output signal of each measurement circuit allows the stress to be measured.

The measurement circuit explained in this embodiment can be also provided with an analysis section, a memory circuit, a monitor section, or an adjustment circuit similarly to the foregoing measurements circuit. Additionally, detailed explanation of configurations similar to the foregoing configuration is omitted, and a configuration that differs is explained.

At first, the analysis section will be explained.

The analysis section measures the number of times by which the high level and the low level of the output signal sent out from each measurement circuit are repeated for a unit time, i.e. the frequency. And, it measures a frequency difference between the output signal from each measurement circuit and the output signal from the other, and analyzes the stress of the chip.

Continuously, the monitor section will be explained.

The monitor section judges that the chip was stressed abnormally when a frequency difference between the output signal from each measurement circuit analyzed in the analysis section and the output signal from the other exceeded a threshold, and sends a malfunctional signal out to the MPU on the identical chip.

Embodiment 11

A measurement circuit for measuring a temperature of the chip having the semiconductor integrated circuit mounted will be explained in this embodiment. Additionally, the measurement circuit of this embodiment employs the foregoing ring oscillator, so identical codes are affixed to the similar configuration, and detailed explanation thereof is omitted. Additionally, in a case of measuring the temperature of the chip, as to the layout pattern of the inverter circuit, either pattern may be employed.

The measurement circuit outputs a signal in which the high level and the low level are repeated as shown in FIG. 42. Measuring the frequency of this output signal allows the temperature of a transistor (element) to be known. This reason is that when the frequency falls below a certain threshold, it can be recognized that a delay occurred in repetition of the high level and the low level of the output signal because the temperature of the transistor (element) becomes high.

The measurement circuit explained in this embodiment can be also provided with an analysis section, a memory circuit, a monitor section, or an adjustment circuit similarly to the foregoing measurements circuit. Detailed explanation of configurations similar to the foregoing configuration is omitted, and a configuration that differs is explained.

The analysis section measures the frequency from the output signal sent out from the measurement circuit. When this frequency falls below a certain threshold, the monitor section recognizes that the delay occurred in the repetition of the high level and the low level of the output signal, and sends the malfunctional signal out to the MPU on the identical chip because the temperature of the transistor (element) becomes high. The MPU that received the malfunctional signal sends warning information out.

Also, the analysis section compares the frequency of each measurement circuit with that of the other respectively, and analyzes dispersion of performance of the transistor (element).

Embodiment 12

A configuration of measuring a leakage current of the semiconductor integrated circuit will be explained in this embodiment.

Leakage current measurement circuits are mounted in plural on the chip as shown in FIG. 41.

Figure 43:
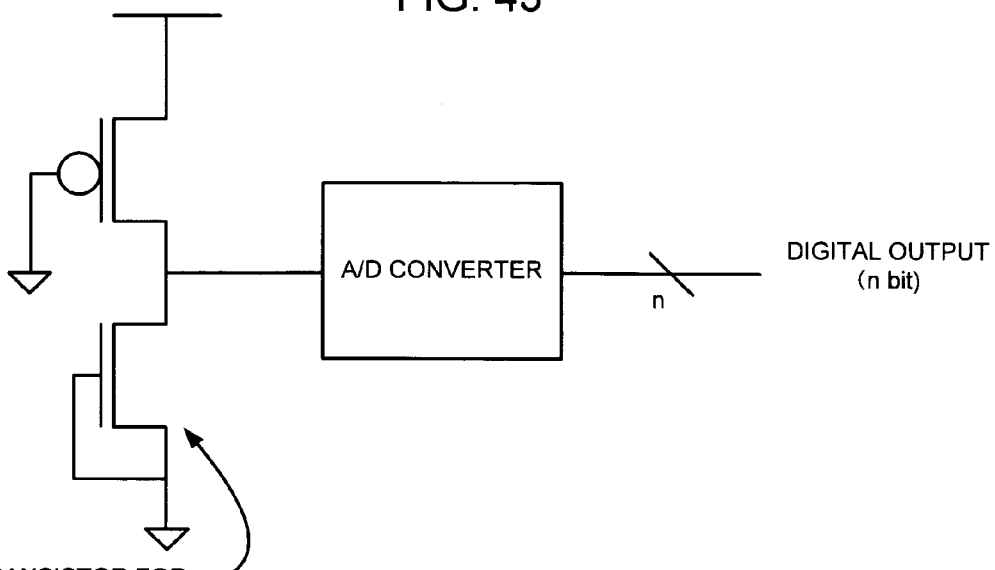
FIG. 43 is a block diagram illustrating a twelfth embodiment of the present invention.

FIG. 43 is a block diagram of the leakage current measurement circuit.

A transistor 421 is for monitoring the leakage current. When the leakage current is caused to flow in this transistor 421, the current value of its leakage current is reflected in Imoni. The A/D converter converts the current value of Imoni into a digital value, and outputs it as a measured leakage current value.

The measurement circuit explained in this embodiment can be also provided with an analysis section, a memory circuit, a monitor section, or an adjustment circuit similarly to the foregoing measurements circuit. Detailed explanation of configurations similar to the foregoing configuration is omitted, and a configuration that differs is explained.

At first, the analysis section will be explained. The analysis section analyzes the leakage current value that is a measurement result of a plurality of the measurement circuits, and makes an analysis as to which element of the semiconductor integrated circuit or thereabouts has the leakage current produced.

Continuously, the monitor section will be explained.

The monitor section judges that abnormality occurred in the chip when the leakage current value exceeded a threshold, and sends the malfunctional signal out to the MPU on the identical chip.

Embodiment 13

As a rule, current consumption of LSI changes at all times responding to an operational pattern of the LSI. Accordingly, the power source noise and the jitter of the clock signal also change at all times responding to the operational pattern of the LSI. For this, there is a case where an LSI operational fault occurs only when the LSI executed a certain specific operation. Thereupon, inevitability exists for clarifying a correlation between the operational pattern of the LSI and the noise or the jitter by making an actual measurement thereof. A thirteenth embodiment of the present invention enabling this will be explained, by employing FIG. 44.

Figure 44:
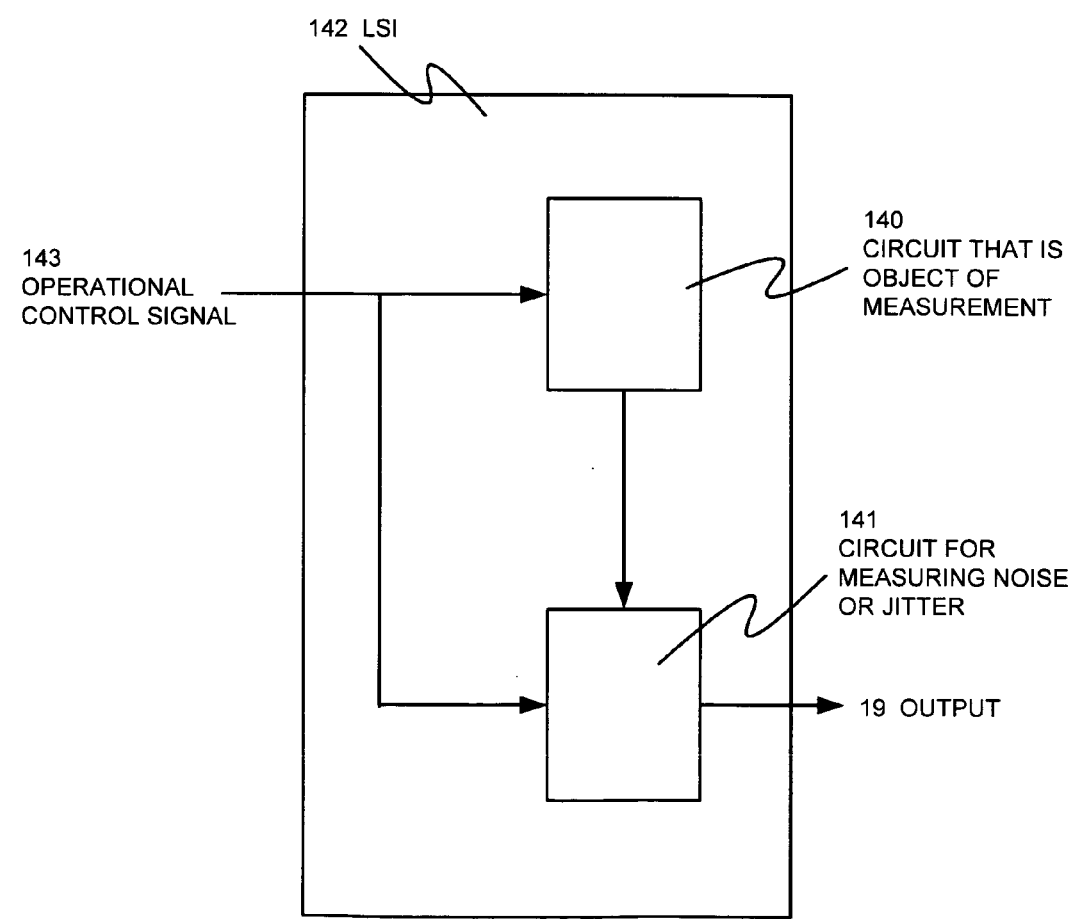
FIG. 44 is a block diagram illustrating a thirteenth embodiment of the present invention.

As shown in FIG. 44, a circuit 140 and a circuit 141 that are an object of measurement are mounted on an identical chip of an identical LSI 142. Additionally, one of the foregoing measurement circuits is employed for the measurement circuit 141.

An operational control signal 143 for indicating a start of the operation of the circuit 140 that is an object of measurement is input into the measurement circuit 141 as well. This makes it possible to measure the physical amount that exerts an influence upon the circuit 140 that is an object of measurement in a certain specific operational interval of the circuit 140 that is an object of measurement.

Additionally, a configuration may be made to input this operational control signal 143 into the memory circuit as well. In this case, a configuration is made to affix operation identification information for uniquely identifying the operation operational control signal by operational control signal, and to store it correspondingly to the measurement result.

Embodiment 14

A measurement result management system for managing the measurement result measured by the foregoing measurement circuit will be explained in this embodiment.

Figure 45:
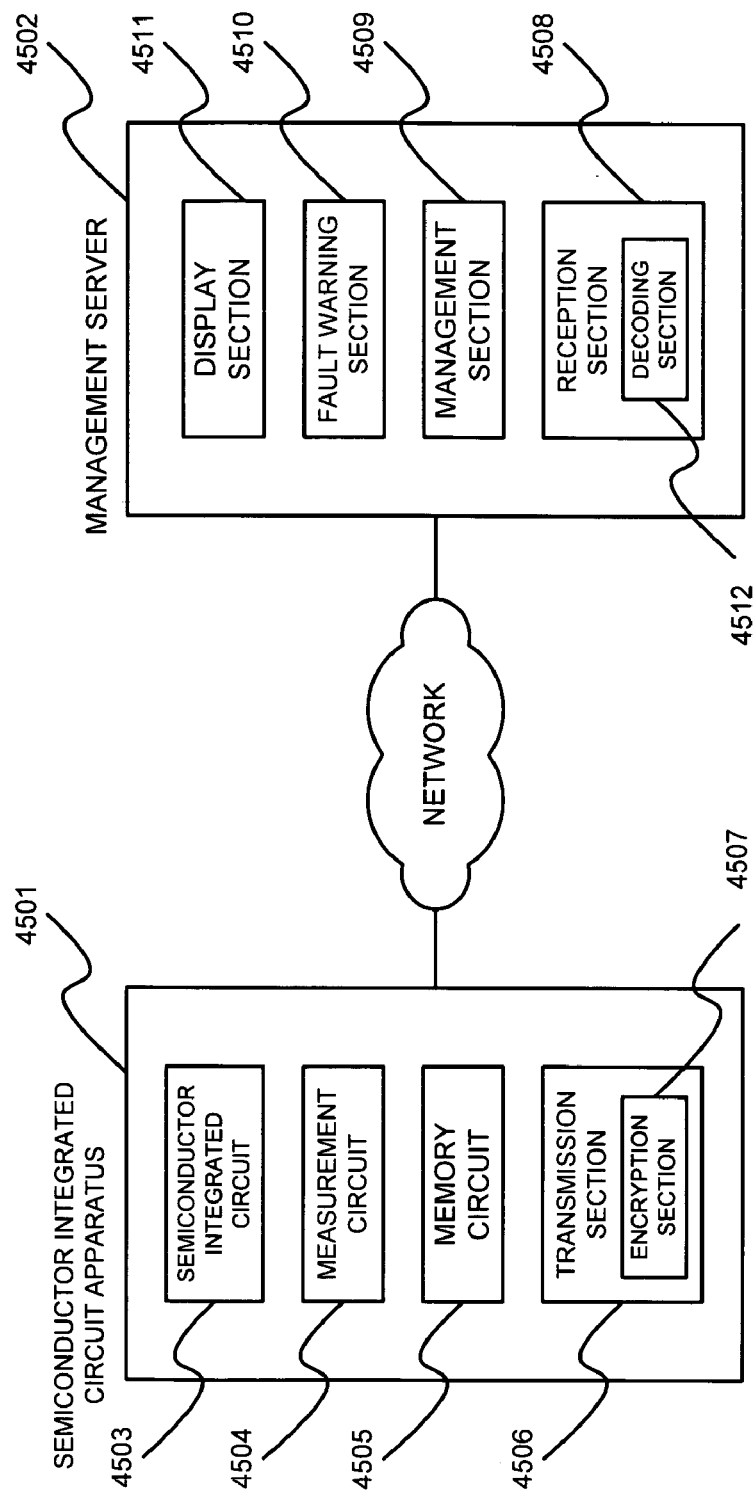
FIG. 45 is a block diagram illustrating a fourteenth embodiment of the present invention.

FIG. 45 is a conceptual view of the measurement result management system of the present invention.

The measurement result management system is configured of a semiconductor integrated circuit apparatus 4501 and a management server 4502.

The semiconductor integrated circuit apparatus 4501 is an apparatus mounted on an end-user such as a customer. Also, the semiconductor integrated circuit apparatus 4501 has a semiconductor integrated circuit 4503, a measurement circuit 4504, a memory circuit 4505, and a transmission section 4506.

The measurement circuit 4504 was configured on the identical chip to that of the semiconductor integrated circuit 4503. Also, the measurement circuit 4504 measures various physical amounts such as the jitter of the signal in the semiconductor integrated circuit 4503 that is actually operating, the swing of the power source (noise), the temperature, the power (the leakage current, an ON-state current, etc.), the dispersion of the device performance, and the stress of the chip. Additionally, not only the measurement operation of the measurement circuit 4504 may be performed at any time while the power source is applied to the chip, but also it may be performed intermittently, for example, once per one minute, and it is not limited hereto.

The memory circuit 4505 accumulates the measurement result from the measurement circuit 4504. Further, the memory circuit 4505 stores identification information for uniquely identifying the semiconductor integrated circuit 4503. Additionally, the memory circuit 4505 may be configured not only on the identical chip to that of the semiconductor integrated circuit 4503, but also outside the chip.

The transmission section 4506 is for transmitting data accumulated in the memory circuit 4505 and identification information for uniquely identifying the above semiconductor integrated circuit 4503 to the management server 4502. Additionally, not only the transmission section 4506 may be configured so that it causes the memory circuit 4505 to accumulate a predetermined amount thereof, and transmit it predetermined amount by predetermined amount, but also it may be configured to transmit the data accumulated in the memory circuit 4505 at a predetermined time, and also it is acceptable that it is configured to transmit it at the moment that a measured data transmission request was received from the management server 4502.

Further, the transmission section 4506 may be configured to have an encryption section 4507. In this case, after the transmission section 4506 encrypted the data accumulated in the memory circuit 4505 and the identification information for uniquely identifying the above semiconductor integrated circuit 4501 in the encryption section 4507, it transmits them. There are many methods of encryption; however the details thereof are omitted because they are known. Anyone may be employed in the present invention.

The management server 4502 is a server mounted on a management company for managing the semiconductor integrated circuit apparatus 4501. Also, the management server 4502 has a reception section 4508, a management section 4509, a fault warning section 4510, and a display section 4511.

The reception section 4508 receives the measurement result to be transmitted from the semiconductor integrated circuit apparatus 4501, and the identification information for uniquely identifying the above semiconductor integrated circuit 4503. Additionally, in a case where the encryption section 4507 is configured in the transmission section 4506 of the semiconductor integrated circuit apparatus 4501, and the measurement result and the identification information for uniquely identifying the above semiconductor integrated circuit 4503 are encrypted and transmitted, a decoding section 4512 is provided in the reception section 4508, and the encrypted and transmitted measured result and identification information are decoded.

The management section 4509 manages the measurement result, which the reception section 4508 received, identification information by identification information.

The fault warning section 4510 is for making a fault prediction from a performance fluctuation and a change with time of the semiconductor integrated circuit 4503 based upon the measurement result, which the management section 4509 is managing, to send warning information out.

The display section 4511 is for displaying the warning information from the fault warning section 4510.

An operation in this embodiment will be explained. Additionally, as one example, the measurement circuit 4504 for measuring the jitter of the semiconductor integrated circuit 4503 that is an object of measurement is employed for explanation. Also, a case will be explained where the memory circuit 4504 is caused to accumulate the measurement result by a predetermined amount, which is transmitted predetermined amount by predetermined amount.

The measurement circuit 4504 measures each temperature of the chip having the semiconductor integrated circuit 4503 mounted, which is actually operating. This measurement result is accumulated in the memory circuit 4505. When the measurement result is accumulated by a predetermined amount in the memory circuit 4505, the transmission section transmits the measurement result accumulated in the memory circuit 4505 to the management server 4502 together with the identification information.

The transmitted measurement result is received in the reception section 4508 of the management server 4502. The management section 4509 manages the measurement result identification information by identification information, based upon the received identification information.

When the fault warning section 4510 detects the measurement result exceeding a predetermined value from among the measurement results that the management section 4509 is managing, or detects that a difference between continuous two measured values exceeded a predetermined value, it judges that abnormality has occurred in the semiconductor integrated circuit apparatus 4501, and sends the warning information out. The display section 4511 displays the warning information from the fault warning section.

Additionally, the foregoing semiconductor integrated circuit apparatus was explained by employing a configuration having the memory circuit; however a configuration having only the measurement circuit is also acceptable. In this case, the transmission section is configured to transmit the measurement result whenever the measurement circuit makes a measurement.

Also, the foregoing semiconductor integrated circuit apparatus may be configured to have the analysis section. In this case, the transmission section is configured to transmit the analysis result that the analysis section analyzed.

Further, the case was explained where one measurement circuit was mounted on the semiconductor integrated circuit apparatus in the foregoing embodiment; however a plurality thereof may be mounted. In this case, the memory circuit is configured to correspondingly store the measurement circuit identification information for uniquely identifying the measurement circuit, and the measurement result of the above measurement circuit.

Further, the case was explained where the memory circuit was mounted on the identical chip to that of the semiconductor integrated circuit in the foregoing embodiment; however it may be mounted outside the chip. In this case, the memory circuit is configured to correspondingly store the identification information for uniquely identifying the above semiconductor integrated circuit, and each of the measurement results from a plurality of the chips.

Further, a configuration may be made so as to encrypt the measurement result that the foregoing transmission section transmits. In this case, a configuration is made so that the encryption circuit is mounted prior to the transmission section, and the transmission section transmits the measurement result that this encryption circuit encrypted.

Additionally, it is apparent that the invention is not intended to be limited to each of the above-mentioned embodiments, and various modifications may be made appropriately within the scope of the technical spirit of the present invention.

The foregoing present invention is applicable for the semiconductor integrated circuit that requires that the physical amount, which exerts an influence upon the operation of the semiconductor integrated circuit, such as the noise or the jitter be measured.

Also, the foregoing present invention is applicable for the semiconductor integrated circuit that requires that the physical amount, which exerts an influence upon the operation of the semiconductor integrated circuit, such as the noise or the jitter be reduced after manufacturing the LSI.

Further, the foregoing present invention is applicable for the integrated circuit that requires that the physical amount, which exerts an influence upon the operation of the semiconductor integrated circuit, such as the noise or the jitter be reduced by modifying anyone of the board, the package, the power source system of the LSI.

In accordance with the present invention, mounting the various measurement circuits for measuring the physical amount, which exerts an influence upon the actual operation of the semiconductor integrated circuit, such as the noise or the jitter on the identical chip to that of the semiconductor integrated circuit that is an object of measurement makes it possible to measure the physical amount, which exerts an influence upon the actual operation of the semiconductor integrated circuit, such as the noise or the jitter in the actual operation.

Also, feeding the obtained measurement result back to the circuit for adjusting the semiconductor integrated circuit that is an object of measurement makes it possible to reduce the physical amount, which exerts an influence upon the actual operation of the semiconductor integrated circuit, such as the noise or the jitter even after manufacturing the semiconductor integrated circuit.

Further, converting the time-series measurement result into a frequency domain to make an analysis with the frequency domain allows which portion of the power source system of the board, the package,. and the LSI should be modified to be known clearly, which makes it possible to efficiently find the countermeasure for reducing the noise or the jitter.

Further, the various factors that exert an influence upon the operation of the semiconductor integrated circuit that is really working (actual operation) are analyzed and monitored, thereby making it possible to prevent the operational stop of the system beforehand.

Further, analyzing and managing the various factors that exert an influence upon the operation of the semiconductor integrated circuit that is actually working makes it possible to reflect its analysis and management in the next-generation semiconductor integrated circuit.

What is claimed is:

1. A semiconductor integrated circuit apparatus comprising:
    a main frame circuit on a chip, wherein the main frame circuit is an object of measurement;
    a measurement circuit on the chip, wherein said measurement circuit measures a physical parameter of said main frame circuit when said main frame circuit is in normal operation;
    an analysis circuit which analyzes the physical parameter, wherein the physical parameter exerts an influence upon an operation of said main frame circuit; and
    an improvement circuit which improves the physical parameter, based upon said analysis.

2. The semiconductor integrated circuit apparatus according to claim 1, providing said analysis circuit on the chip.

3. The semiconductor integrated circuit apparatus according to claim 2, further comprising a transfer circuit which transfers a measurement result of said measurement circuit to said analysis circuit on the chip.

4. The semiconductor integrated circuit apparatus according to claim 1, providing said analysis circuit outside of the chip.

5. The semiconductor integrated circuit apparatus according to claim 4, further comprising a transfer circuit which transfers a measurement result of said measurement circuit to said analysis circuit.

6. The semiconductor integrated circuit apparatus according to claim 1, wherein if at least one main frame circuit is provided on said chip, and a plurality of the measurement circuits are provided, said analysis circuit is configured to receive measurement results from the plurality of the measurement circuits, and to analyze the physical parameter.

7. The semiconductor integrated circuit apparatus according to claim 1, wherein said measurement information is a measurement result that a measurement circuit other than said measurement circuit measured.

8. The semiconductor integrated circuit apparatus according to claim 1, further comprising a monitor which indicates a fault warning of said main frame circuit, based upon said analysis.

9. The semiconductor integrated circuit apparatus according to claim 1, wherein the physical parameter comprises at least one of power source noise, clock jitter and temperature, power, dispersion, and stress of the chip.

10. A semiconductor integrated circuit apparatus comprising:
    a main frame circuit on a chip, wherein the main frame circuit is an object of measurement;
    a measurement circuit on the chip, wherein said measurement circuit measures a physical parameter of said main frame circuit when said main frame circuit is in normal operation; and
    an analysis circuit which analyzes the physical parameter, wherein the physical parameter exerts an influence upon an operation of said main frame circuit,
    wherein the main frame circuit comprises an integrated circuit having an output data signal comprising at least one of a clock signal of the main frame circuit, a power source output signal of the main frame circuit, a temperature signal of the main frame circuit and an operational control signal indicating an operation of the main frame circuit.

* * * * *